(12) United States Patent
Nishikawa et al.

(10) Patent No.: US 11,657,875 B2
(45) Date of Patent: *May 23, 2023

(54) SEMICONDUCTOR MEMORY DEVICE CONFIGURED TO OUTPUT WRITE PARAMETER AND MEMORY SYSTEM INCLUDING THE SAME

(71) Applicant: KIOXIA CORPORATION, Tokyo (JP)

(72) Inventors: Suguru Nishikawa, Osaka (JP); Yoshihisa Kojima, Kawasaki (JP); Riki Suzuki, Yokohama (JP); Masanobu Shirakawa, Chigasaki (JP); Toshikatsu Hida, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/849,062

(22) Filed: Jun. 24, 2022

(65) Prior Publication Data
US 2022/0328102 A1 Oct. 13, 2022

Related U.S. Application Data

(63) Continuation of application No. 17/027,041, filed on Sep. 21, 2020, now Pat. No. 11,410,729, which is a
(Continued)

(30) Foreign Application Priority Data

Sep. 22, 2017 (JP) .............................. JP2017-183074
Feb. 27, 2018 (JP) .............................. JP2018-033796

(51) Int. Cl.
*G06F 12/00* (2006.01)
*G11C 16/10* (2006.01)
(Continued)

(52) U.S. Cl.
CPC ............ *G11C 16/10* (2013.01); *G06F 3/0604* (2013.01); *G06F 3/0659* (2013.01);
(Continued)

(58) Field of Classification Search
CPC ....... G11C 16/10; G11C 16/32; G11C 29/021; G11C 16/3459; G11C 29/42;
(Continued)

(56) References Cited

U.S. PATENT DOCUMENTS 7,301,808 B2 11/2007 Li et al.
7,453,731 B2 11/2008 Tu et al.
(Continued)

FOREIGN PATENT DOCUMENTS

JP 2002-367380 12/2002
JP 2008-535144 8/2008
(Continued)

*Primary Examiner* — Mardochee Chery
(74) *Attorney, Agent, or Firm* — Oblon, McClelland, Maier & Neustadt, L.L.P.

(57) ABSTRACT

According to one embodiment, a memory system includes a nonvolatile semiconductor memory, and a controller. The semiconductor memory includes a memory cell, and a write circuit configured to write data to the memory cell by applying a program voltage to the memory cell and comparing a threshold voltage of the memory cell with a first reference voltage corresponding to the write data. The write circuit is configured to execute a first programming operation to obtain a value of a write parameter by comparing the threshold voltage with a second reference voltage different from the first reference voltage.

22 Claims, 56 Drawing Sheets

Related U.S. Application Data continuation of application No. 16/129,157, filed on Sep. 12, 2018, now Pat. No. 10,818,358.

(51) Int. Cl.

| | | |
|---|---|---|
| *G11C 16/04* | (2006.01) | |
| *G11C 16/14* | (2006.01) | |
| *G06F 3/06* | (2006.01) | |
| *G11C 11/56* | (2006.01) | |
| *G11C 16/08* | (2006.01) | |
| *G11C 16/34* | (2006.01) | |
| *G11C 29/02* | (2006.01) | |
| *G11C 29/42* | (2006.01) | |
| *G11C 16/32* | (2006.01) | |
| *H01L 27/1157* | (2017.01) | |
| *H01L 27/11582* | (2017.01) | |

(52) U.S. Cl.
CPC ........ *G06F 3/0679* (2013.01); *G11C 11/5628* (2013.01); *G11C 11/5635* (2013.01); *G11C 16/0483* (2013.01); *G11C 16/08* (2013.01); *G11C 16/14* (2013.01); *G11C 16/32* (2013.01); *G11C 16/349* (2013.01); *G11C 16/3459* (2013.01); *G11C 16/3495* (2013.01); *G11C 29/021* (2013.01); *G11C 29/028* (2013.01); *G11C 29/42* (2013.01); *G11C 11/5671* (2013.01); *H01L 27/1157* (2013.01); *H01L 27/11582* (2013.01)

(58) Field of Classification Search
CPC . G11C 16/349; G11C 29/028; G11C 16/3495; G11C 16/08; G11C 11/5635; G11C 11/5628; G11C 16/14; G11C 16/0483; G11C 11/5671; G06F 3/0659; G06F 3/0604; G06F 3/0679; H01L 27/11582; H01L 27/1157

USPC ........................................................ 711/154
See application file for complete search history.

(56) References Cited

U.S. PATENT DOCUMENTS

| | | | |
|---|---|---|---|
| 7,881,110 | B2 | 2/2011 | Park |
| 8,570,802 | B2 | 10/2013 | Shirakawa |
| 8,755,233 | B2 | 6/2014 | Nagashima |
| 9,269,445 | B1 | 2/2016 | Abe |
| 9,514,827 | B1 | 12/2016 | Nam et al. |
| 2004/0233726 | A1 | 11/2004 | Iwase |
| 2004/0233727 | A1 | 11/2004 | Iwase |
| 2006/0221714 | A1 | 10/2006 | Li et al. |
| 2008/0062770 | A1 | 3/2008 | Tu et al. |
| 2010/0097855 | A1 | 4/2010 | Bayle |
| 2011/0216577 | A1 | 9/2011 | Tomotani |
| 2012/0069633 | A1 | 3/2012 | Katoh |
| 2013/0176783 | A1 | 7/2013 | Senoo et al. |
| 2018/0151236 | A1* | 5/2018 | Park ........................ G11C 16/10 |

FOREIGN PATENT DOCUMENTS

| | | |
|---|---|---|
| JP | 2009-283117 | 12/2009 |
| JP | 2010-503946 | 2/2010 |
| JP | 4778553 | 9/2011 |
| JP | 4819951 B2 | 11/2011 |
| JP | 2012-238363 | 12/2012 |
| JP | 5292052 B2 | 9/2013 |
| JP | 5364750 B2 | 12/2013 |
| JP | 5542737 | 7/2014 |
| JP | 5784788 B2 | 9/2015 |

* cited by examiner

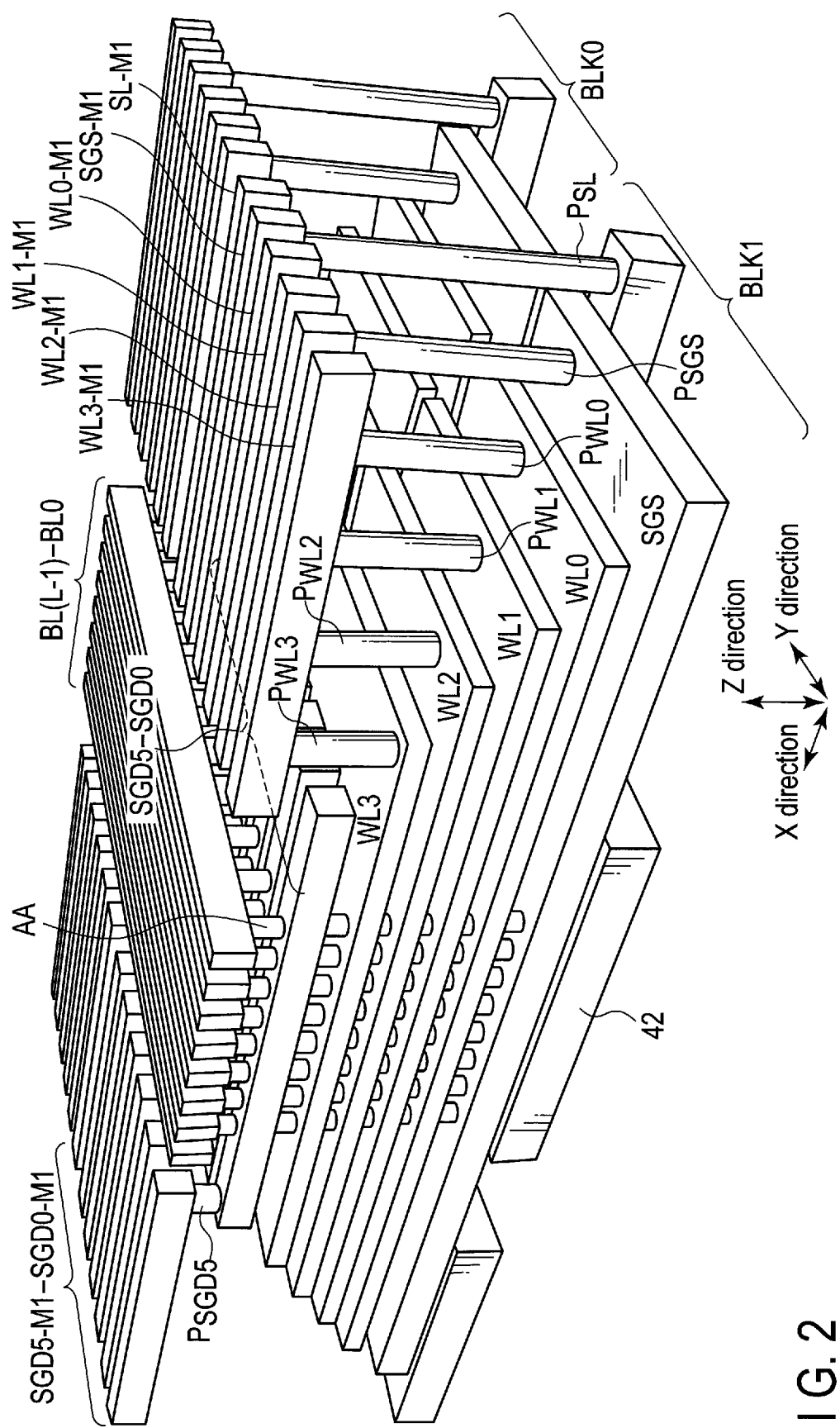
F I G. 2

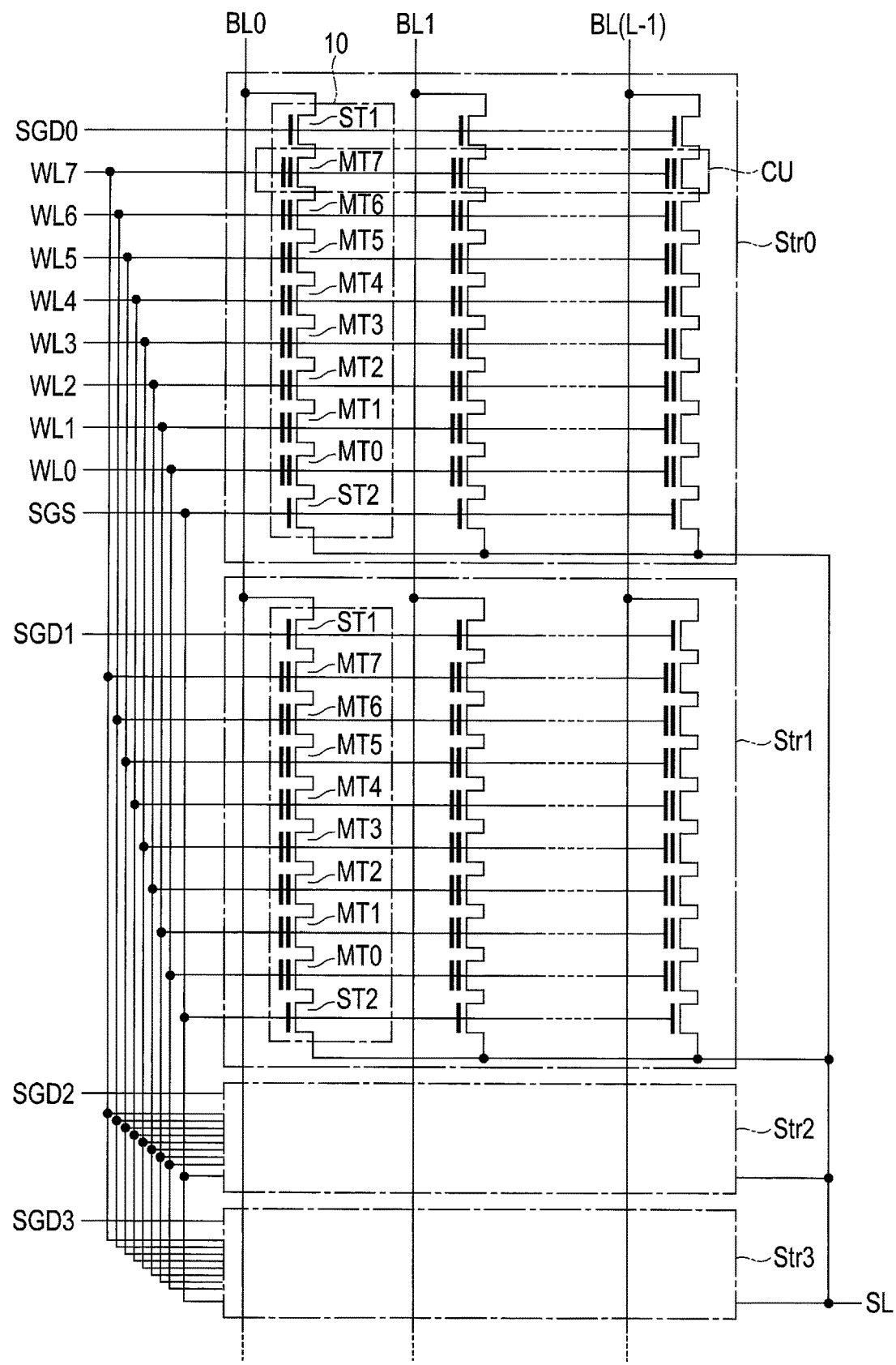
F I G. 3

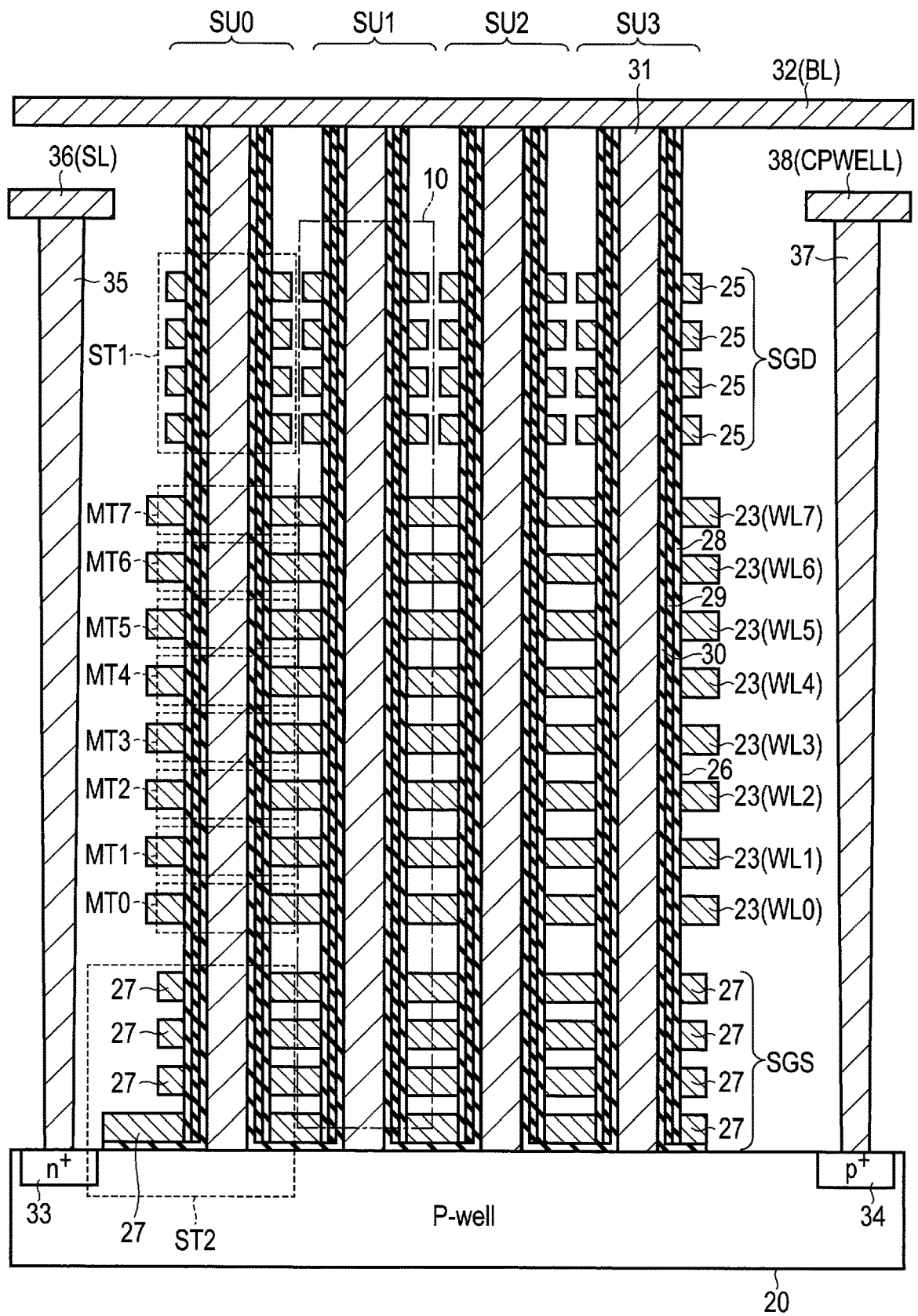
F I G. 4

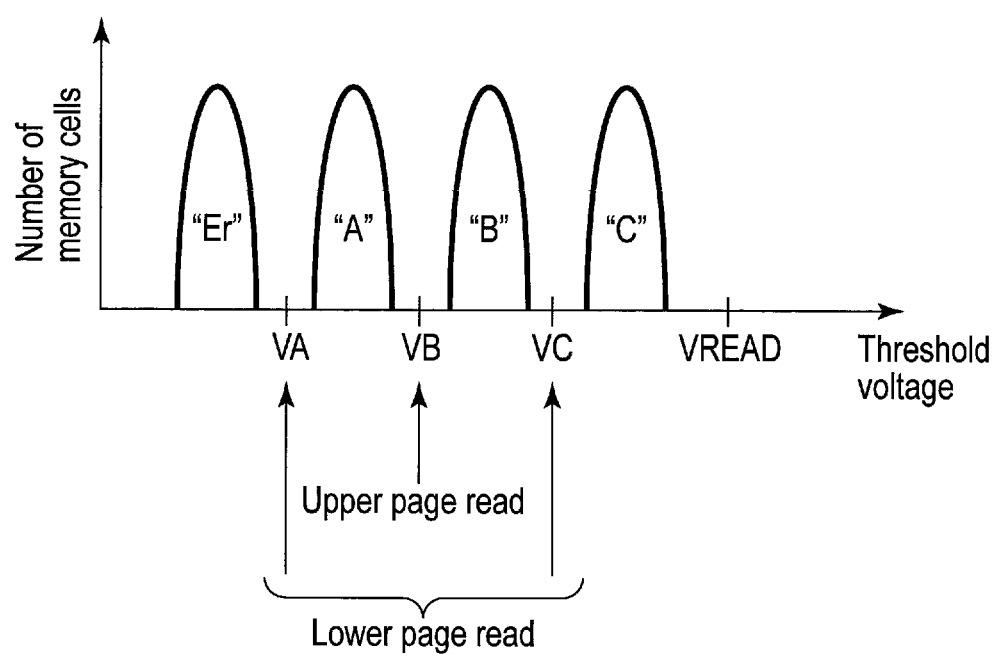
F I G. 5

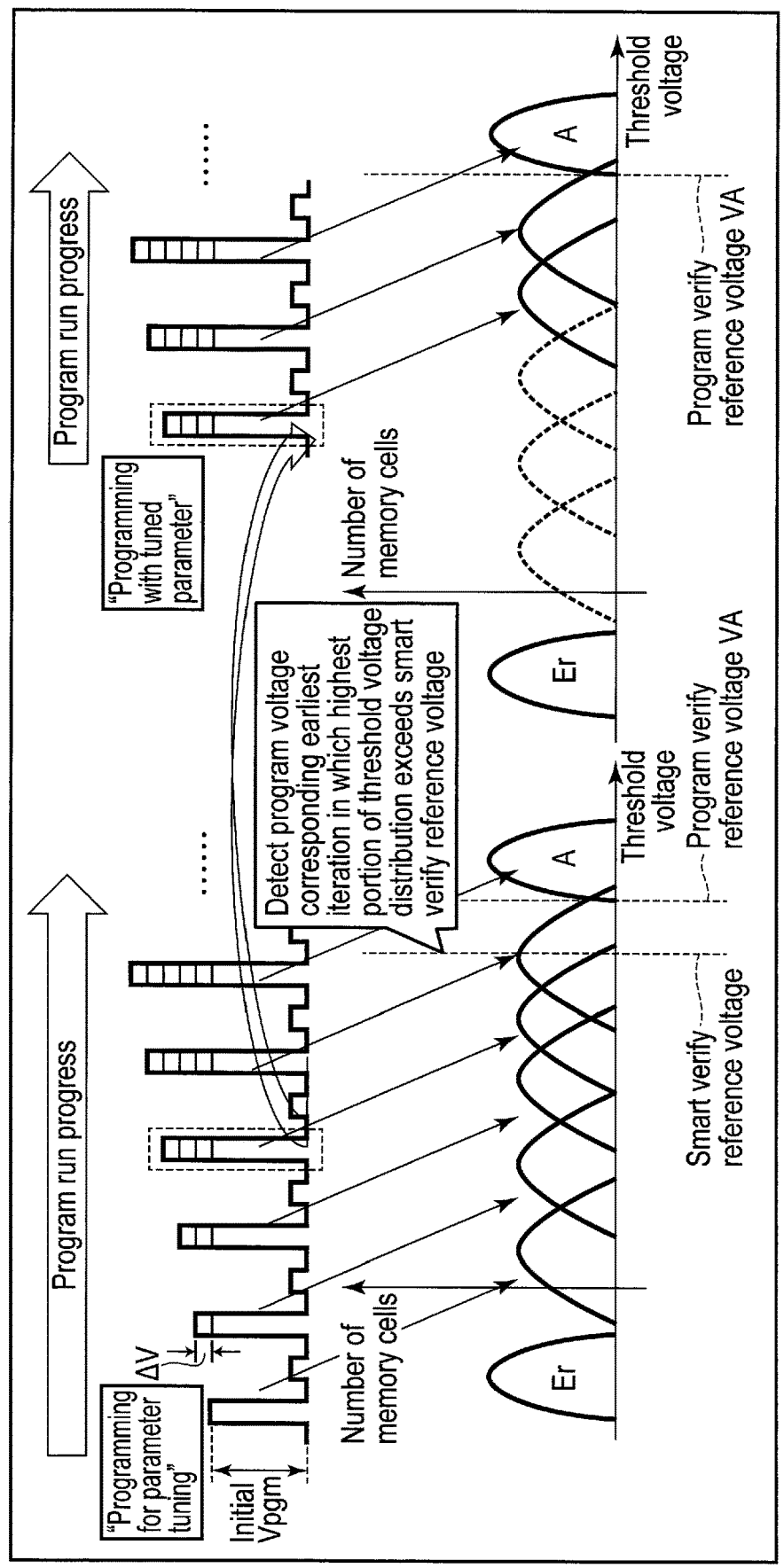
F I G. 6

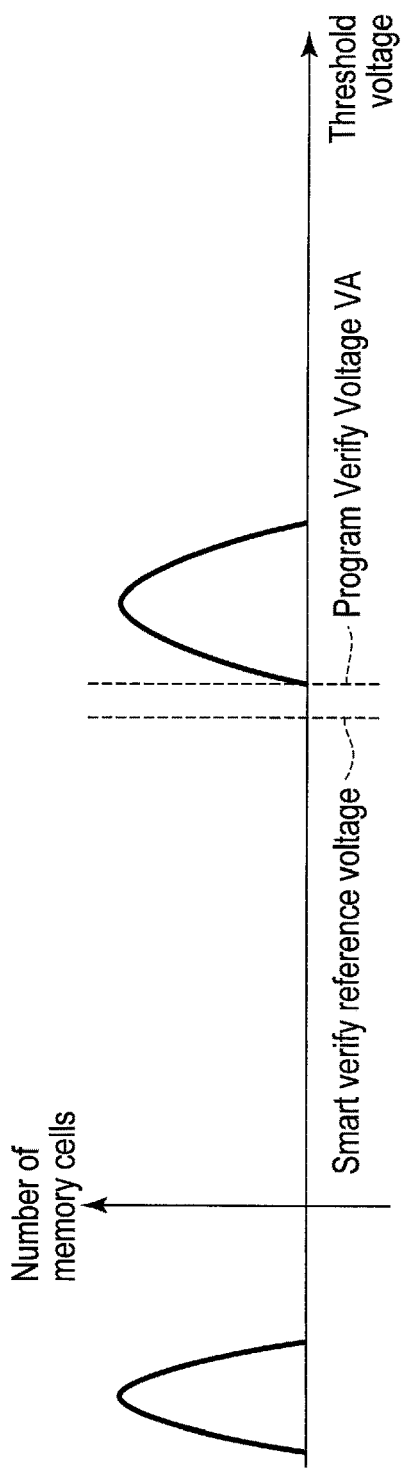
F I G. 19A
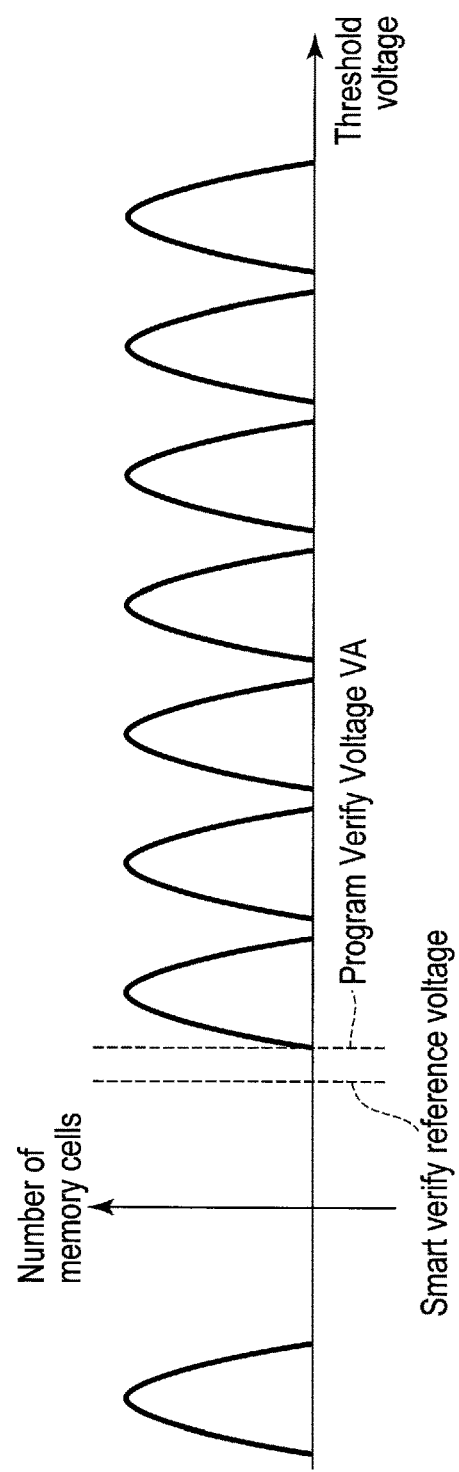
F I G. 19B

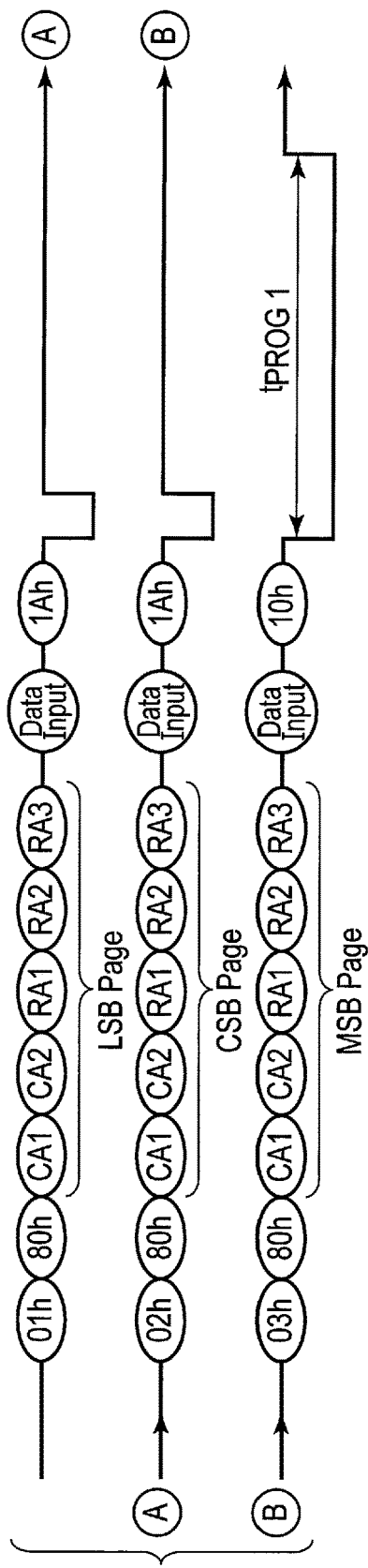
F I G. 22A
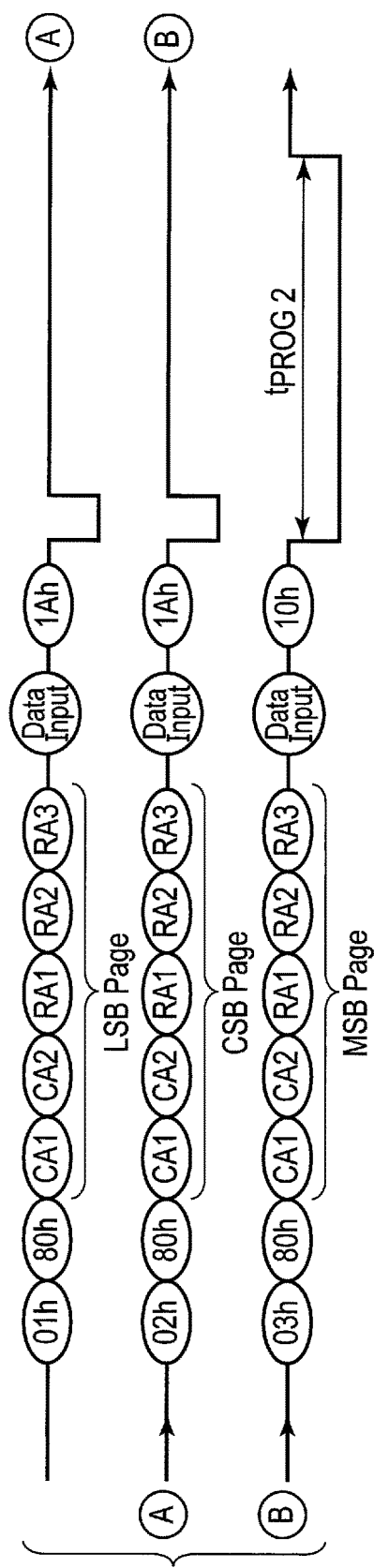
F I G. 22B

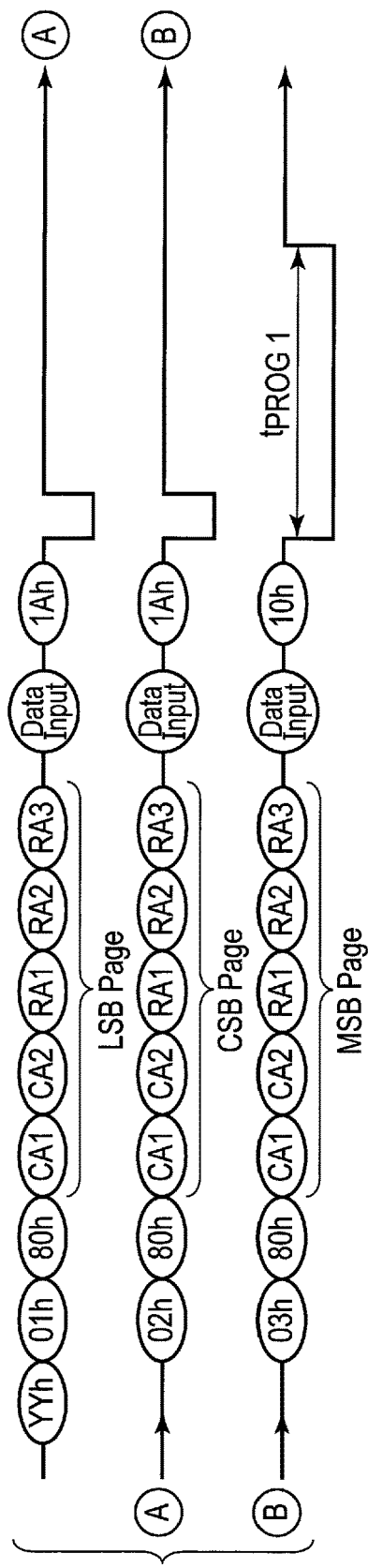
F I G. 23A
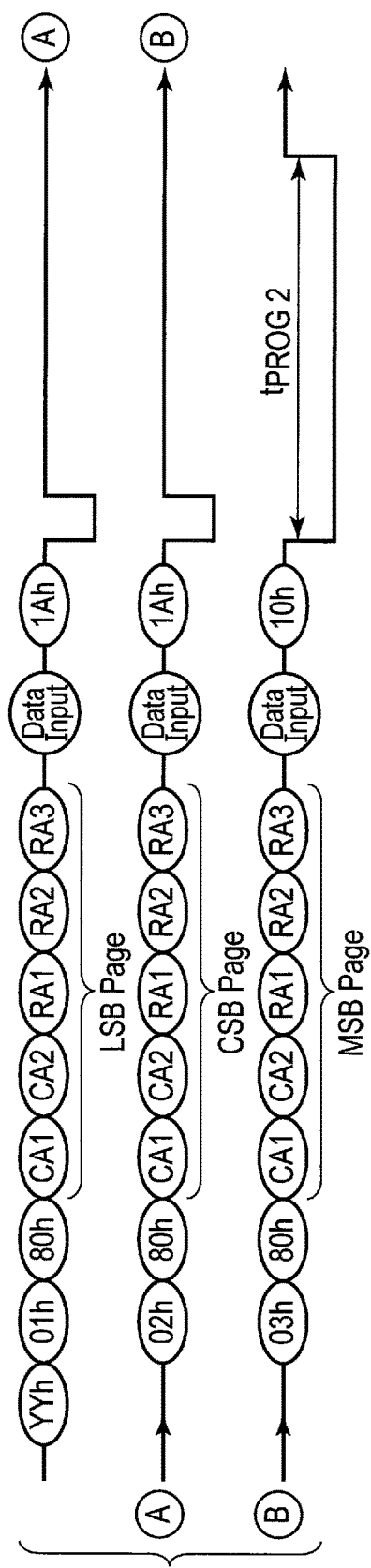
F I G. 23B

|  |  | Str0 | Str1 | Str2 | Str3 |
|---|---|---|---|---|---|
| Gr0 | WL0 | 0 | 1 | 2 | 3 |
| Gr1 | WL1 | 4 | 5 | 6 | 7 |
| Gr2 | WL2 | 8 | 9 | 10 | 11 |
| | WL3 | 12 | 13 | 14 | 15 |
| | .... | .... | .... | .... | .... |
| | WL31 | 124 | 125 | 126 | 127 |
| Gr3 | WL32 | 128 | 129 | 130 | 131 |
| | WL33 | 132 | 133 | 134 | 135 |
| | .... | .... | .... | .... | .... |
| | WL61 | 244 | 245 | 246 | 247 |
| Gr4 | WL62 | 248 | 249 | 250 | 251 |
| Gr5 | WL63 | 252 | 253 | 254 | 255 |

FIG. 24

| The number of P/E cycles | | | | | |
|---|---|---|---|---|---|
| | | Str0 | Str1 | Str2 | Str3 |
| | WL0 | 0 | 1 | 2 | 3 |
| | WL1 | 4 | 5 | 6 | 7 |
| N | WL2 | 8 | 9 | 10 | 11 |
| | WL3 | 12 | 13 | 14 | 15 |
| | WL4 | 16 | 17 | 18 | 19 |
| | WL5 | 20 | 21 | 22 | 23 |
| | .... | .... | .... | .... | .... |

| | | Str0 | Str1 | Str2 | Str3 |
|---|---|---|---|---|---|
| | WL0 | 0 | 1 | 2 | 3 |
| | WL1 | 4 | 5 | 6 | 7 |
| N+1 | WL2 | 8 | 9 | 10 | 11 |
| | WL3 | 12 | 13 | 14 | 15 |
| | WL4 | 16 | 17 | 18 | 19 |
| | WL5 | 20 | 21 | 22 | 23 |
| | .... | .... | .... | .... | .... |

| | | Str0 | Str1 | Str2 | Str3 |
|---|---|---|---|---|---|
| | WL0 | 0 | 1 | 2 | 3 |
| | WL1 | 4 | 5 | 6 | 7 |
| N+2 | WL2 | 8 | 9 | 10 | 11 |
| | WL3 | 12 | 13 | 14 | 15 |
| | WL4 | 16 | 17 | 18 | 19 |
| | WL5 | 20 | 21 | 22 | 23 |
| | .... | .... | .... | .... | .... |

....

| | | Str0 | Str1 | Str2 | Str3 |
|---|---|---|---|---|---|
| | WL0 | 0 | 1 | 2 | 3 |
| | WL1 | 4 | 5 | 6 | 7 |
| N+a | WL2 | 8 | 9 | 10 | 11 |
| | WL3 | 12 | 13 | 14 | 15 |
| | WL4 | 16 | 17 | 18 | 19 |
| | WL5 | 20 | 21 | 22 | 23 |
| | .... | .... | .... | .... | .... |

F I G. 25

The number of P/E cycles

N
N+b
....

|  | Str0 | Str1 | Str2 | Str3 |
|---|---|---|---|---|
| WL0 | //0// | 1 | 2 | 3 |
| WL1 | 4 | 5 | 6 | 7 |
| WL2 | 8 | 9 | 10 | 11 |
| WL3 | 12 | 13 | 14 | 15 |
| WL4 | 16 | 17 | 18 | 19 |
| WL5 | 20 | 21 | 22 | 23 |
| .... | .... | .... | .... | .... |

N+1
N+1+b
....

|  | Str0 | Str1 | Str2 | Str3 |
|---|---|---|---|---|
| WL0 | 0 | 1 | 2 | 3 |
| WL1 | //4// | 5 | 6 | 7 |
| WL2 | 8 | 9 | 10 | 11 |
| WL3 | 12 | 13 | 14 | 15 |
| WL4 | 16 | 17 | 18 | 19 |
| WL5 | 20 | 21 | 22 | 23 |
| .... | .... | .... | .... | .... |

N+2
N+2+b
....

|  | Str0 | Str1 | Str2 | Str3 |
|---|---|---|---|---|
| WL0 | 0 | 1 | 2 | 3 |
| WL1 | 4 | 5 | 6 | 7 |
| WL2 | //8// | 9 | 10 | 11 |
| WL3 | 12 | 13 | 14 | 15 |
| WL4 | 16 | 17 | 18 | 19 |
| WL5 | 20 | 21 | 22 | 23 |
| .... | .... | .... | .... | .... |

N+3
N+3+b
....

|  | Str0 | Str1 | Str2 | Str3 |
|---|---|---|---|---|
| WL0 | 0 | 1 | 2 | 3 |
| WL1 | 4 | 5 | 6 | 7 |
| WL2 | 8 | 9 | 10 | 11 |
| WL3 | //12// | 13 | 14 | 15 |
| WL4 | 16 | 17 | 18 | 19 |
| WL5 | 20 | 21 | 22 | 23 |
| .... | .... | .... | .... | .... |

....

F I G. 26

| The number of P/E cycles | | | Str0 | Str1 | Str2 | Str3 |
|---|---|---|---|---|---|---|
| N<br>N+6<br>.... | Gr0 | WL0 | 0 | 1 | 2 | 3 |
| | Gr1 | WL1 | 4 | 5 | 6 | 7 |
| | Gr2 | WL2 | 8 | 9 | 10 | 11 |
| | | ... | ... | ... | ... | ... |
| | Gr3 | WL32 | 128 | 129 | 130 | 131 |
| | | ... | ... | ... | ... | ... |
| | Gr4 | WL62 | 248 | 249 | 250 | 251 |
| | Gr5 | WL63 | 252 | 253 | 254 | 255 |

| The number of P/E cycles | | | Str0 | Str1 | Str2 | Str3 |
|---|---|---|---|---|---|---|
| N+1<br>N+7<br>.... | Gr0 | WL0 | 0 | 1 | 2 | 3 |
| | Gr1 | WL1 | 4 | 5 | 6 | 7 |
| | Gr2 | WL2 | 8 | 9 | 10 | 11 |
| | | ... | ... | ... | ... | ... |
| | Gr3 | WL32 | 128 | 129 | 130 | 131 |
| | | ... | ... | ... | ... | ... |
| | Gr4 | WL62 | 248 | 249 | 250 | 251 |
| | Gr5 | WL63 | 252 | 253 | 254 | 255 |

| The number of P/E cycles | | | Str0 | Str1 | Str2 | Str3 |
|---|---|---|---|---|---|---|
| N+2<br>N+8<br>.... | Gr0 | WL0 | 0 | 1 | 2 | 3 |
| | Gr1 | WL1 | 4 | 5 | 6 | 7 |
| | Gr2 | WL2 | 8 | 9 | 10 | 11 |
| | | ... | ... | ... | ... | ... |
| | Gr3 | WL32 | 128 | 129 | 130 | 131 |
| | | ... | ... | ... | ... | ... |
| | Gr4 | WL62 | 248 | 249 | 250 | 251 |
| | Gr5 | WL63 | 252 | 253 | 254 | 255 |

| The number of P/E cycles | | | Str0 | Str1 | Str2 | Str3 |
|---|---|---|---|---|---|---|
| N+3<br>N+9<br>.... | Gr0 | WL0 | 0 | 1 | 2 | 3 |
| | Gr1 | WL1 | 4 | 5 | 6 | 7 |
| | Gr2 | WL2 | 8 | 9 | 10 | 11 |
| | | ... | ... | ... | ... | ... |
| | Gr3 | WL32 | 128 | 129 | 130 | 131 |
| | | ... | ... | ... | ... | ... |
| | Gr4 | WL62 | 248 | 249 | 250 | 251 |
| | Gr5 | WL63 | 252 | 253 | 254 | 255 |

| The number of P/E cycles | | | Str0 | Str1 | Str2 | Str3 |
|---|---|---|---|---|---|---|
| N+4<br>N+10<br>.... | Gr0-Gr3 | ... | ... | ... | ... | ... |
| | Gr4 | WL62 | 248 | 249 | 250 | 251 |
| | Gr5 | WL63 | 252 | 253 | 254 | 255 |

| The number of P/E cycles | | | Str0 | Str1 | Str2 | Str3 |
|---|---|---|---|---|---|---|
| N+5<br>N+11<br>.... | Gr0-Gr3 | ... | ... | ... | ... | ... |
| | Gr4 | WL62 | 248 | 249 | 250 | 251 |
| | Gr5 | WL63 | 252 | 253 | 254 | 255 |

F I G. 27

| Group table | |
|---|---|
| Group | Word line range |
| 0 | 0 |
| 1 | 1 |
| 2 | 2-31 |
| 3 | 32-61 |
| 4 | 62 |
| 5 | 63 |

| Update interval table | |
|---|---|
| Group | Update interval (the number of P/E cycles) |
| 0 | 100 |
| 1 | 300 |
| 2 | 1000 |
| 3 | 1000 |
| 4 | 300 |
| 5 | 100 |

| Timing offset table | |
|---|---|
| Group | Offset value |
| 0 | 0 |
| 1 | 1 |
| 2 | 2 |
| 3 | 3 |
| 4 | 4 |
| 5 | 5 |

| P/E cycle table | |
|---|---|
| Block | The current number of P/E cycles |
| 0 | 100 |
| 1 | 98 |
| 2 | 103 |
| ... | ... |

| Write parameter table ||
|---|---|
| Group | Write parameter value |
| 0 | V0 |
| 1 | V1 |
| 2 | V2 |
| 3 | V3 |
| 4 | V4 |
| 5 | V5 |

F I G. 29A

| Update schedule table |||
|---|---|---|
| Group | Number of P/E cycles at which the "programming for parameter tuning" is executed last | Number of P/E cycles at which a next "programming for parameter tuning" is scheduled |
| 0 | 0 | 100 |
| 1 | 1 | 301 |
| 2 | 2 | 1002 |
| 3 | 3 | 1003 |
| 4 | 4 | 304 |
| 5 | 5 | 105 |

F I G. 29B

| Write parameter table ||
|---|---|
| Group | Write parameter value |
| 0 | V0_0 |
| 1 | V1_0 |
| 2 | V2_0 |
| 3 | V3_0 |
| 4 | V4_0 |
| 5 | V5_0 |

FIG. 32A

| Update schedule table (initial state) |||
|---|---|---|
| Group | Number of P/E cycles at which the "programming for parameter tuning" is executed last | Number of P/E cycles at which a next "programming for parameter tuning" is scheduled |
| 0 | 0 | 100 |
| 1 | 1 | 301 |
| 2 | 2 | 1002 |
| 3 | 3 | 1003 |
| 4 | 4 | 304 |
| 5 | 5 | 105 |

FIG. 32B

| Write parameter table ||
|---|---|
| Group | Write parameter value |
| 0 | V0_0 → V0_1 |
| 1 | V1_0 |
| 2 | V2_0 |
| 3 | V3_0 |
| 4 | V4_0 |
| 5 | V5_0 |

FIG. 33A

| Update schedule table (the number of P/E cycles: 100) |||
|---|---|---|
| Group | Number of P/E cycles at which the "programming for parameter tuning" is executed last | Number of P/E cycles at which a next "programming for parameter tuning" is scheduled |
| 0 | 0 → 100 | 100 → 200 |
| 1 | 1 | 301 |
| 2 | 2 | 1002 |
| 3 | 3 | 1003 |
| 4 | 4 | 304 |
| 5 | 5 | 105 |

FIG. 33B

| Write parameter table | |
|---|---|
| Group | Write parameter value |
| 0 | V0_1 |
| 1 | V1_0 |
| 2 | V2_0 |
| 3 | V3_0 |
| 4 | V4_0 |
| 5 | V5_0 → V5_1 |

FIG. 34A

| Update schedule table (the number of P/E cycles: 105) | | |
|---|---|---|
| Group | Number of P/E cycles at which the "programming for parameter tuning" is executed last | Number of P/E cycles at which a next "programming for parameter tuning" is scheduled |
| 0 | 100 | 200 |
| 1 | 1 | 301 |
| 2 | 2 | 1002 |
| 3 | 3 | 1003 |
| 4 | 4 | 304 |
| 5 | 5 → 105 | 105 → 205 |

FIG. 34B

| Write parameter table | |
|---|---|
| Group | Write parameter value |
| 0 | V0_1 → V0_2 |
| 1 | V1_0 |
| 2 | V2_0 |
| 3 | V3_0 |
| 4 | V4_0 |
| 5 | V5_1 |

F I G. 35A

| Update schedule table (the number of P/E cycles: 200) | | |
|---|---|---|
| Group | Number of P/E cycles at which the "programming for parameter tuning" is executed last | Number of P/E cycles at which a next "programming for parameter tuning" is scheduled |
| 0 | 100 → 200 | 200 → 300 |
| 1 | 1 | 301 |
| 2 | 2 | 1002 |
| 3 | 3 | 1003 |
| 4 | 4 | 304 |
| 5 | 105 | 205 |

F I G. 35B

| Write parameter table ||
|---|---|
| Group | Write parameter value |
| 0 | V0_2 |
| 1 | V1_0 |
| 2 | V2_0 |
| 3 | V3_0 |
| 4 | V4_0 |
| 5 | V5_1 → V5_2 |

FIG. 36A

| Update schedule table (the number of P/E cycles: 205) |||
|---|---|---|
| Group | Number of P/E cycles at which the "programming for parameter tuning" is executed last | Number of P/E cycles at which a next "programming for parameter tuning" is scheduled |
| 0 | 200 | 300 |
| 1 | 1 | 301 |
| 2 | 2 | 1002 |
| 3 | 3 | 1003 |
| 4 | 4 | 304 |
| 5 | 105 → 205 | 205 → 305 |

FIG. 36B

| Write parameter table ||
|---|---|
| Group | Write parameter value |
| 0 | V0_2 → V0_3 |
| 1 | V1_0 |
| 2 | V2_0 |
| 3 | V3_0 |
| 4 | V4_0 |
| 5 | V5_2 |

F I G. 37A

| Update schedule table (the number of P/E cycles: 300) |||
|---|---|---|
| Group | Number of P/E cycles at which the "programming for parameter tuning" is executed last | Number of P/E cycles at which a next "programming for parameter tuning" is scheduled |
| 0 | 200 → 300 | 300 → 400 |
| 1 | 1 | 301 |
| 2 | 2 | 1002 |
| 3 | 3 | 1003 |
| 4 | 4 | 304 |
| 5 | 205 | 305 |

F I G. 37B

| Write parameter table | |
|---|---|
| Group | Write parameter value |
| 0 | V0_3 |
| 1 | V1_0 → V1_1 |
| 2 | V2_0 |
| 3 | V3_0 |
| 4 | V4_0 |
| 5 | V5_2 |

FIG. 38A

| Update schedule table (the number of P/E cycles: 301) | | |
|---|---|---|
| Group | Number of P/E cycles at which the "programming for parameter tuning" is executed last | Number of P/E cycles at which a next "programming for parameter tuning" is scheduled |
| 0 | 300 | 400 |
| 1 | 1 → 301 | 301 → 601 |
| 2 | 2 | 1002 |
| 3 | 3 | 1003 |
| 4 | 4 | 304 |
| 5 | 205 | 305 |

FIG. 38B

| Write parameter table ||
|---|---|
| Group | Write parameter value |
| 0 | V0_3 |
| 1 | V1_1 |
| 2 | V2_0 |
| 3 | V3_0 |
| 4 | V4_0 → V4_1 |
| 5 | V5_2 |

F I G. 39A

| Update schedule table (the number of P/E cycles: 304) |||
|---|---|---|
| Group | Number of P/E cycles at which the "programming for parameter tuning" is executed last | Number of P/E cycles at which a next "programming for parameter tuning" is scheduled |
| 0 | 300 | 400 |
| 1 | 301 | 601 |
| 2 | 2 | 1002 |
| 3 | 3 | 1003 |
| 4 | 4 → 304 | 304 → 604 |
| 5 | 205 | 305 |

F I G. 39B

| Group table | |
|---|---|
| Group | Word line range |
| 0 | 0-1 |
| 1 | 2-31 |
| 2 | 32-61 |
| 3 | 62-63 |
| 4 | 64-65 |
| 5 | 66-95 |
| 6 | 96-125 |
| 7 | 126-127 |

| Update interval table | |
|---|---|
| Group | Update interval (the number of P/E cycles) |
| 0 | 100 |
| 1 | 1000 |
| 2 | 1000 |
| 3 | 100 |
| 4 | 100 |
| 5 | 1000 |
| 6 | 1000 |
| 7 | 100 |

Groups 0–3: Tier-1; Groups 4–7: Tier-2

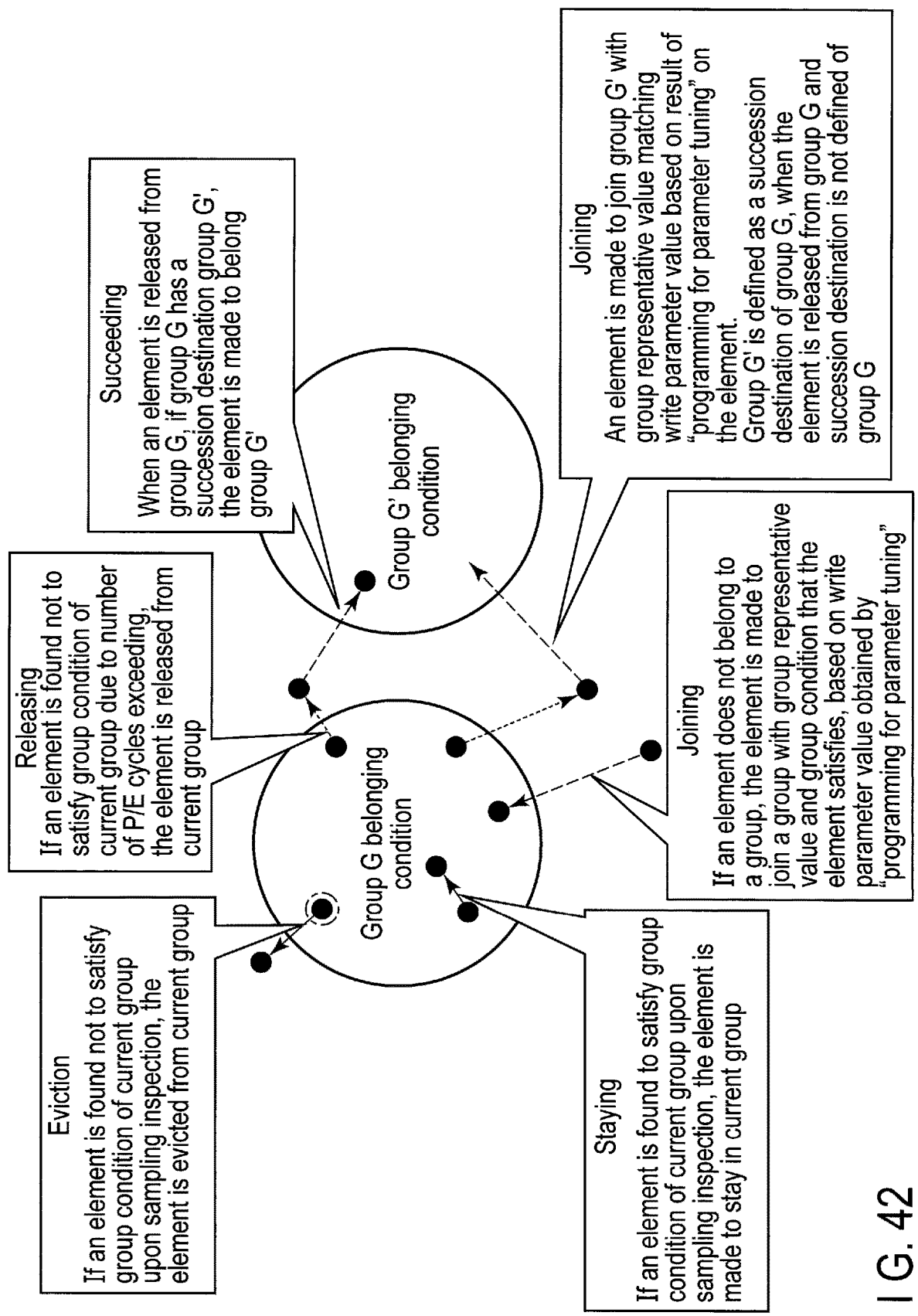
F I G. 42

Element-group table

| Element | | Group | Detection reservation flag |
|---|---|---|---|
| Block | Word line range | | |
| 0 | 0 | 0 | 0 |
| 0 | 1 | 1 | 0 |
| 0 | 2-31 | 2 | 0 |
| 0 | 32-61 | 3 | 0 |
| 0 | 62 | 4 | 0 |
| 0 | 63 | 5 | 0 |
| 1 | 0 | 6 | 0 |
| 1 | 1 | 7 | 0 |
| 1 | 2-31 | 8 | 0 |
| ... | ... | ... | ... |

FIG. 44A

Group table

| Group | Word line range | P/E cycle range | Group representative value |
|---|---|---|---|
| 0 | 0 | 0-100 | V1 |
| 1 | 1 | 0-300 | V2 |
| 2 | 2-31 | 0-1000 | V3 |
| 3 | 32-61 | 0-1000 | V4 |
| 4 | 62 | 0-300 | V5 |
| 5 | 63 | 0-100 | V6 |
| 6 | 0 | 101-200 | V7 |
| 7 | 1 | 301-600 | V4 |
| 8 | 2-31 | 1001-2000 | V5 |
| 9 | 32-61 | 1001-2000 | V6 |
| ... | ... | ... | ... |

FIG. 44B

Succession destination table

| Group | Succession destination group |
|---|---|
| 0 | Undefined |
| 1 | Undefined |
| 2 | 8 |
| 3 | Undefined |
| 4 | Undefined |
| ... | ... |

FIG. 44C

| P/E cycle table ||
|---|---|
| Block | P/E cycle range |
| 0 | 20 |
| 1 | 35 |
| 2 | 25 |
| 3 | 80 |
| ... | ... |

F I G. 45A

| P/E cycle interval table ||
|---|---|
| Word line range | P/E cycle interval |
| 0 | 100 |
| 1 | 300 |
| 2-31 | 1000 |
| 32-61 | 1000 |
| 62 | 300 |
| 63 | 100 |

F I G. 45B

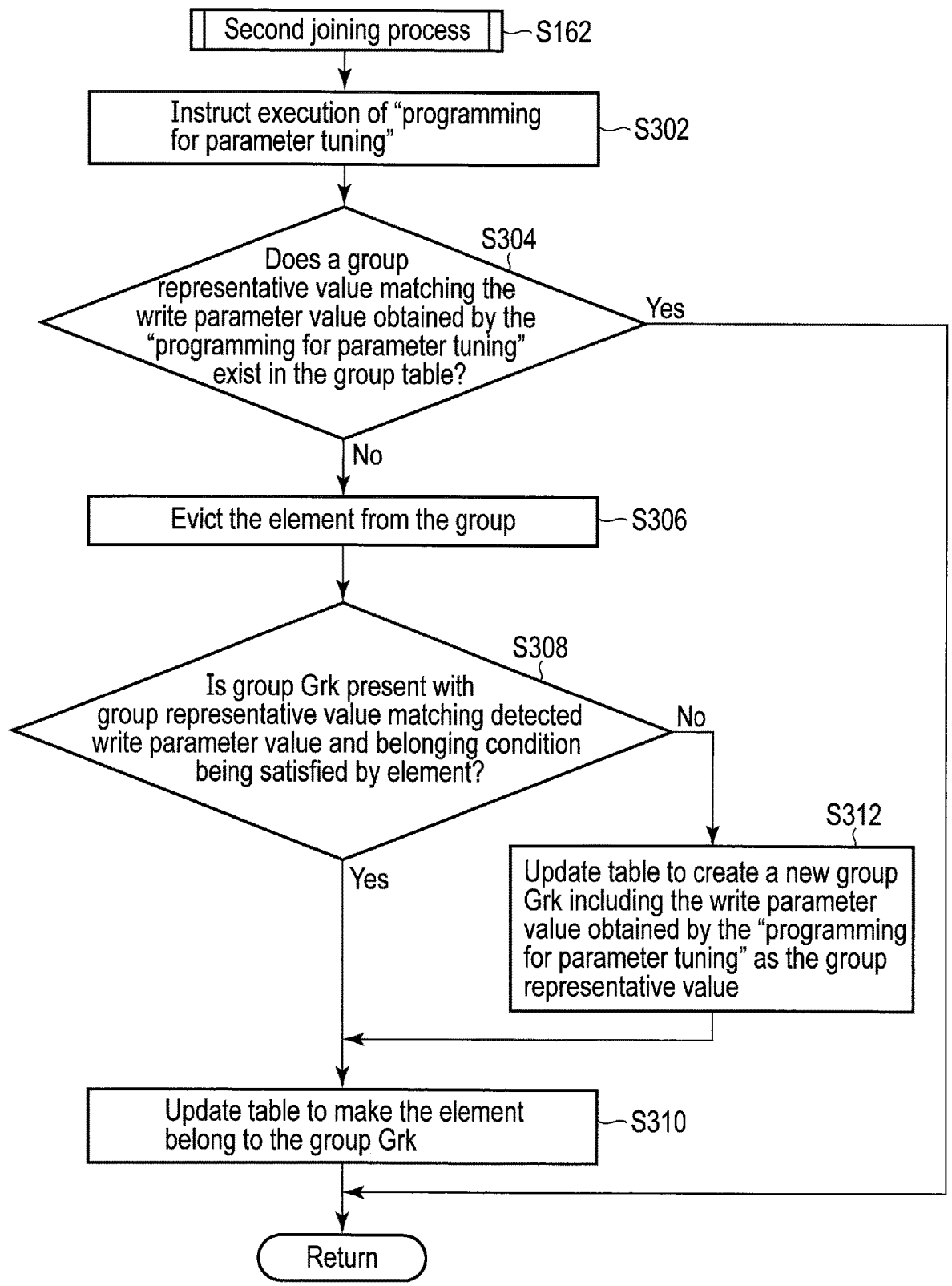
F I G. 47B

| Element-group table ||||
|---|---|---|---|
| Element || Group | Detection reservation flag |
| Block | Word line range | | |
| 0 | 0 | 0 | 0 |
| 0 | 1 | 1 | 0 |
| 0 | 2-31 | 2 | 0 |

F I G. 48A

| P/E cycle interval table ||
|---|---|
| Word line range | P/E cycle interval |
| 0 | 100 |
| 1 | 300 |
| 2-31 | 1000 |
| 32-61 | 1000 |
| 62 | 300 |
| 63 | 100 |

F I G. 48D

| Group table ||||
|---|---|---|---|
| Group | Word line range | P/E cycle range | Group representative value |
| 0 | 0 | 0-100 | V0 |
| 1 | 1 | 0-300 | V0 |
| 2 | 2-31 | 0-1000 | V0 |

F I G. 48B

| P/E cycle table ||
|---|---|
| Block | The number of P/E cycles |
| 0 | 20 |
| 1 | 35 |
| 2 | 25 |
| 3 | 80 |

F I G. 48E

| Succession destination table ||
|---|---|
| Group | Succession destination group |
| 0 | Undefined |
| 1 | Undefined |
| 2 | Undefined |

F I G. 48C

| Element-group table |||| 
| Element || Group | Detection reservation flag |
| Block | Word line range | | |
| --- | --- | --- | --- |
| 0 | 0 | 0 | 0 |
| 0 | 1 | 1 | 0 |
| 1 | 0 | 0 | 0 |

FIG. 49A

| P/E cycle table ||
| Block | The number of P/E cycles |
| --- | --- |
| 0 | 20 |
| 1 | 35 |
| 2 | 25 |
| 3 | 80 |

FIG. 49C

| Group table ||||
| Group | Word line range | P/E cycle range | Group representative value |
| --- | --- | --- | --- |
| 0 | 0 | 0-100 | V0 |
| 1 | 1 | 0-300 | V0 |

FIG. 49B

Element-group table

| Element | | Group | Detection reservation flag |
|---|---|---|---|
| Block | Word line range | | |
| 0 | 0 | 0 | 0 |
| 0 | 1 | 1 | 0 |
| 1 | 0 | 0→2 | 0 |

FIG. 50A

Group table

| Group | Word line range | P/E cycle range | Group representative value |
|---|---|---|---|
| 0 | 0 | 0-100 | V0 |
| 1 | 1 | 0-300 | V0 |
| 2 | 0 | 101-200 | V1 |

FIG. 50B

Succession destination table

| Group | Succession destination group |
|---|---|
| 0 | Undefined → 2 |
| 1 | Undefined |
| 2 | Undefined |

FIG. 50C

P/E cycle interval table

| Word line range | P/E cycle interval |
|---|---|
| 0 | 100 |
| 1 | 300 |
| 2-31 | 1000 |
| 32-61 | 1000 |
| 62 | 300 |
| 63 | 100 |

FIG. 50D

P/E cycle table

| Block | The number of P/E cycles |
|---|---|
| 0 | 20 |
| 1 | 101 |
| 2 | 25 |
| 3 | 80 |

FIG. 50E

Element-group table

| Element | | Group | Detection reservation flag |
|---|---|---|---|
| Block | Word line range | | |
| 0 | 0 | 0 | 1 → 0 |

F I G. 51A

Group table

| Group | Word line range | P/E cycle range | Group representative value |
|---|---|---|---|
| 0 | 0 | 0-100 | V0 |

F I G. 51B

Element-group table

| Element | | Group | Detection reservation flag |
|---|---|---|---|
| Block | Word line range | | |
| 0 | 0 | 0 → 1 | 1 → 0 |

F I G. 52A

Group table

| Group | Word line range | P/E cycle range | Group representative value |
|---|---|---|---|
| 0 | 0 | 0-100 | V0 |
| 1 | 0 | 0-100 | V1 |

F I G. 52B

P/E cycle table

| Block | The number of P/E cycles |
|---|---|
| 0 | 20 |
| 1 | 35 |
| 2 | 25 |
| 3 | 80 |

F I G. 52C

P/E cycle interval table

| Word line range | P/E cycle interval |
|---|---|
| 0 | 100 |
| 1 | 300 |
| 2-31 | 1000 |
| 32-61 | 1000 |
| 62 | 300 |
| 63 | 100 |

F I G. 52D

| Element-group table |||| 
| Element || Group | Detection reservation flag |
| Block | Word line range | | |
|---|---|---|---|
| 0 | 0 | 0 → 2 | 0 |
| 0 | 1 | 1 | 0 |
| 1 | 0 | 2 | 0 |

F I G. 53A

| P/E cycle table ||
| Block | The number of P/E cycles |
|---|---|
| 0 | 101 |
| 1 | 101 |

F I G. 53D

| Group table ||||
| Group | Word line range | P/E cycle range | Group representative value |
|---|---|---|---|
| 0 | 0 | 0-100 | V0 |
| 2 | 0 | 101-200 | V1 |

F I G. 53B

| Succession destination table ||
| Group | Succession destination group |
|---|---|
| 0 | Undefined → 2 |
| 2 | Undefined |

F I G. 53C

| Element-group table |||| 
|---|---|---|---|
| Element || Group | Detection reservation flag |
| Block | Word line range | | |
| 0 | 0 | 0 → 2 | 0 |
| 0 | 1 | 1 | 0 |
| 1 | 0 | 2 | 0 |

F I G. 54A

| Group table ||||
|---|---|---|---|
| Group | Word line range | P/E cycle range | Group representative value |
| 0 | 0 | 0-100 | V0 |
| 2 | 0 | 101-200 | V1 |

F I G. 54B

| Succession destination table ||
|---|---|
| Group | Succession destination group |
| 0 | 2 |
| 2 | Undefined |

F I G. 54C

| P/E cycle table ||
|---|---|
| Block | The number of P/E cycles |
| 0 | 101 |
| 1 | 101 |

F I G. 54D

SEMICONDUCTOR MEMORY DEVICE CONFIGURED TO OUTPUT WRITE PARAMETER AND MEMORY SYSTEM INCLUDING THE SAME

CROSS-REFERENCE TO RELATED APPLICATIONS

This application is a continuation of U.S. application Ser. No. 17/027,041 filed Sep. 21, 2020, which is a continuation of U.S. application Ser. No. 16/129,157 filed Sep. 12 2018, and which is based upon and claims the benefit of priority from Japanese Patent Applications No. 2017-183074. filed Sep. 22, 2017; and No. 2018-033796, filed Feb. 27, 2018; the entire contents of all of which are incorporated herein by reference.

FIELD

Embodiments described herein relate generally to a memory system.

BACKGROUND

In recent years, memory systems including a plurality of memory cells have been proposed.

BRIEF DESCRIPTION OF THE DRAWINGS

FIG. 2 is a perspective view showing an example of a memory cell array in the memory system according to the first embodiment.

FIG. 3 is a circuit diagram showing an example of a block of the memory cell array in the memory system according to the first embodiment.

FIG. 4 is a cross-sectional view showing an example of the block of the memory cell array in the memory system according to the first embodiment.

FIG. 5 shows an example of a threshold voltage distribution of the memory cells in the memory system according to the first embodiment.

FIG. 6 shows an example of "programming for parameter tuning" and "programming with tuned parameter" according to the first embodiment.

FIG. 19A and FIG. 19B show an example of a threshold voltage distribution of the memory cells after the write operation by the sequence shown in FIG. 18A and FIG. 18B.

FIG. 22A and FIG. 22B show an example of a command sequence for writing in the method shown in FIG. 21A and FIG. 21B.

FIG. 23A and FIG. 23B show an example of a command sequence indicative of the "programming for parameter tuning" executed by the method shown in FIG. 21A and FIG. 21B.

FIG. 24 shows an example of executing the "programming for parameter tuning" for the first string unit of the first word line in each group.

FIG. 25 shows an example of executing the "programming for parameter tuning" for a plurality of P/E cycles.

FIG. 26 shows an example of executing the "programming for parameter tuning" for a plurality of word lines in one group with being distributed in a plurality of P/E cycles.

FIG. 27 shows an example of executing the "programming for parameter tuning" for the first string units of a plurality of word lines in one group with being distributed in a plurality of P/E cycles.

FIG. 29A and FIG. 29B show other examples of tables necessary for the "programming for parameter tuning" shown in FIG. 24 to FIG. 27.

FIG. 32A and FIG. 32B show examples of states of a write parameter table and an update schedule table at manufacturing, relating to the "programming for parameter tuning" shown in FIG. 24 to FIG. 27.

FIG. 33A and FIG. 33B show examples of the write parameter table and the update schedule table when the number of P/E cycles is 100.

FIG. 34A and FIG. 34B show examples of the write parameter table and the update schedule table when the number of P/E cycles is 105.

FIG. 35A and FIG. 35B show examples of the write parameter table and the update schedule table when the number of P/E cycles is 200.

FIG. 36A and FIG. 36B show examples of the write parameter table and the update schedule table when the number of P/E cycles is 205.

FIG. 37A and FIG. 37B show examples of the write parameter table and the update schedule table when the number of P/E cycles is 300.

FIG. 38A and FIG. 38B show examples of the write parameter table and the update schedule table when the number of P/E cycles is 301.

FIG. 39A and FIG. 39B show examples of the write parameter table and the update schedule table when the number of P/E cycles is 304.

FIG. 42 shows an example of elements moving between groups.

FIG. 44A, FIG. 44B, and FIG. 44C show examples of tables necessary for group recomposition.

FIG. 45A and FIG. 45B show other examples of tables necessary for group recomposition.

FIG. 47B is a flowchart showing an example of a second joining step in the flowchart shown in FIG. 46.

FIG. 48A, FIG. 48B, FIG. 48C, FIG. 48D, and FIG. 48E show an example of table state change wherein an element not belonging to a group is joined to a newly created group.

FIG. 49A, FIG. 49B, and FIG. 49C show an example of table state change wherein an element is not belonging to a group is joined to an existing group.

FIG. 50A, FIG. 50B, FIG. 50C, FIG. 50D, and FIG. 50E show an example of table state change wherein an element belonging to a group is released from the group and joined to a newly created group.

FIG. 51A and FIG. 51B show an example of table state change wherein an element is inspected at random and remain in the group to which the element belongs.

FIG. 52A, FIG. 52B, FIG. 52C, and FIG. 52D show an example of table state change wherein an element is inspected at random, evicted from the group to which the element has belonged, and joined to another existing group.

FIG. 53A, FIG. 53B, FIG. 53C, and FIG. 53D show an example of table state change wherein the number of P/E cycles of elements belonging to the group with a succession destination undefined deviates from the P/E cycle range of the group and are released from the group.

FIG. 54A, FIG. 54B, FIG. 54C, and FIG. 54D show an example of table state change wherein the number of P/E cycles of elements belonging to the group with a succession destination defined deviates from the P/E cycle range of the group and are released from the group.

DETAILED DESCRIPTION

Figure 1:
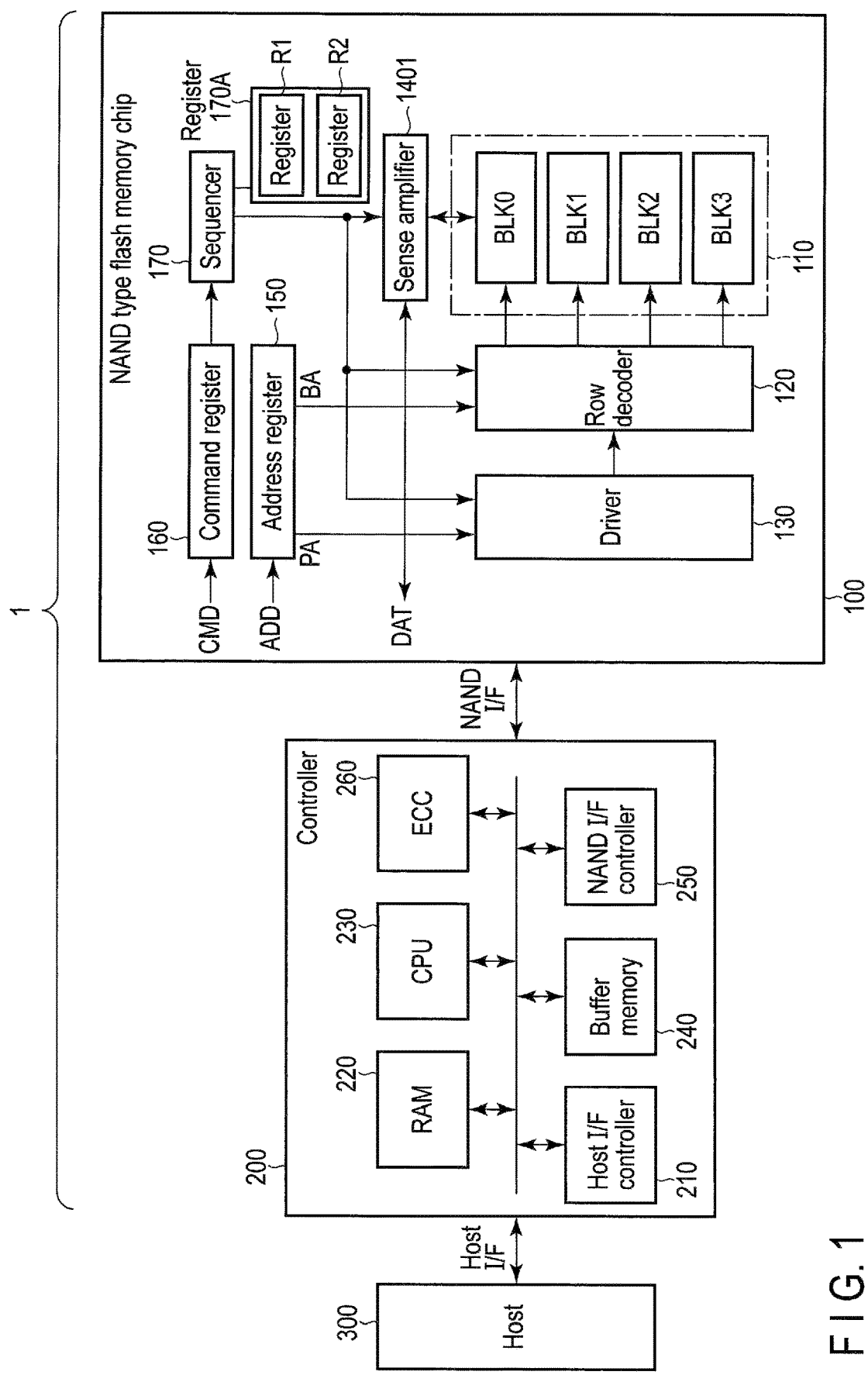
FIG. 1 is a block diagram showing an example of a memory system according to the first embodiment.

Embodiments will be described hereinafter with reference to the accompanying drawings.

In general, according to one embodiment, a memory system comprises a nonvolatile semiconductor memory; and a controller configured to control the semiconductor memory. The semiconductor memory comprises a memory cell; and a write circuit configured to write data to the memory cell by applying a program voltage to the memory cell and comparing a threshold voltage of the memory cell with a first reference voltage corresponding to the write data. The write circuit is configured to execute a first programming operation to obtain a value of a write parameter by comparing the threshold voltage of the memory cell with a second reference voltage, the second reference voltage being different from the first reference voltage.

The following explanations disclose examples of devices and methods to embody the technical idea of the embodiments, and the technical idea of the embodiments is not limited by the materials, shapes, structures, arrangements, and the like of the components explained below. Modification which is easily conceivable by a person of ordinary skill in the art comes within the scope of the disclosure as a matter of course. In order to make the description clearer, the sizes, shapes and the like of the respective parts may be changed and illustrated schematically in the drawings as compared with those in an accurate representation.

Constituent elements having substantially the same functions and features in a plurality of drawings are denoted by the same reference numerals and their duplicate explanations may be omitted. In the following explanations, "connection" indicates not only instruct connection, but also connection made via the intervening element.

First Embodiment

A memory system according to the first embodiment will be explained. A memory system including a nonvolatile semiconductor memory such as a NAND type flash memory (hereinafter called NAND flash memory) will be explained as the memory system according to the first embodiment, but may be a memory system including other nonvolatile memories.

[Overall Configuration]

FIG. 1 shows a schematic overall configuration of an example of a memory system according to the embodiment.

A memory system 1 includes, for example, a NAND flash memory chip 100 serving as a nonvolatile semiconductor memory, and a controller 200. The NAND flash memory chip 100 and the controller 200 may be constituted as, for example, a device including the same housing. Examples of the device are a memory card such as an SD (registered trademark) card, a solid state drive (SSD), and the like.

The NAND flash memory chip 100 includes a plurality of nonvolatile memory cells. The controller 200 is connected to the NAND flash memory chip 100 by a NAND interface (I/F) and is connected to a host device (hereinafter called host) 300 by a host interface (I/F). The NAND I/F includes, for example, a chip enable signal CE, a command latch enable signal CLE, an address latch enable signal ALE, a write enable signal WE, a read enable signal RE, a data strobe signal DQS, I/O signals DQx (DQ0 to DQ7), and ready/busy signal R/Bn. A signal may be represented by either of a high-active (positive logic) signal and a low-active (negative logic) signal, or represented by a complementary signal of the positive logic signal and the negative logic signal. The low-active signal is represented by attaching "n" after the signal name for convenience of explanations. The I/O signals DQx are used to transmit commands, addresses, data, and the like.

The host I/F conforms to, for example, serial attached SCSI (SAS) (registered trademark). The controller 200 controls the NAND flash memory chip 100 and accesses the NAND flash memory chip 100 in response to a command received from the host 300. In FIG. 1, one NAND flash memory chip 100 is connected to the controller 200 but a plurality of NAND flash memory chips 100 may be connected to the controller 200. The host 300 is, for example, a digital camera, a personal computer or the like.

[Controller 200]

The controller 200 is composed of an LSI or the like including a host I/F controller 210, a built-in random access memory (RAM) 220, a processor (CPU) 230, a buffer memory 240, a NAND I/F controller 250, and an error checking and correcting (ECC) circuit 260. Each function of the controller 200 may be implemented by firmware executed by the processor 230.

The host I/F controller 210 is connected to the host 300 via the host I/F and transfers commands and data received from the host 300 to the processor 230 and the buffer memory 240. In addition, the host I/F controller 210 transfers data in the buffer memory 240 to the host 300 in response to a command of the processor 230.

The processor 230 controls whole operations of the controller 200. For example, when the processor 230 receives a write command from the host 300, the processor 230 issues a write command to the NAND I/F controller 250 in response to the received write command. When the processor 230 receives a read command, the processor 230 issues a read command to the NAND I/F controller 250 in response to the received read command. In addition, the processor 230 executes various processing for managing the NAND flash memory chip 100, such as garbage collection (compaction) and wear leveling.

The NAND I/F controller 250 is connected to the NAND flash memory chip 100 via the NAND I/F and controls communications with the NAND flash memory chip 100. Then, the NAND I/F controller 250 transmits various signals to the NAND flash memory chip 100 and receives the signals from the NAND flash memory chip 100, in response to the commands received from the processor 230.

The buffer memory 240 temporarily stores the write data and the read data. The buffer memory 240 may be composed of DRAM, SRAM, or the like. Furthermore, the buffer memory 240 may not be built in the controller 200 but may be external to the controller 200.

The built-in memory 220 is, for example, a semiconductor memory such as DRAM, SRAM, or the like, and is used as a work area of the processor 230. The built-in memory 220 stores firmware for managing the NAND flash memory chip 100, various management tables, and the like.

The ECC circuit 260 executes error detection and error correction of the data stored in the NAND flash memory chip 100. In other words, the ECC circuit 260 generates and adds an error-correcting code to the write data when writing the data, and decodes the error-correcting code when reading the data.

[NAND Flash Memory Chip 100]

The NAND flash memory chip (hereinafter simply called a flash memory chip) 100 includes a memory cell array 110, a row decoder 120, a driver circuit 130, a sense amplifier 140, an address register 150, a command register 160, and a sequencer 170.

The memory cell array 110 includes a plurality of physical blocks (hereinafter simply called blocks) BLK including a plurality of nonvolatile memory cells associated with rows and columns. Four blocks BLK0 to BLK3 are shown in FIG. 1 as an example. The memory cell array 110 stores data supplied from the controller 200.

The row decoder 120 selects any one of blocks BLK0 to BLK3 and selects a row in the selected block BLK.

The driver circuit 130 supplies the voltage to the selected block BLK via the row decoder 120.

The sense amplifier 140 senses the memory cell array 110, executes a necessary operation, and outputs data DAT to the controller 200, in the data read operation. The sense amplifier 140 transfers the write data DAT received from the controller 200, to the memory cell array 110, in the data write operation.

The address register 150 stores address ADD received from the controller 200. The command register 160 stores command CMD received from the controller 200.

The sequencer 170 controls overall operations of the flash memory chip 100, in response to the command CMD stored in the command register 160. More specifically, the sequencer 170 applies a predetermined voltage to the row decoder 120, the sense amplifier 140, and the like to execute writing, reading, erasing, and the like. The sequencer 170 is connected to a register 170A in which a write parameter value and various tables are held. An example of the write parameter is an initial value of a program voltage "Initial Vpgm". The write parameter value and various tables may be held outside the flash memory chip 100, for example, in the controller 200. In this case, the register 170A does not need to be provided.

[Memory Cell Array 110]

FIG. 2 is a perspective view showing an example of the memory cell array 110. For convenience of explanations, FIG. 2 shows two blocks BLK0 and BLK1 and four words lines WL0 to WL3 and does not show other blocks or word lines. For example, a data erase operation is executed for each block. A block is denoted by BLK when a block is generally referred to.

Each block BLK includes a source diffusion layer 42, source-side select gate lines SGS serving as conductive layers formed above the source diffusion layer 42, word lines WL0 to WL3, drain-side select gate lines SGD, and an active layer AA. A plurality of NAND string units are composed of these layers.

The source diffusion layer 42 formed in a semiconductor substrate (not shown) is provided commonly in, for example, all of the blocks BLK in the same plane. The source diffusion layer 42 is connected to source line SL-M1 via a contact plug PSL.

Three or more conductive layers formed of, for example, conductive poly-silicon are stacked via an interlayer insulating layer (not shown) on the source diffusion layer 42. For example, six conductive layers of this type are stacked via the interlayer insulating layer. Each conductive film constitutes the source-side select gate line (second select gate line) SGS located in the lowermost layer, the drain-side select gate lines (first select gate lines) SGD0 to SGD5, and the word lines WL0 to WL3 disposed between the source-side select gate line SGS and the drain-side select gate lines SGD. In FIG. 2, the first select gate lines SGD0 to SGD4 are hidden by other objects and not shown.

Each of five remaining conductive layers other than the drain-side select gate lines SGD0 to SGD5 of the uppermost layer is formed in a plate shape in one block BLK. In addition, end portions of the six conductive layers in x direction (i.e., a direction parallel to the surface of the semiconductor substrate) are formed in a stair shape to enable contact with each of the conductive layers. For example, the word line WL0 is formed above the source-side select gate line SGS but is not formed above the end portion of the source-side select gate line SGS to enable contact with the source-side select gate line SGS. In other words, the width of the word line WL0 in the x direction is formed to be narrower than the width of the source-side select gate line SGS. Simultaneously, the width of the word line WL1 in the x direction is formed to be narrower than the width of the word line WL2, the width of the word line WL2 in the x direction is formed to be narrower than the width of the word line WL3, and the width of the word line WL3 in the x direction is formed to be narrower than the width of the drain-side select gate line SGD.

Each of the drain-side select gate lines SGD0 to SGD5 of the uppermost layer is formed in a rod shape. The drain-side select gate lines SGD0 to SGD5 extend in the x direction and are spaced apart from each other in y direction.

The active layers (active areas) AA are formed in a columnar shape, and are formed to penetrate the source-side select gate line SGS, the word lines WL0 to WL3, and the drain-side select gate lines SGD0 to SGD5 from the source diffusion layer 42 in z direction (i.e., a direction perpendicular to the surface of the semiconductor substrate). Upper ends of the active layers AA are connected to a plurality of bit lines BL0 to BL(L−1) (where L is a natural integer) that are spaced apart in the x direction while extending in the y direction, respectively.

The source-side select gate line SGS is connected to a lead SGS-M1 extending in the x direction via a contact plug PSGS. The word lines WL0 to WL3 are connected to leads WL0-M1 to WL3-M1 extending in the x direction via contact plugs PWL0 to PWL3, respectively.

The drain-side select gate lines SGD0 to SGD5 are connected to leads SGD0-M1 to SGD5-M1 extending in the x direction via contact plugs PSGD0 to PSGD5, respectively.

The bit lines BL0 to BL(L−1), and the leads SGS-M1, WL0-M1, WL1-M1 to WL3-M1, and SGD0-M1 to SGD5-M1 are formed of, for example, metallic interconnects.

[Block BLK]

An example of a configuration of the block BLK is shown in FIG. 3. A block BLK includes, for example, four string units Str0 to Str3. A string unit is generally referred to as string unit Str. Each of the string units Str includes a plurality of NAND strings 10.

Each of the NAND strings 10 includes, for example, eight memory cell transistors MT (MT0 to MT7), and select transistors ST1 and ST2. Each of the memory cell transistors MT includes a control gate and a charge storage layer, and stores data in a nonvolatile manner. The memory cell transistors MT in a NAND string 10 are serially connected between a source of the select transistor ST1 and a drain of the select transistor ST2.

Gates of the select transistors ST1 in the string units Str0 to Str3 are connected to the select gate lines SGD0 to SGD3, respectively. In contrast, gates of the select transistors ST2 in the string units Str0 to Str3 are connected commonly to, for example, the select gate line SGS. Alternatively, the gates of the select transistors ST2 in the string units Str0 to Str3 may be connected to the select gate line SGS0 to SGS3 different for each string unit. Control gates in the memory cell transistors MT0 to MT7 in the same block BLK are connected commonly to the word lines WL0 to WL7, respectively.

The drains of the select transistors ST1 of the NAND strings 10 in the same column, in the memory cell array 110, are connected commonly to the bit lines BL0 to BL(L−1), respectively. In other words, the bit lines BL are connected commonly to the NAND strings 10 of the different blocks BLK. Furthermore, sources of the select transistors ST2 are connected commonly to the source line SL.

In other words, the string unit Str includes the NAND strings 10 connected to the different bit lines BL and connected to the same select gate line SGD. The block BLK includes the string units Str commonly including the word lines WL. The memory cell array 110 includes the blocks BLK commonly including the bit lines BL. In a string unit Str, memory cell transistors MT whose gates are connected to a same word line are called a cell unit (CU).

FIG. 4 is a cross-sectional view showing a partial area of an example of the block BLK. The NAND strings 10 are formed above a p-well area 20. In other words, for example, four interconnect layers 27 functioning as the select gate lines SGS, eight interconnect layers 23 functioning as the word lines WL0 to WL7, and, for example, four interconnect layers 25 functioning as the select gate lines SGD are sequentially stacked above the p-well area 20. Insulating films (not shown) are formed between the stacked interconnect layers.

A plurality of pillar-shaped conductors 31 having lower ends reaching the p-well area 20 through the interconnect layers 25, 23, and 27 are formed. To form the conductors 31, first, a plurality of memory holes having lower ends reaching the p-well area 20 through the interconnect layers 25, 23, and 27 are formed by etching. In FIG. 4, the diameter of the memory hole is uniform in the upper layer area and the lower layer area, and the conductor 31 is shaped in a pillar having a uniform diameter. But, in fact, the diameter of the memory hole in the upper layer area is larger than the diameter of the memory hole in the lower layer area since the upper layer area is more etched than the lower layer area in the multilayer film. In other words, the diameter of the memory hole gradually changes from the larger diameter to the smaller diameter, from the upper layer area to the lower layer area. The variation in diameter is remarkable as the etching distance (i.e., a distance in the longitudinal direction in FIG. 4) of the memory hole becomes longer. A block insulating film 28, a charge storage layer (insulating film) 29, a gate insulating film 30, and a conductor 30 are sequentially formed inside the memory hole, and the memory cell transistor MT and the select transistors ST1 and ST2 are thereby formed. The conductor 31 functions as a current path of the NAND string 10 and is an area where channels of the respective transistors are formed. The upper end of the conductor 31 is connected to a metallic interconnect layer 32 which functions as the bit line BL. Thus, since the diameter of the memory hole in the upper layer is different from the diameter in the lower layer area, the characteristic of the memory cell transistors disposed in the layers different in the depth direction are different in the flash memory of the three-dimensional structure.

An n⁺ impurity diffusion layer 33 is formed in the surface area of the p-well area 20. A contact plug 35 is formed in the diffusion layer 33. The contact plug 35 is connected to a metallic interconnect layer 36 which functions as the source line SL. Furthermore, a p⁺ impurity diffusion layer 34 is formed in the surface area of the p-well area 20. A contact plug 37 is formed on the diffusion layer 34. The contact plug 37 is connected to a metallic interconnect layer 38 which functions as a well interconnect CPWELL. The well interconnect CPWELL applies an electric potential to the conductor 31 via the well area 20.

A plurality of the above-explained structures are aligned in a direction (depth direction) perpendicular to the sheet of FIG. 4, and the string unit Str is formed by a set of the NAND strings 10 arranged in the depth direction.

One memory cell transistor MT may be configured to store data of 1 bit or plural bits. In a case where the memory cell transistor MT is capable of storing 2-bit data, 2-bit data includes a lower bit data and an upper bit data. A set of the lower bit data stored by the memory cell transistors in a cell unit is called a lower page while a set of the upper bit data stored by the memory cell transistors in a cell unit is called an upper page. In other words, the block BLK including eight word lines WL has the capacity for sixteen pages. The "page" may be defined as a part of the memory space formed by the memory cell transistors in a cell unit. Data write operation and data read operation are executed in units of pages or cell units. In a case where the memory cell transistor is capable of storing 3-bit data, 3-bit data include a lower bit data, a middle bit data, and an upper bit data. A set of the lower bit data stored by the memory cell transistors in a cell unit is called a least significant bit (LSB) page or a lower page, a set of the middle bit data stored by the memory cell transistors in a cell unit is called a center significant bit (CSB) page or a middle page, and a set of the upper bit data stored by the memory cell transistors in a cell unit is called a most significant (MSB) page or an upper page.

FIG. 5 is a graph showing a threshold voltage distribution which the memory cell transistors MT may have, and a voltage used in the read operation.

As explained above, the memory cell transistors MT store 2-bit data in accordance with the threshold voltage distribution. Data represented as 2 bits are called "Er" state, "A" state, "B" state, and "C" state sequentially from the lowest voltage of the threshold voltage distribution.

The memory cell transistors MT wherein the threshold voltage distribution is lower than voltage VA are recognized to store the data of "Er" state corresponding to a data erased state. The memory cell transistors MT wherein the threshold voltage distribution is higher than the voltage VA and lower than voltage VB (>VA) are recognized to store "A" state data. The memory cell transistors MT wherein the threshold voltage distribution is higher than the voltage VB and lower than voltage VC (>VB) are recognized to store "B" state data. The memory cell transistors MT wherein the threshold voltage distribution is higher than or equal to the voltage VC and lower than VREAD (>VC) are recognized to store "C" state data. The "C" state, of the 2-bit data, corresponds to the data of the highest threshold voltage distribution.

The lower page is read by using, for example, voltages VA and VC as the read voltages. Operations of reading the data by applying the voltages VA and VC are called read operations AR and CR, respectively. In other words, it is determined whether the stored data is in "Er" state or any one of "A", "B", and "C" states, by the read operation AR. Furthermore, it is determined whether the stored data is in "C" state or any one of "Er", "A", and "B" states, by the read operation CR. In addition, the upper page is read by using the voltage VB. This is called read operation BR. It is determined whether the stored data is in any one of "Er" and "A" states or any one of the "B" and "C" states, by the read operation BR.

Erasing the data may be executed in the block BLK unit or in a unit smaller than the block BLK.

Furthermore, the memory cell array 110 may have another configuration.

[Write Operation in Flash Memory]

The write operation includes an operation applying a program voltage (also called a program operation) and an operation verifying threshold voltage (also called a program verify operation). During the program operation, by applying the program voltage to the gate electrode of the memory cell transistor MT, electric charge is injected to the charge storage layer of the memory cell transistor MT and the threshold voltage of the memory cell transistor is increased. During the program verify operation, the threshold voltage of the memory cell transistor is monitored. Program verify operation determines whether the threshold voltage of the memory cell transistor has reached the predetermined threshold voltage or not. If the program verify fails (i.e., the threshold voltage of the memory cell transistor does not reach the predetermined threshold voltage), the program voltage is increased by a program voltage increment step CV and the program operation is executed again. The program operation is repeated until the program verify succeeds. The increased voltage is not limited to a constant voltage but may be a voltage dynamically changing. Executing the write operation while increasing the program voltage as explained above is also called step-up programming.

Depending on a write parameter, such as the initial value of the program voltage "Initial Vpgm" and the program voltage increment step, the time required to complete a program (i.e., time to the success in the program verify process) and/or the characteristic related to programming (hereinafter called a program characteristic) changes. For this reason, in the embodiment, a group composed of a set of the memory cell transistors is defined and, while the program operation is executed for the memory cell transistors connected to one word line (also called a cell unit) of the group or one string unit of the word line, "programming for parameter tuning" (first programming) to detect an appropriate write parameter value which achieves a desired program characteristic is executed. Once the appropriate write parameter value is detected, the detected write parameter value is held, and "programming with tuned parameter" (second programming) that applies (reuses) the held write parameter value is executed for the same memory cell transistors (or other than that) in the next and subsequent write operations. By occasionally executing the "programming for parameter tuning", the write parameter is dynamically tuned to be an appropriate value. The time required for the "programming with tuned parameter" is shorter than the time required for the "programming for parameter tuning". The write parameter includes the program voltage increment step ΔV, and the like other than the initial value of the program voltage "Initial Vpgm", but in the following explanations, the initial value of the program voltage "Initial Vpgm" is considered as the write parameter.

["Programming for Parameter Tuning" and "Programming with Tuned Parameter"]

Methods of writing to the memory cell transistors capable of storing data of plural bits include a method of writing the data of plural bits to the memory cell transistors in one step by one program command, and a method of writing the data of plural bits to the memory cell transistors in multiple steps by plural program commands. First, the method of writing the data of plural bits to the memory cell transistors in one step by one program command will be explained.

FIG. 6 shows situations of the "programming for parameter tuning" and the "programming with tuned parameter". A pulse waveform shown on an upper side of FIG. 6 shows transition of the program voltage, and a waveform shown on a lower side of FIG. 6 shows the transition of the threshold voltage distribution of the memory cell transistors obtained when the program voltage is applied. Initial value of the program voltage "Initial Vpgm" is applied to the word line, the program verify is executed in order to determine whether the threshold voltage distribution of the memory cell transistors has reached a reference voltage. If the verify fails, the program voltage is increased by the program voltage increment step ΔV. If the lower portion of the threshold voltage distribution (i.e., the lowest threshold voltage) of the memory cell transistors exceeds the program verify reference voltage according to the write data, the program verify is determined to succeed and the program operation has ended. To cause the program verify to succeed, a condition that the number of the memory cells for program, i.e., the number of the memory cells wherein the threshold voltage is determined to be lower than the program verify reference voltage is smaller than or equal to a threshold number XX should be satisfied. Here, the threshold number XX may be any value.

Verify of the "A" state shown in FIG. 5 will be explained. In the "programming for parameter tuning", smart verify using a reference voltage different from the program verify reference voltage VA is also executed in addition to the conventional program verify. In the following explanations, the smart verify reference voltage is lower than the program verify reference voltage VA. When the upper portion of the threshold voltage distribution (i.e., the highest threshold voltage) of the memory cell transistors exceeds the smart verify reference voltage, the smart verify detection is determined to be completed. That is, the detection is completed when the number of the memory cells being programmed that have higher threshold voltages than the smart verify reference voltage is equal to or larger than a threshold number YY. The "programming for parameter tuning" is executed until the lower portion of the threshold voltage distribution (i.e., the lowest threshold voltage) of the memory cell transistors exceeds the program verify reference voltage VA. The verify operation for the other states are same as that for the "A" state, except for the program verify reference voltage. During the "programming for parameter tuning", the program voltage is detected as an optimal program voltage when the upper portion of the threshold voltage distribution of the memory cell transistors first exceeds the smart verify reference voltage. By using the detected program voltage as an initial value of the program voltage in the "programming with tuned parameter", a time required for "programming with tuned parameter" can be reduced. During the "programming for parameter tuning", a write parameter value which achieves a desired performance is detected, by gradually increasing the program voltage from an initial value of the program voltage "Initial Vpgm" lower than the preset voltage (i.e., not optimized voltage). For this reason, the number of loops executed until the program verify is completed during the "programming for parameter tuning" is more than that in the "programming with tuned parameter". Furthermore, since the verify operation for the smart verify is executed in the loops during the "programming for parameter tuning", more time is spent.

The write parameter value obtained by the "programming for parameter tuning" is held in the register 170A of the flash memory chip 100 or stored in the write parameter table of the RAM 220 of the controller 200. A write parameter value may be commonly applied to memory cell transistors of a group, in which the memory cells have similar characteristic, but may not be applied commonly to the memory cell transistors remarkably different in characteristic. For this reason, a plurality of write parameter values may exist for the overall memory cell array. An example of the write operation wherein the limited number of write parameter settings, for example, one set of write parameters is held in the register 170A of the flash memory chip 100 will be explained with reference to a flowchart of FIG. 7A and FIG. 7B. An example of the write operation wherein two sets of write parameters are held in the register 170A of the flash memory chip 100 will be explained with reference to flowcharts of FIG. 7C and FIG. 7D. The register 170A includes a register R1 and a register R2 wherein sets of write parameters are held respectively.

Besides the write parameter value, information indicating the group of the memory cell transistors which is related with the write parameter value is also held in the register 170A. Various sets of memory cell transistors are considered as the group of the memory cell transistors to which the same write parameter value may be applied. The group is assumed to be a block in the examples shown in FIG. 7A, FIG. 7B, FIG. 7C, and FIG. 7D. The data write operation includes write operation of the user data received from the host 300 (hereinafter may be called "host write") and data write operation executed by garbage collection (hereinafter may be called "GC write"). The controller 200 knows whether a current write destination block is a host write destination block or a GC write destination block.

Figure 7A:
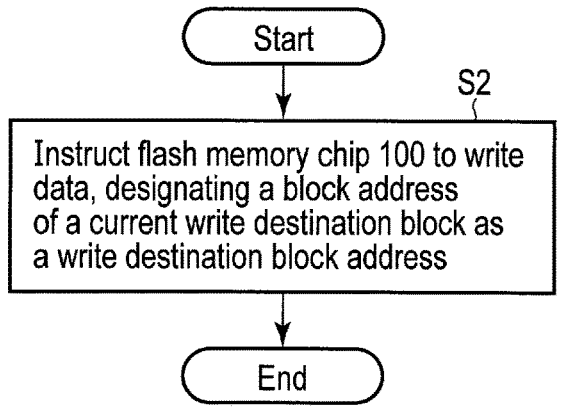
FIG. 7A is a flowchart showing an example of a write operation of a controller wherein one set of write parameter values is held in a register of a flash memory.
Figure 7B:
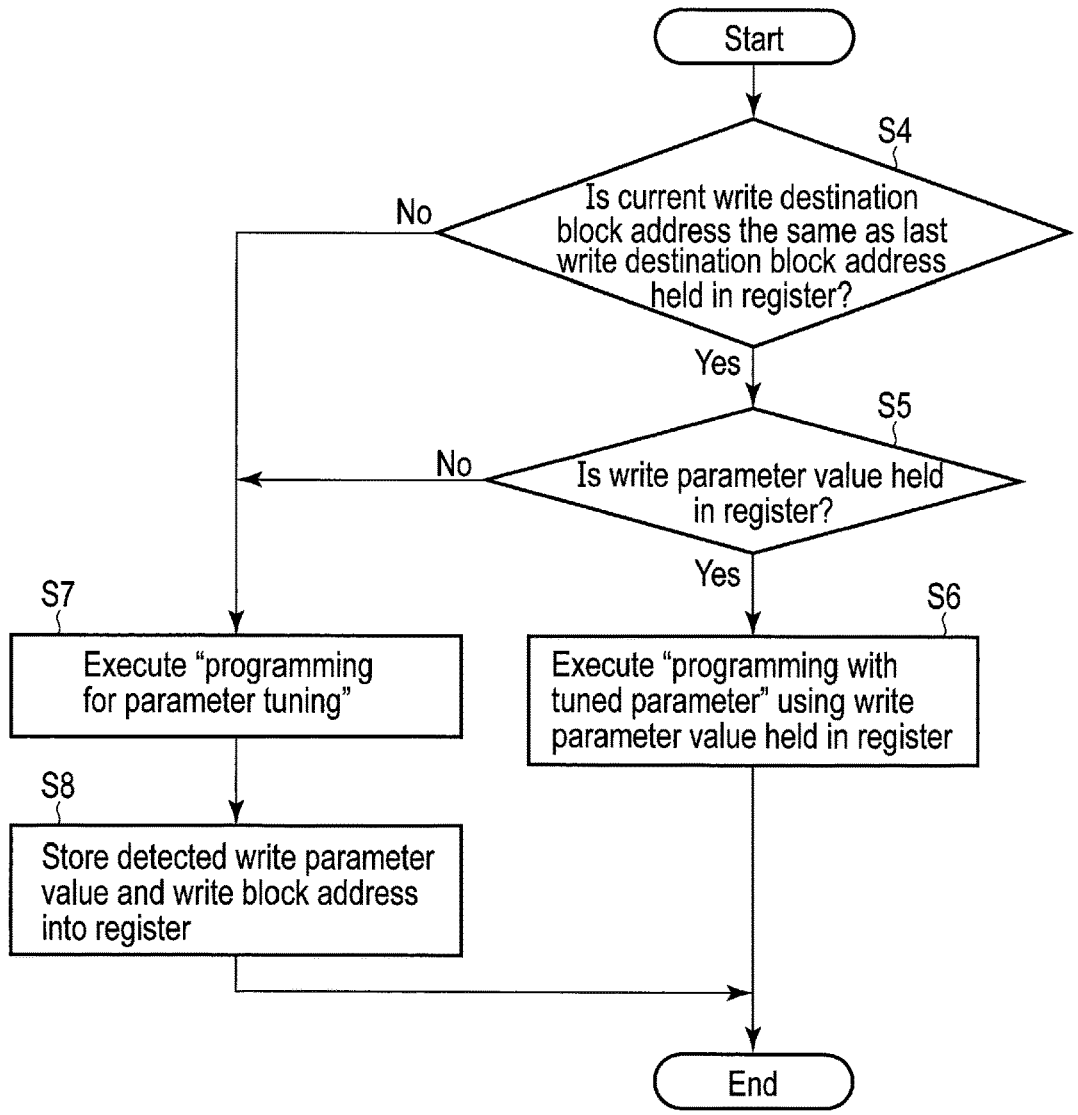
FIG. 7B is a flowchart showing an example of a write operation of a flash memory wherein the one set of write parameter values is held in the register of the flash memory.

FIG. 7A shows an example of the write operation on the controller 200 side, and FIG. 7B shows the write operation on the flash memory chip 100 side. As shown in step S2 of FIG. 7A, the controller 200 instructs the flash memory chip 100 to write data, designating a block address of a current write destination block as a write destination block address.

As shown in step S4 of FIG. 7B, when the flash memory chip 100 is instructed to write by the controller 200, the sequencer 170 determines whether the current write destination block address is the same as the last write destination block address (i.e., the block address relating to the write parameter value held in the register 170A) or not. If the determination result is YES (i.e., the current write destination block address is the same as the last write destination block address), the sequencer 170 determines, in step S5, whether the write parameter value is held in the register 170A or not. If the determination result is YES (i.e., the write parameter value is held in the register 170A), the sequencer 170 executes, in step S6, the "programming with tuned parameter" using the write parameter value held in the register 170A. The program voltage at the smart verify detection completion, which is the write parameter of this block, is held in the register 170A as the write parameter value. By using the write parameter value as an initial program voltage in the "programming with tuned parameter", the program time can be reduced.

If the determination result in step S4 is NO (i.e., the current write destination block address is not the same as the last write destination block address) or if the determination result in step S5 is NO (i.e., the write parameter value is not held in the register 170A), the sequencer 170 executes, in step S7, the "programming for parameter tuning". The sequencer 170 stores, in step SB, the detected write parameter value and the write destination block address into the register 170A.

Figure 7C:
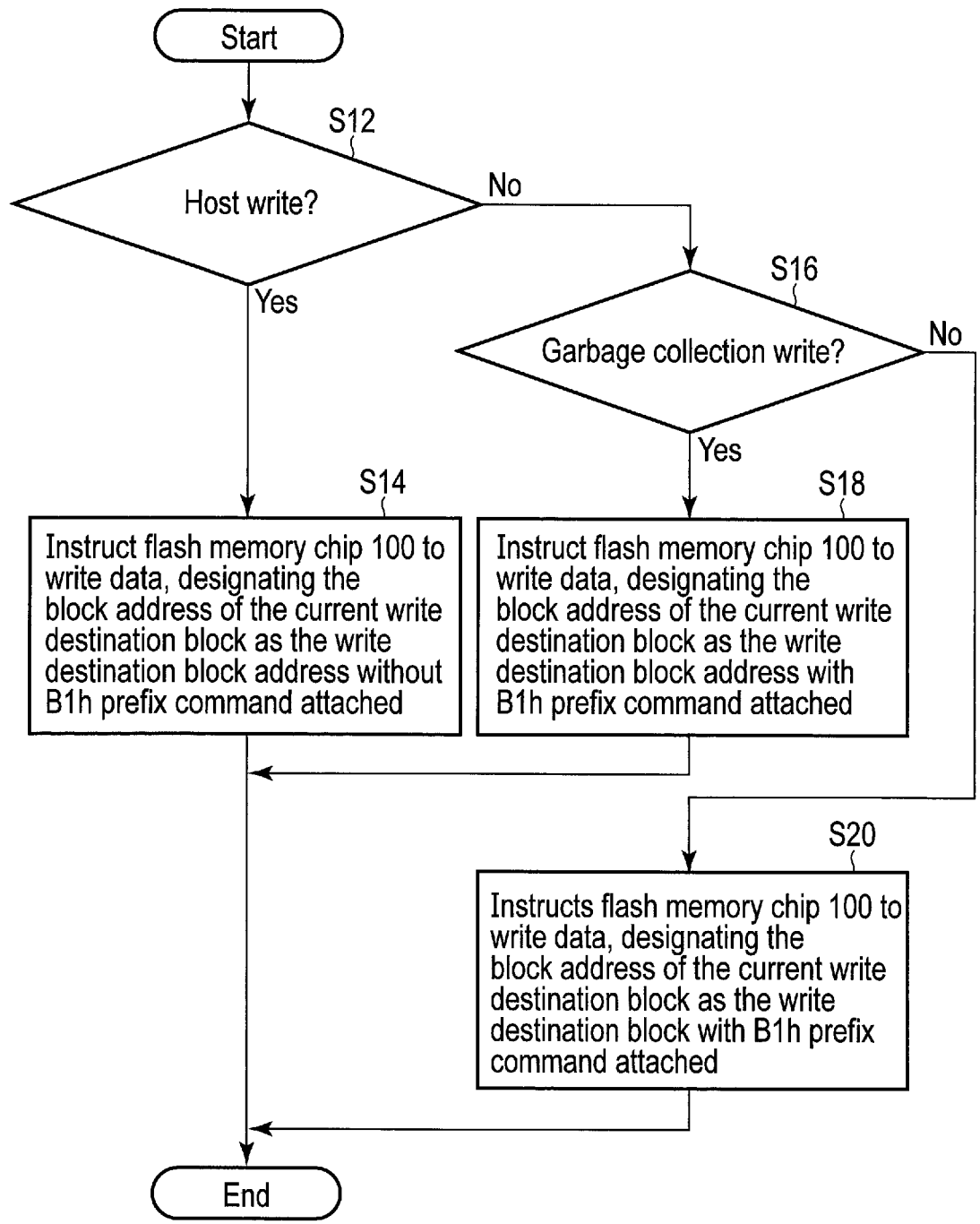
FIG. 7C is a flowchart showing an example of a write operation of the controller wherein two sets of write parameter values are held in the register of the flash memory.
Figure 7D:
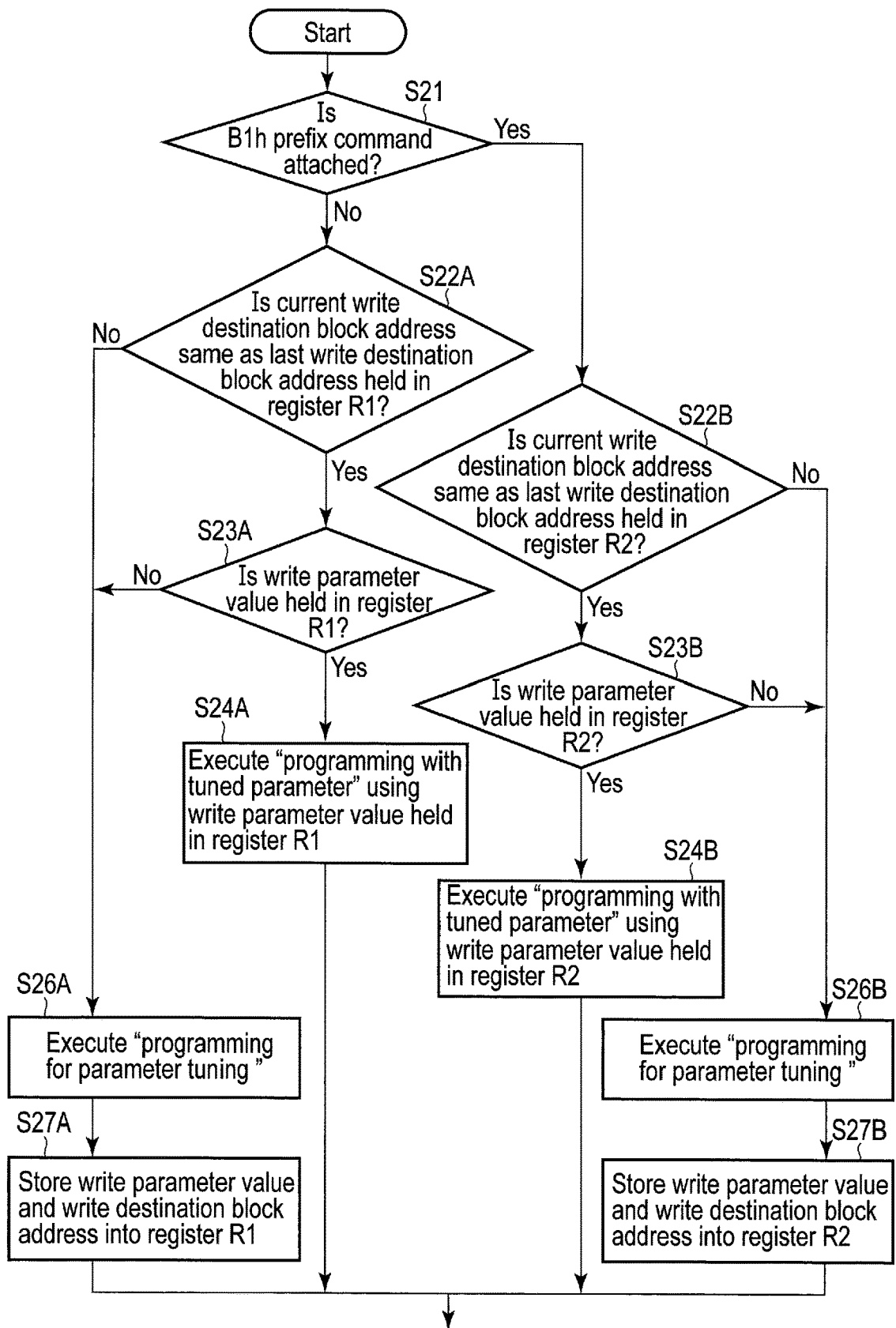
FIG. 7D is a flowchart showing an example of a write operation of the flash memory wherein the two sets of write parameter values are held in the register of the flash memory.

FIG. 7C shows an example of the write operation on the controller 200 side wherein two sets of write parameters are held in the register 170A of the flash memory chip 100, and FIG. 7D shows an example of the write operation on the flash memory chip 100 side wherein two sets of write parameters are held in the register 170A. It is assumed that one host write destination block, one GC write destination block, and another write destination block are present. Among these three write destination blocks concurrently being written, the frequencies of executing the "programming for parameter tuning" for the host write destination block and the GC write destination block are desired to be low, since the write frequencies to the host write destination block and the GC write destination block are assumed to be higher than that to said another write destination block.

As shown in step S12 of FIG. 7C, the controller 200 determines whether the current write destination is the host write destination or not. If the determination result is YES (i.e., the current write destination block is the host write destination block), the controller 200 instructs, in step S14, the flash memory chip 100 to write data, designating the block address of the current write destination block (host write destination block) as the write destination block address without B1h prefix command attached. B1h prefix command is used to select the register R1 or the register R2. It is assumed that the register R2 is selected if B1h prefix command is attached, and the register R1 is selected if B1h prefix command is not attached. In the case of step S14, the register R1 is used.

If the determination result in step S12 is NO (i.e., the current write destination block is not the host write destination block), the controller 200 determines, in step S16, whether the current write destination block is the GC write destination block or not. If the determination result is YES (i.e., the current write destination block is the GC write destination block), the controller 200 instructs, in step S18, the flash memory chip 100 to write data, designating the block address of the current write destination block (the GC write destination block) as the write destination block address with B1h prefix command attached. Hence the register R2 is selected.

If the determination result in step S16 is NO (i.e., the current write destination block is not the GC write destination block), the controller 200 instructs, in step S20, the flash memory chip 100 to write data, designating the block address of the current write destination block (said another write destination block) as the write destination block with B1h prefix command attached. Instead, the controller 200 may instruct, in step S20, the flash memory chip 100 to write data without B1h prefix command attached, if the current write destination block is not the host write destination block or the GC write destination block. Whether B1h prefix command should be attached/should not be attached may be determined by determining which of the host write and the GC write should be sacrificed. For example, the write of a lower write frequency may be sacrificed. Alternatively, a command to disable the smart verify may be attached and the smart verify may not be executed, in step S20.

As shown in step S21 of FIG. 7D, when the flash memory chip 100 is instructed to write data by the controller 200, the sequencer 170 determines whether B1h prefix command is attached or not. If the determination result is NO (i.e., B1h prefix command is not attached), the sequencer 170 determines, in step S22A, whether the current write destination block address is the same as the last write destination block address in the register R1 (i.e., the block address relating to the write parameter value held in the register R1) or not. If the determination result is YES (i.e., the current write destination block address is the same as the last write destination block address in the register R1), the flash memory chip 100 determines, in step S23A, whether the write parameter value is held in the register R1 or not. If the determination result is YES (i.e., the write parameter value is held in the register R1), the sequencer 170 executes, in step S24A, the "programming with tuned parameter" using the write parameter value held in the register R1. The program voltage at the smart verify detection completion, which is the write parameter value of this block, is held in the register R1 as the write parameter. By using the write parameter value as an initial program voltage in the "programming with tuned parameter", the program time can be reduced.

If the determination result in step S22A is NO (i.e., the current write destination block address is not the same as the last write destination block address in the register R1) or if the determination result in step S23A is NO (i.e., the write parameter value is not held in the register R1), the sequencer 170 executes the "programming for parameter tuning" in step S26A. The sequencer 170 stores, in step S27A, the detected write parameter value and the write destination block address into the register R1.

If the determination result in step S21 is YES (i.e., B1h prefix command is attached), the sequencer 170 determines, in step S2²B, whether the current write destination block address is the same as the last write destination block address in the register R2 (i.e., the block address relating to the write parameter value held in the register R2) or not. If the determination result is YES (i.e., the current write destination block address is the same as the last write destination block address in the register R2), the sequencer 170 determines, in step S23B, whether the write parameter value is held in the register R2 or not. If the determination result is YES (i.e., the write parameter value is held in the register R2), the sequencer 170 executes, in step S24B, the "programming with tuned parameter" using the write parameter value held in the register R2. The program voltage at the smart verify detection completion, which is the write parameter of this block, is held in the register R2 as the write parameter value. By using the write parameter value as an initial program voltage in the "programming with tuned parameter", the program time can be reduced.

If the determination result in step S22B is NO (i.e., the current write destination block address is not the same as the last write destination block address) or if the determination result in step S23B is NO (i.e., the write parameter value is not held in the register R2), the sequencer 170 executes the "programming for parameter tuning" in step S26B. The sequencer 170 stores, in step S27B, the detected write parameter value and the write destination block address in the register R2.

The register holding the write parameter value is specified using B1h prefix command as shown in FIG. 7D. On the other hand, if B1h prefix command is not attached and in case, such as the register 170A could not be allocated for a new write parameter set, a new write parameter value as a detection result may overwrite an existing write parameter value held in the register 170A (e.g., the oldest one). For this reason, if the number of simultaneously used write destination blocks is larger than the number of write parameter sets which can be held and if the write destination blocks are frequently changed, the write parameter held in the register 170A is overwritten, the "programming with tuned parameter" may not be executed, and the "programming for parameter tuning" needs to be executed again. Even in a case where the register 170A can hold only one set of write parameter values, when writing the user data in the block BLK0, the "programming with tuned parameter" may be executed by executing the "programming for parameter tuning" for the first word line, holding the write parameter value in the register 170A, and using the write parameter value held in the register 170A for the rest of word lines of the block BLK0. After that, however, when the data is written to another block, for example, the block BLK1 by, for example, the garbage collection, the "programming for parameter tuning" for the block BLK1 is required to be executed. Furthermore, after that, the "programming for parameter tuning" is required to be executed again when writing the user data again to the block BLK0. An average program time increases by execution of the "programming for parameter tuning".

A case may be assumed where a plurality of write parameter sets is held in the register 170A and the flash memory 100 (for example, the sequencer 170) alone controls the smart verify operations described above. In this case, it may be difficult for the sequencer 170 to execute such a complicated control as determination shown in FIG. 7C and FIG. 7D, due to limited area and cost as a peripheral circuit of the flash memory 100. For this reason, when the write destination block is changed, even when two sets of write parameter values are held in the register 170A, that is, even when there exists a set of write parameter value that can be applied to the changed write destination block, that existing set of write parameter values is not utilized and the "programming for parameter tuning" may be executed again.

With reference to a flowchart of FIG. 8, an example of the write operation wherein the write parameter value is held in the write parameter table of the RAM 220 of the controller 200 will be explained. The RAM 220 may store the write parameter values of all blocks as the write parameter tables.

In the data write operation (including user data write executed in response to the command received from the host 300 and data write executed by the garbage collection), the controller 200 determines, in step S32, whether the write destination block has been changed from the last write or not, based on the write destination block address. If the determination result is NO (i.e., the write destination block has not been changed), the controller 200 instructs, in step S34, the flash memory chip 100 to execute the "programming with tuned parameter" using the write parameter value held in the register 170A as the initial value of the program voltage. If the determination result in step S32 is YES (i.e., the write destination block has been changed), the controller 200 determines, in step S38, whether the write parameter value of the changed write destination block is held in the write parameter table or not.

If the determination result in step S38 is YES (i.e., the write parameter value of the changed write destination block is held in the write parameter table), the controller 200 obtains, in step S39, the write parameter value of the changed write destination block from the write parameter table and the controller 200 sets, in step S40, the write parameter value into the register 170A of the flash memory chip 100 by using, for example, Set Feature command. After that, the controller 200 instructs, in step S34, the flash memory 100 to execute the "programming with tuned parameter" using the write parameter held in the register 170A as the initial value of the program voltage.

If the determination result in step S38 is NO (i.e., the write parameter value of the changed write destination block is not held in the write parameter table), the controller 200 instructs, in step S42, the flash memory chip 100 to execute the "programming for parameter tuning". After the "programming for parameter tuning" is executed and the program voltage obtained when the upper portion of the threshold voltage distribution of the memory cell transistors exceeds the smart verify reference voltage held in the register 170A as the write parameter value, the controller 200 gets, in step S43, the write parameter value from the register 170A of the flash memory chip 100 by using, for example, Get Feature command and the controller 200 stores, in step S44, the write parameter value into the write parameter table of the RAM 220.

Thus, the controller 200 executes the "programming for parameter tuning" in the first write in the block and stores the write parameter value obtained as a result of the "programming for parameter tuning", in the write parameter table, for each block. Then, the controller 200 refers to the write parameter table in the subsequent write in the same block in the write in another block, obtains the write parameter value of the block from the table, and executes the "programming with tuned parameter" using the obtained write parameter value as the initial value of the program voltage, and the average program time is thereby reduced. In a case where the write parameter value is held only in the register 170A of the flash memory 100, not in the write parameter table in the RAM 220 of the controller 200, the average program time becomes longer when the write destination block is frequently changed.

[Controller 200]

Figure 10:
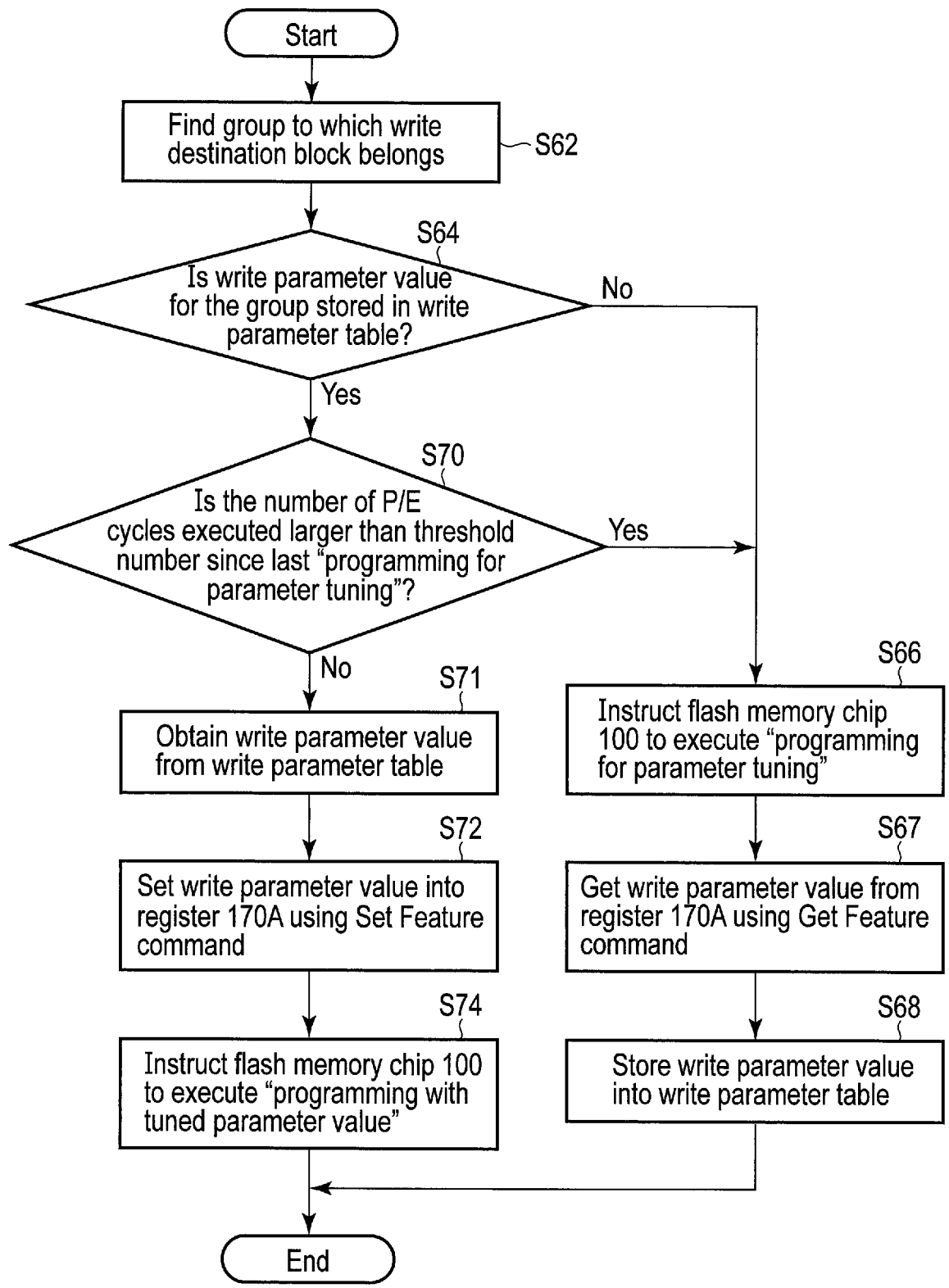
FIG. 10 is a flowchart showing an example of the write operation of the controller shown in FIG. 9.

The controller 200 gets the write parameter value from the register 170A of the flash memory chip 100 and stores the write parameter value into the write parameter table of the RAM 220 and, oppositely, obtains the write parameter value from the write parameter table of the RAM 220 and stores the write parameter value into the register 170A of the flash memory chip 100. FIG. 8 shows an example wherein the controller 200 sets (or stores) and gets (or obtains) the write parameter value by using the Set Feature command and the Get Feature command. FIG. 10 shows an example of setting (or storing) and getting (or obtaining) the write parameter value wherein the controller 200 executes the "programming for parameter tuning" by considering the change in the characteristic of the memory cell transistors.

Figure 8:
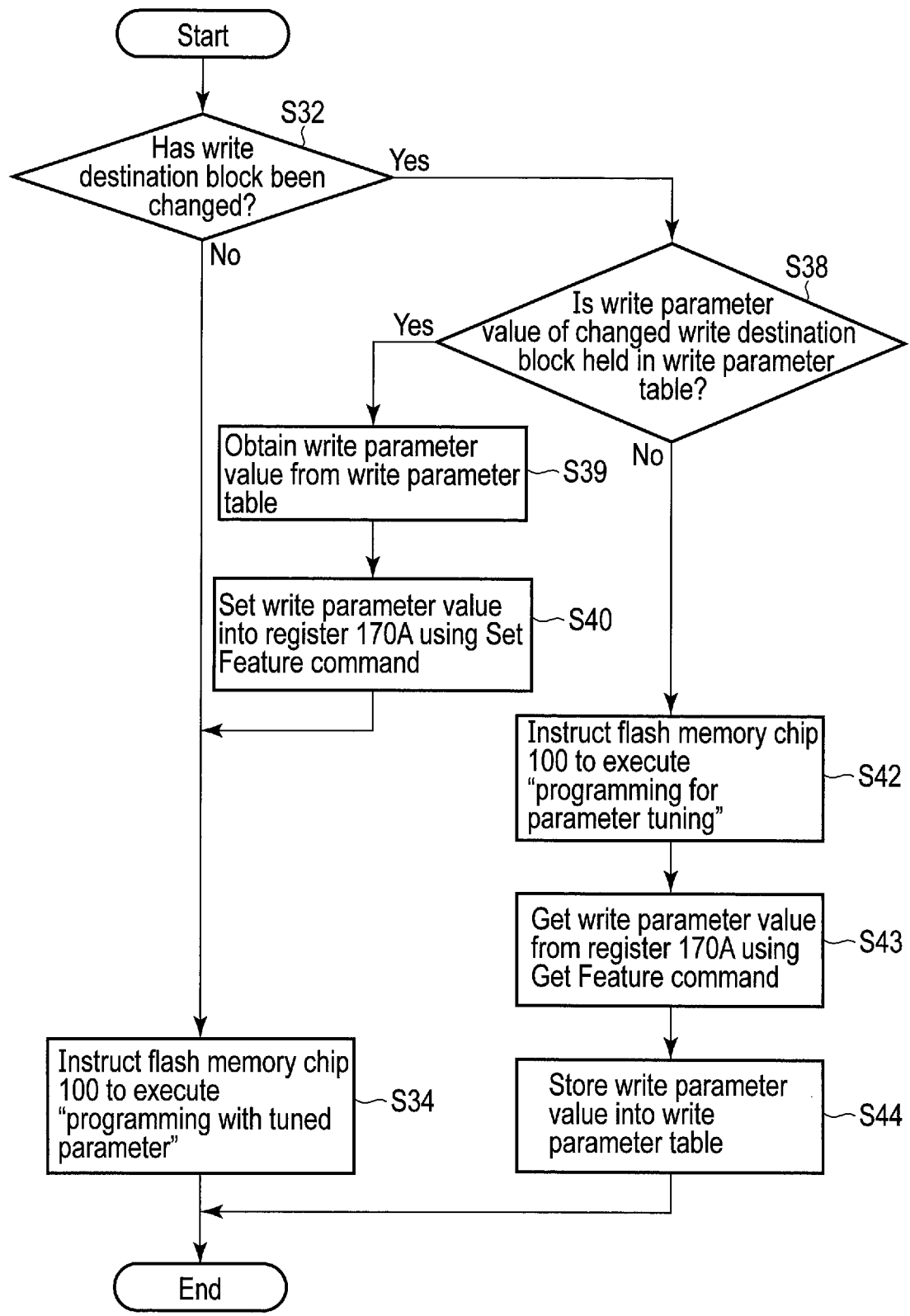
FIG. 8 is a flowchart showing an example of a write operation of the controller wherein the write parameter value is held in the controller.

The "programming for parameter tuning" is not executed when the write parameter value is stored in the write parameter table, in FIG. 8, but FIG. 10 shows an example of executing the "programming for parameter tuning" by considering the change in the characteristic of the memory cell transistors even when the write parameter value is stored in the write parameter table.

Figure 9:
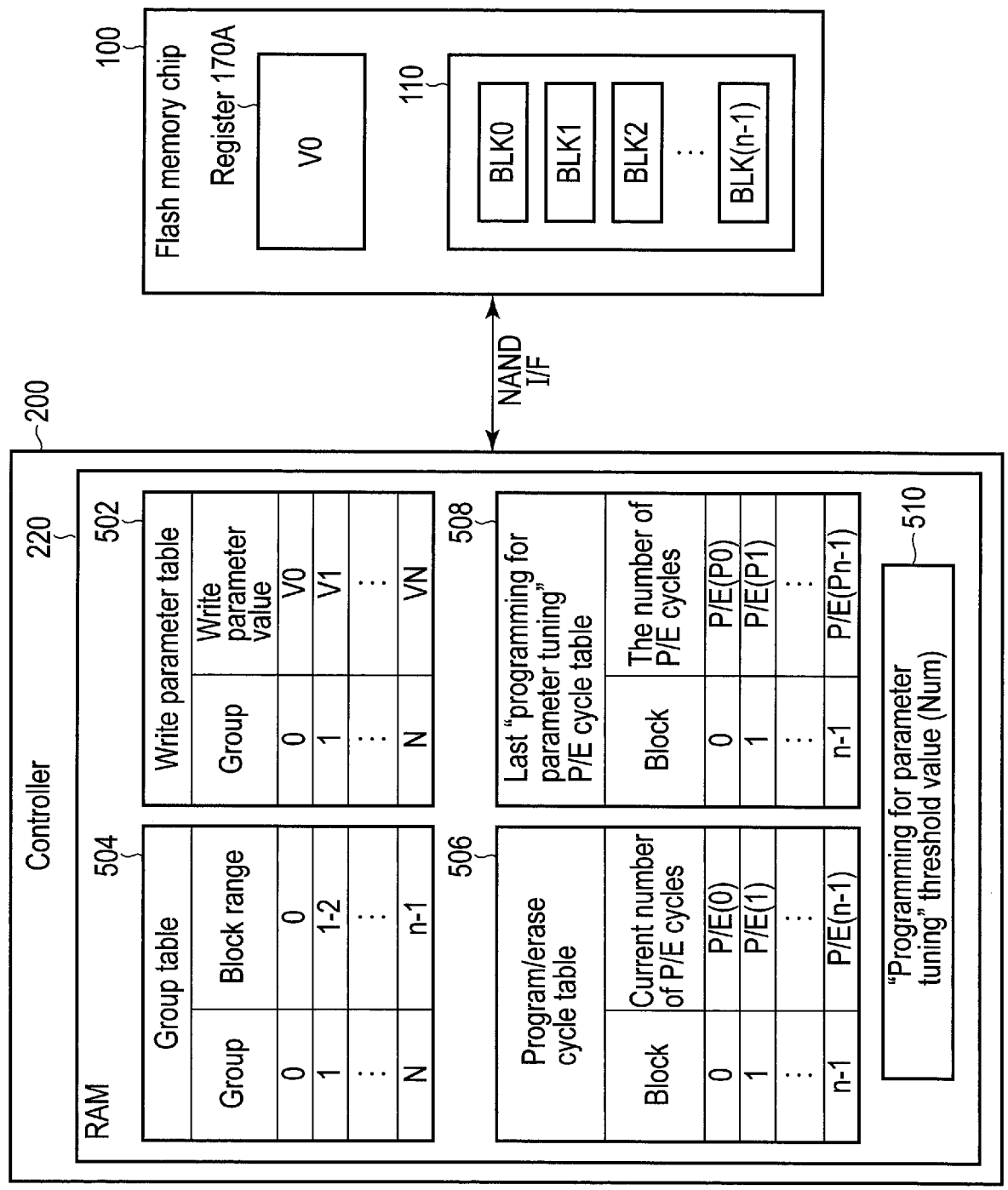
FIG. 9 is a block diagram showing an example of a system wherein the controller determines executing the "programming for parameter tuning" or the "programming with tuned parameter".

FIG. 9 is a block diagram showing the overall system of this example. FIG. 9 shows the details of FIG. 1 but the same elements as those shown in FIG. 1 are omitted. The memory cell 110 of the flash memory chip 100 includes a plurality of (n) blocks BLK0 to BLK(n–1) (where n is a natural number). Write parameter value V0 obtained by the "programming for parameter tuning" for the group of the memory cell transistors is stored in the register 170A. The configuration of the rest of the flash memory chip 100 is the same as that shown in FIG. 1.

The RAM 220 of the controller 200 stores various tables. For example, the RAM 220 stores a write parameter table 502, a group table 504, a program-and-erase cycle (P/E cycle) table 506, and a last "programming for parameter tuning" P/E cycle table 508. The RAM 220 also stores various data, for example, a "programming for parameter tuning" threshold value 510, hereinafter denoted by "Num". The write parameter table 502 holds a write parameter value for each group of elements which are expected to have similar write parameter values (e.g., the initial value of the program voltage) for achieving a desired program characteristic. An example of the group is a set of the blocks, the word lines, or the string units. Memory cell transistors connected to each word line may have different write parameter value (e.g., an initial value of the program voltage) for achieving the desired program characteristic and not same in a block, due to the difference in diameter of the memory hole. For this reason, an initial value may be defined for a set of the word lines. For convenience of explanations, however, in FIG. 9, it is assumed that memory cell transistors in a block have a same write parameter value for achieving the desired program characteristic, and a group is defined as a block or a set of blocks. Alternatively, sets of memory cell transistors of each string unit may have a different write parameter value for achieving the desired program characteristic from each other, and in this case, a group may be defined as a combination of a block address (range), a word line address (range), and a string unit address (range).

The group table 504 stores correspondences of group indices to block ranges to define a constitution of a group. For example, the group table 504 stores information defining elements that group #0 is composed of block #0, group #1 is composed of blocks #1 and #2, and the like. If the initial value of the program voltage relating to the desired write characteristic is different for each word line of the blocks, the group table 504 may define the group by a combination of block(s) and word lines. For example, the group table 504 may store information defining elements that group #0 is composed of word line #0 of block #0, group #1 is composed of word line #1 of block #0, group #2 is composed of word lines #2 to #31 of block #0, and the like. If the difference in characteristic between blocks is small, groups may be defined for each set of word lines and a group for a set of same word lines may be shared among different blocks.

Since the characteristic of the memory cell transistor may be changed as the number of P/E cycles increases, the elements of the group expected to have a similar initial value of the program voltage relating to the desired program characteristic may be changed as the number of P/E cycles increases. For example, the initial value of the program voltage relating to the desired program characteristic is lowered as the memory cell is worn. In contrast, if an excessively high program voltage is applied, the memory cell transistor may fall to a status called over-program wherein the memory cell may be programmed beyond a target threshold voltage range. The expected data cannot be read from this cell or the data of the memory cells connected to another word line of the same string in the same block cannot be read. For this reason, the group definition is not static but may be revised in accordance with the increase in the number of P/E cycles. Recomposing of the groups will be explained later.

The P/E cycle table 506 stores the current number of P/E cycles for each block. The last "programming for parameter tuning" P/E cycle table 508 stores the number of P/E cycles for each block at which the "programming for parameter tuning" is executed last. Since the initial value of the program voltage relating to the desired program characteristic of the memory cell transistors of a certain block may change in accordance with the number of P/E cycles, executing the "programming for parameter tuning" again is determined to be preferable if the difference between the current number of P/E cycles and the number of P/E cycles at which the "programming for parameter tuning" is executed last is more than or equal to a threshold number. The threshold value 510 is the threshold value Num of the number of P/E cycles for this determination.

FIG. 10 is a flowchart showing an example of the data write operation executed by the controller 200 configured as shown in FIG. 9. In the data write operation (including user data write executed in response to the command received from the host 300 and data write executed by the garbage collection), the controller 200 identifies, in step S62, the write destination block from the write destination block address, and finds the group to which the write destination block belongs by referring to the group table 504. The controller 200 determines whether the write operation for the group should be executed by the "programming for parameter tuning" or the "programming with tuned parameter". A condition for executing the "programming for parameter tuning" is that the write parameter value of the group is not stored in the write parameter table 502 or that P/E cycling has been executed in the number of times more than or equal to the threshold value Num after the execution of the last "programming for parameter tuning". The "programming with tuned parameter" is executed in a case other than this.

For this reason, the controller 200 determines, in step S64, whether the write parameter value of the write destination group is stored in the write parameter table 502 or not. If the determination result is NO (i.e., the write parameter value of the write destination group is not stored in the write parameter table 502), the controller 200 instructs, in step S66, the flash memory chip 100 to execute the "programming for parameter tuning". The flash memory chip 100 executes the "programming for parameter tuning" as shown in FIG. 6, and sets, into the register 170A as a write parameter value, the program voltage obtained when the upper portion of the threshold voltage distribution of the memory cell transistors exceeds the smart verify reference voltage. After the "programming for parameter tuning" has finished, the controller 200 gets, in step S67, the write parameter value from the register 170A of the flash memory chip 100 by using, for example, the Get Feature command and the controller 200 stores, in step S68, the write parameter value into the write parameter table 502. In other words, the write parameter value is output from the register 170A and input to the write parameter table 502 of the controller 200.

If the determination result in step S64 is YES (i.e., the write parameter value of the write destination group is stored in the write parameter table 502), in step S70, the controller 200 refers to i) the current number of P/E cycles in the P/E cycle table 506, ii) the number of P/E cycles at which the "programming for parameter tuning" is executed last in the last "programming for parameter tuning" P/E cycle table 508, and iii) the threshold value (Num) 510, and determines whether P/E cycling has been executed in the number of times more than or equal to the threshold value Num after the execution of the last "programming for parameter tuning" or not. More specifically, the controller 200 determines whether (the current number of P/E cycles–the number of P/E cycles at which the "programming for parameter tuning" is executed last) is more than or equal to the threshold value Num. If the determination result is YES (i.e., P/E cycling has been executed in the number of times more than or equal to the threshold value Num after the execution of the last "programming for parameter tuning"), the controller 200 instructs, in step S66, the flash memory chip 100 to execute the "programming for parameter tuning". If the determination result in step S70 is NO (i.e., P/E cycling has not been executed in the number of times more than or equal to the threshold value after the execution of the last "programming for parameter tuning"), it can be determined that the characteristic of the memory cell transistors have not changed, and the controller 200 obtains, in step S71, the write parameter value from the write parameter table 502 and the controller 200 sets, in step S72, the write parameter value in the register 170A of the flash memory chip 100 by using, for example, the Set Feature command. In other words, the write parameter value is output from the write parameter table 502 of the controller 200 and input to the register 170A. The controller 200 instructs, in step S74, the flash memory chip 100 to execute the "programming with tuned parameter".

In this embodiment, since the tables are stored in the RAM 220, which is volatile, the table contents are lost upon a power interrupt of the memory system. For this reason, the "programming for parameter tuning" may be executed once for all of the groups at power-on of the memory system. To make the execution of the "programming for parameter tuning" at power-on of the memory system unnecessary, the tables may be stored in a nonvolatile memory. For example, the tables in the RAM 220 may be written to a part of the memory cell array 110 of the flash memory chip 100 before power-off of the memory system. Alternatively, a nonvolatile memory may be provided in the controller 200 and the table in the RAM 220 may be written to the nonvolatile memory before power-off of the memory system.

Figure 11:
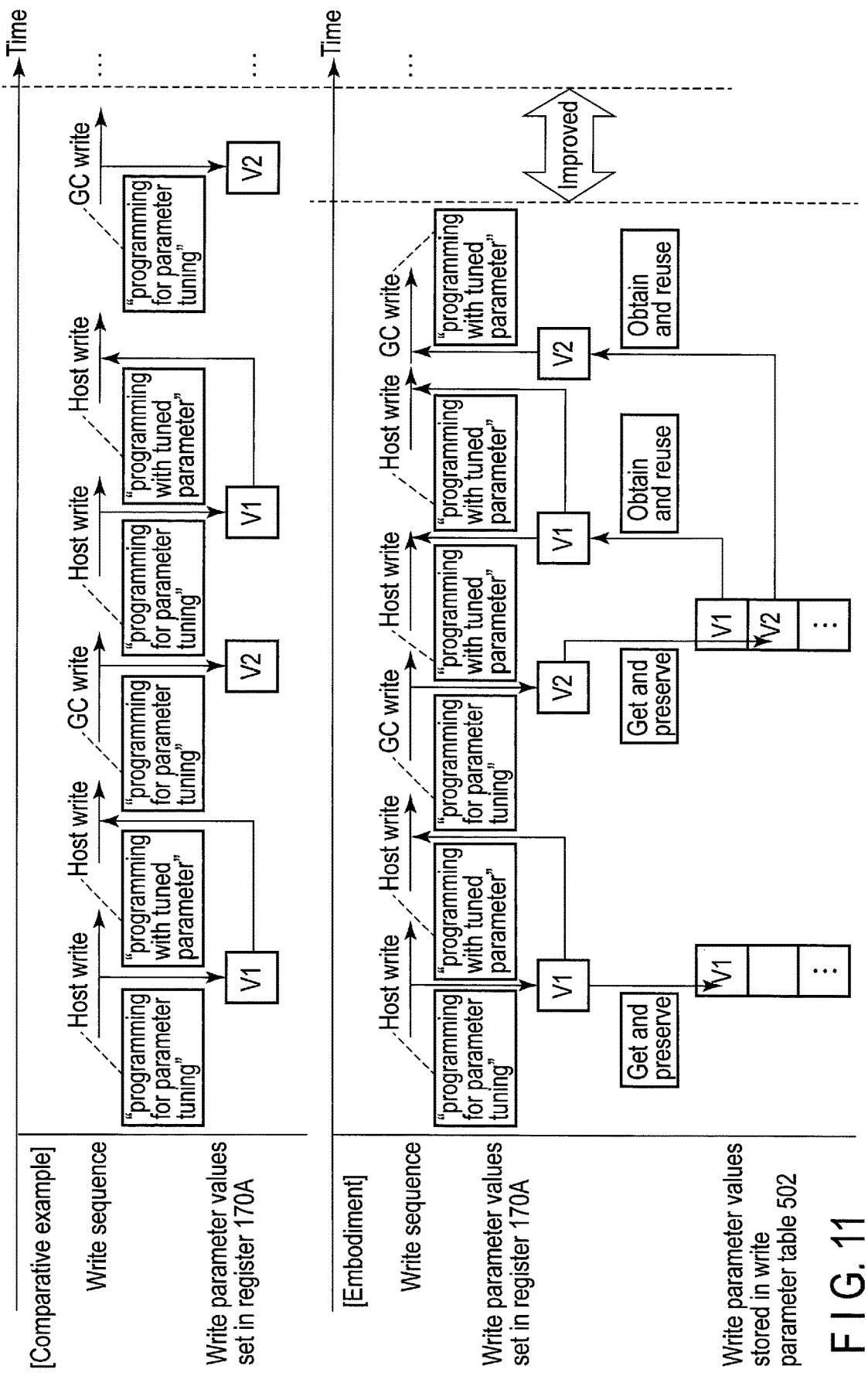
FIG. 11 shows the write operation shown in FIG. 10 in comparison with a comparative example.

FIG. 11 shows a comparison between the write operation of a comparative example and the write operation executed as shown in FIG. 8. On the right side of "write sequence", "Host write" indicates the user data writing in response to the command received from the host 300 and "GC write" indicates the data writing by the garbage collection. The comparative example shown in the upper row of FIG. 11 shows a case where the write parameter table is not provided in the controller 200, and only one write parameter set is held in the register 170A, the controller 200 does not control the "programming for parameter tuning", and the flash memory chip 100 alone controls the "programming for parameter tuning".

In the comparative example, when the user data write destination is group #1, the "programming for parameter tuning" is executed for the first word line of group #1 and obtained write parameter value V1 is set in the register 170A. The "programming with tuned parameter" is executed for other word lines of group #1. After that, the garbage collection is executed and, when the write destination of the garbage collection data is group #2, the "programming for parameter tuning" is executed for the first word line of group #2 and obtained write parameter V2 is set in the register 170A.

When the garbage collection has ended and the write of the user data to the group #1 is executed again, the "programming for parameter tuning" is executed in a first write process of the group #1 in a sequence of host write processes after coming back from another kind of a write process since the write parameter value held in the register 170A is the write parameter value V2 of the group #2 by the garbage collection. The obtained write parameter value V1 is set in the register 170A. The "programming with tuned parameter" is executed for other word lines of group #1. After that, the garbage collection is executed and, when the write destination of the garbage collection data is group #2, the "programming for parameter tuning" is executed again and the obtained write parameter value V2 is set in the register 170A.

Thus, in the comparative example, the "programming for parameter tuning" is executed when the write destination group is changed.

In contrast, in the write operation shown in FIG. 8 as illustrated in the lower row of FIG. 11, the "programming for parameter tuning" is executed once for the group #1 and, when the write parameter value V1 is held in the register 170A, the controller 200 gets the write parameter value V1 from the register 170A of the flash memory chip 100 and preserves the write parameter value V1 in the write parameter table 502 of the controller 200. After that, the garbage collection is executed and, when the write destination of the garbage collection data is group #2, the "programming for parameter tuning" is executed again and the obtained write parameter value V2 is set in the register 170A. The controller 200 gets the write parameter value V2 from the register 170A of the flash memory chip 100 and preserves the write parameter value V2 in the write parameter table 502 of the controller 200.

After that, when the garbage collection has ended and the write of the user data to the group #1 is executed again, the write parameter value held in the register 170A is the write parameter value V2 of the group #2 by the garbage collection. Since the write parameter value V1 of the group #1 is stored in the write parameter table 502 of the controller 200, the controller 200 obtains the write parameter value V1 from the write parameter table 502 of the controller 200 and sets the write parameter value V1 into the register 170A of the flash memory chip 100. The write operation of the user data to the group #1 is executed as the "programming with tuned parameter" reusing the write parameter value V1 of the group #1 held in the register 170A as the initial value of the program voltage. When the user data write operation executed in response to the command received from the host 300 has ended and the data write operation is executed again by the garbage collection, the write parameter value is obtained from the write parameter table 502 of the controller 200 and sets the write parameter value in the register 170A of the flash memory chip 100. Thus, the data write operation is executed as the "programming with tuned parameter".

For this reason, in the write operation shown in FIG. 8, the frequency of execution of the "programming for parameter tuning" is lower than that in the comparative example. Since the controller 200 explicitly controls the execution of "programming for parameter tuning" and "programming with tuned parameter" and sets (stores) and gets (obtains) the write parameter value, the frequency of the "programming for parameter tuning" can be reduced and the average program run time can be reduced by the controller 200. Furthermore, in the write operation shown in FIG. 10, the "programming for parameter tuning" is executed again when P/E cycling has been executed in the number of times more than or equal to the threshold value Num after execution of the last "programming for parameter tuning". For this reason, the reliability is improved even when the characteristic of the memory cell transistors has changed.

[Command Sequence Example]

An example of the command sequence used in the write operation shown in FIG. 8 will be explained. As explained above, there are various methods for writing data to the memory cell transistors that are capable of storing data of plural bits.

Figure 12:
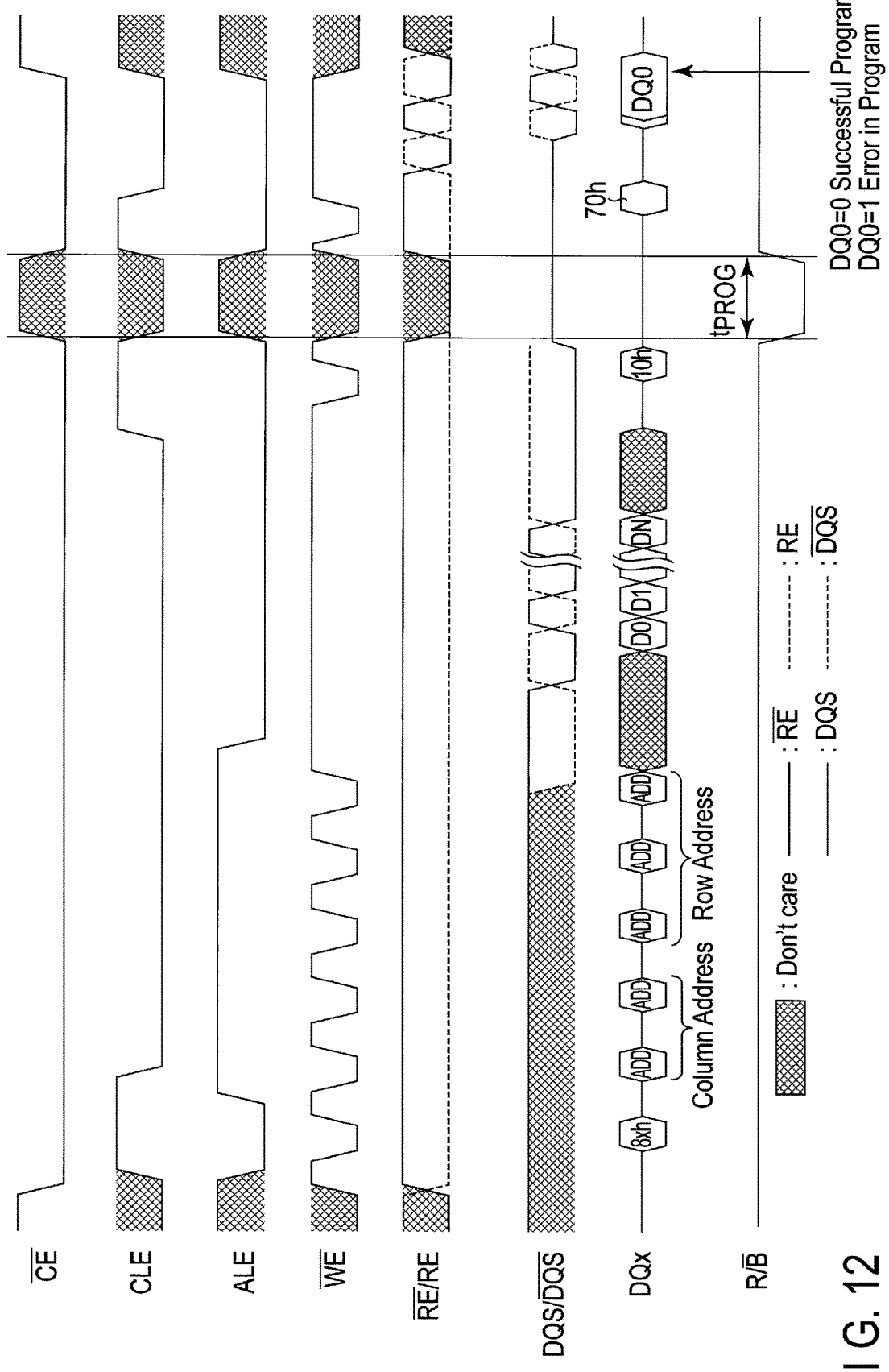
FIG. 12 is a timing chart showing an example of a command sequence indicative of the "programming for parameter tuning".

FIG. 12 is a timing chart showing an example of a page program command sequence for the controller 200 instructing the flash memory chip 100 to execute the "programming for parameter tuning" as described in step S66 in FIG. 10. Each signal is represented by either of a high-active (positive logic) signal and a low-active (negative logic) signal, or represented by a complementary signal of the positive logic signal and the negative logic signal. The low-active signal is represented by attaching an over line (or an upper line) with a signal indicating the signal in FIG. 12, or the like but, in the present specification, the low-active signal is represented by attaching "n" after the signal name for convenience of explanations.

When the host 300 issues a write command to the controller 200, the controller 200 controls the NAND interface (I/F) as shown in FIG. 12 in order to write data into a flash memory chip 100. A chip enable signal CEn is activated, a command latch enable signal CLE is activated, an address latch enable signal ALE is deactivated, and a read enable signal REn/RE which is the complementary signal is deactivated. A write enable signal WEn is activated, and "8xh" is fetched in the flash memory chip 100 as the "programming for parameter tuning" command via an I/O signal DQx. The I/O signal is composed of signals of plural bits, for example, DQ0 to DQ7, and the plural bits are wholly denoted as the I/O signal DQx. The command latch enable signal CLE is deactivated, the address latch enable signal ALE is activated, and a column address and a row address of the write destination are fetched in the flash memory chip 100 via the I/O signal DQx in synchronization with the activation of the write enable signal WEn. After that, the address latch enable signal ALE is deactivated, and write data D0, D1, . . . , DN are fetched in the flash memory chip 100 in synchronization of toggle of data strobe signal DQS/DQSn.

After the data transmission, internal chip program start command "10h" is transmitted to the flash memory chip 100 by the I/O signal DQx and the data write is started. In write period $t_{PROG}$, ready/busy signal (R/Bn) is set to be busy.

After that, Status Read command "70h" is transmitted to the flash memory chip 100 via the I/O signal DQx and it is determined whether the program succeeds or fails by, for example, the I/O signal DQ0. The program may be determined to have been succeeded when the I/O signal DQ0 is "0", and the program may be determined to have failed when the I/O signal DQ0 is "1".

The number indicative of the command is a mere example and the command is not limited to this number, similarly to the figures explained below.

Figure 13:
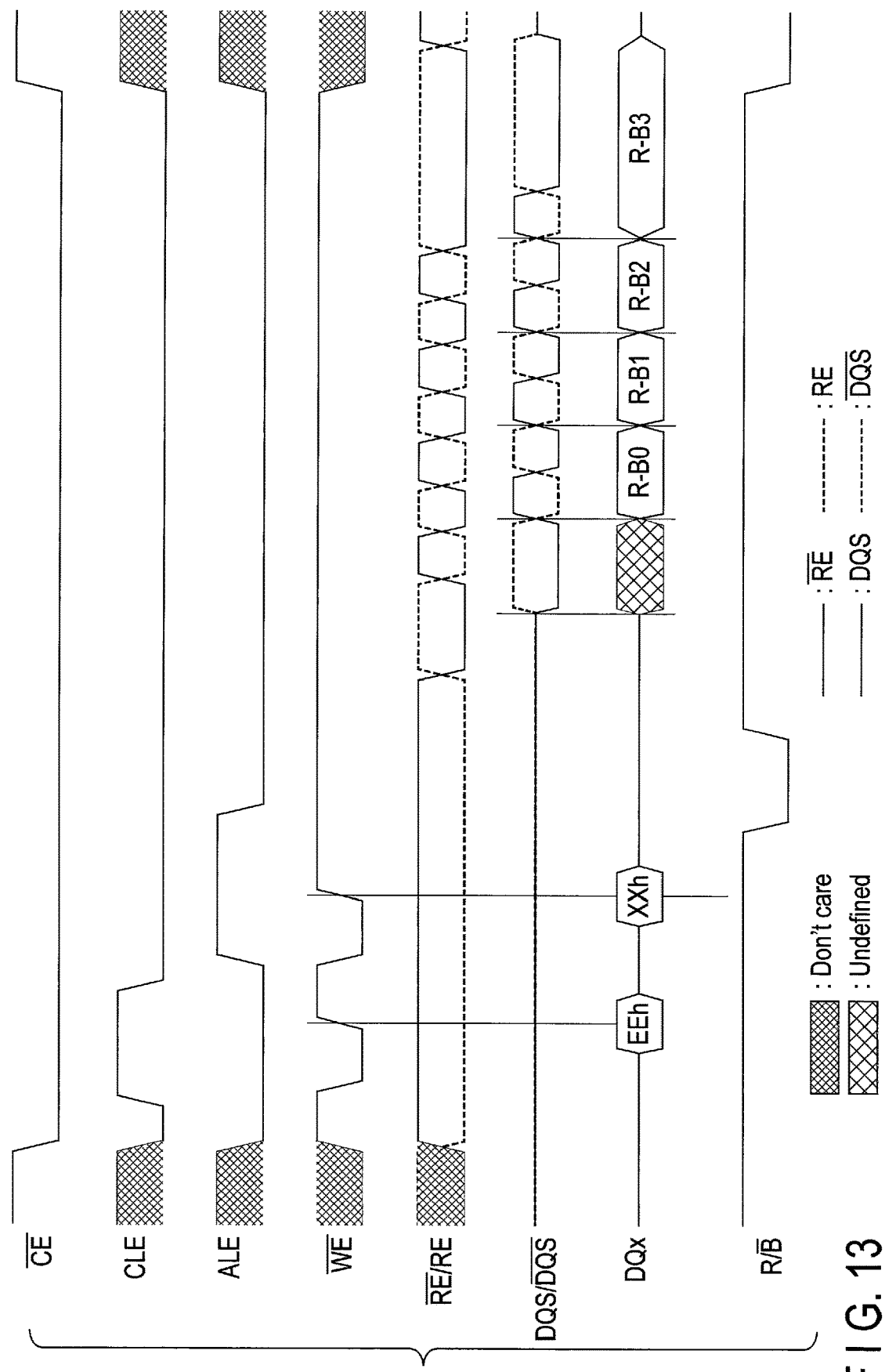
FIG. 13 is a timing chart showing an example of a Get Feature command sequence for getting the write parameter value from the register at the "programming for parameter tuning".

FIG. 13 is a timing chart showing an example of the Get Feature command sequence for the controller 200 getting the write parameter value from the register 170A of the flash memory chip 100 as described in step S67 in FIG. 10.

The chip enable signal CEn is activated, and the command latch enable signal CLE, the address latch enable signal ALE, the write enable signal WEn, and the read enable signal REn/RE are deactivated. After that, the command latch enable signal CLE and the write enable signal WEn are activated, and "EEh" is transmitted via the I/O signal DQx. "EEh" of the I/O signal DQx is fetched in the flash memory chip 100 as a command in synchronization with the rise of the write enable signal WEn. The command "EEh" indicates a command for starting the Get Feature sequence. The Get Feature sequence gets data R-B0, R-B1, R-B2, and R-B3 from address "XXh" of the register 170A. The write parameter value is assumed to be held in the register 170A of the address "XXh".

The command latch enable signal CLE is deactivated, the address latch enable signal ALE and the write enable signal WEn are activated, and "XXh" is transmitted via the I/O signal DQx. "XXh" of the I/O signal DQx is fetched in the flash memory chip 100 as an address in synchronization with the rise of the write enable signal WEn. After that, the address latch enable signal ALE is deactivated, and R-B0, R-B1, R-B2, and R-B3 are transmitted to the controller 200 via the I/O signal DQx. The flash memory chip 100 toggles the data strobe signal DQS/DQSn in response to the controller 200 toggling the read enable signal REn/RE, and R-B0, R-B1, R-B2, and R-B3 of the I/O signal DQx are fetched as the data in synchronization of the toggle of the data strobe signal DQS/DQSn. The fetched data is stored in the write parameter table 502. Thus, the write parameter value is got from the register 170A by the Get Feature sequence and stored in the controller 200.

Figure 14:
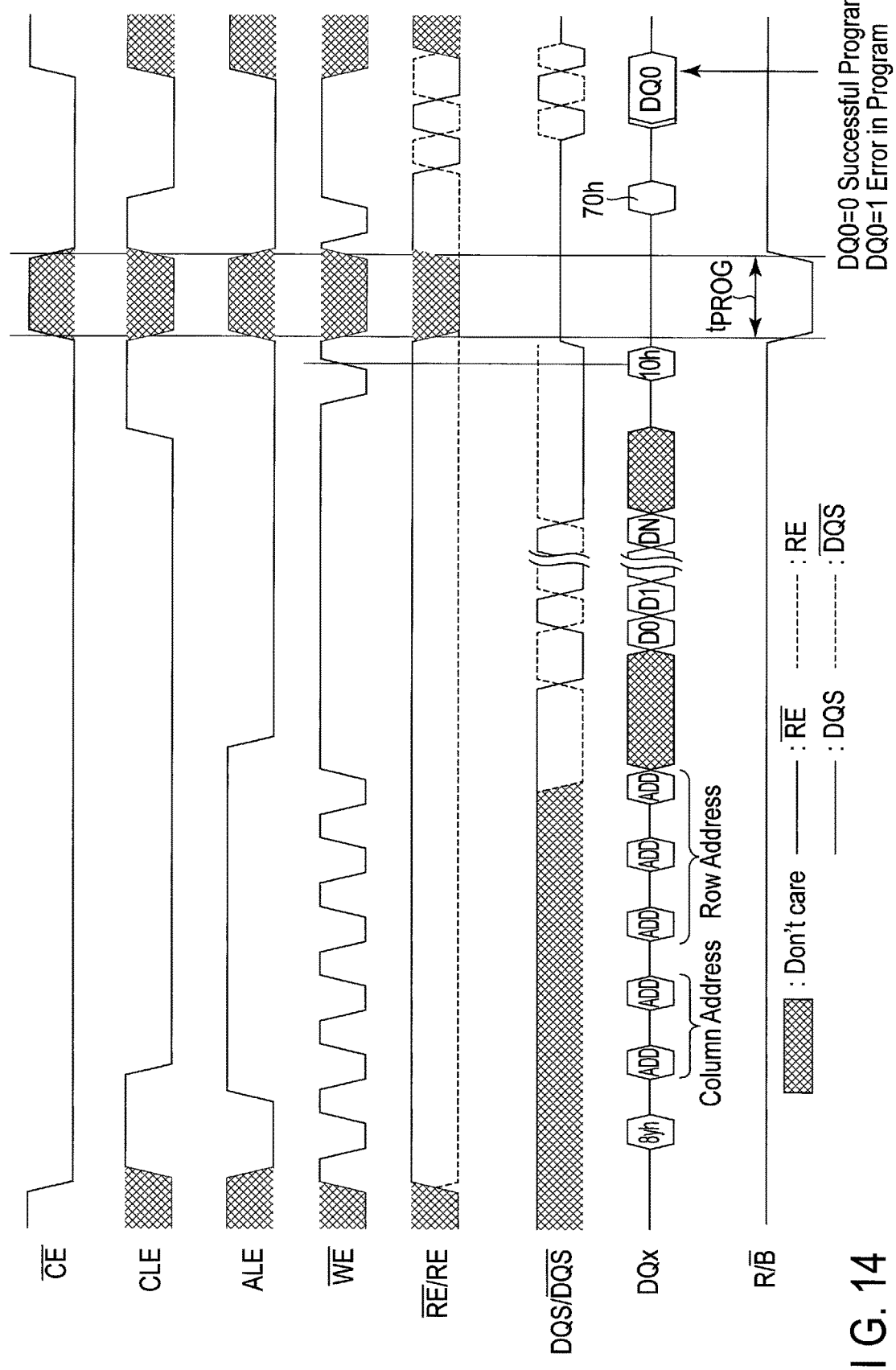
FIG. 14 is a timing chart showing an example of a command sequence indicative of the "programming with tuned parameter".

FIG. 14 is a timing chart showing an example of a page program command sequence for the controller 200 instructing the flash memory chip 100 to execute the "programming with tuned parameter" as described in step S74 in FIG. 10. The timing chart shown in FIG. 14 is different from the timing chart of the "programming for parameter tuning" shown in FIG. 12 in that the "programming for parameter tuning" command "8xh" is changed to the "programming with tuned parameter" command "8yh", and the same with respect to the other features.

Figure 15:
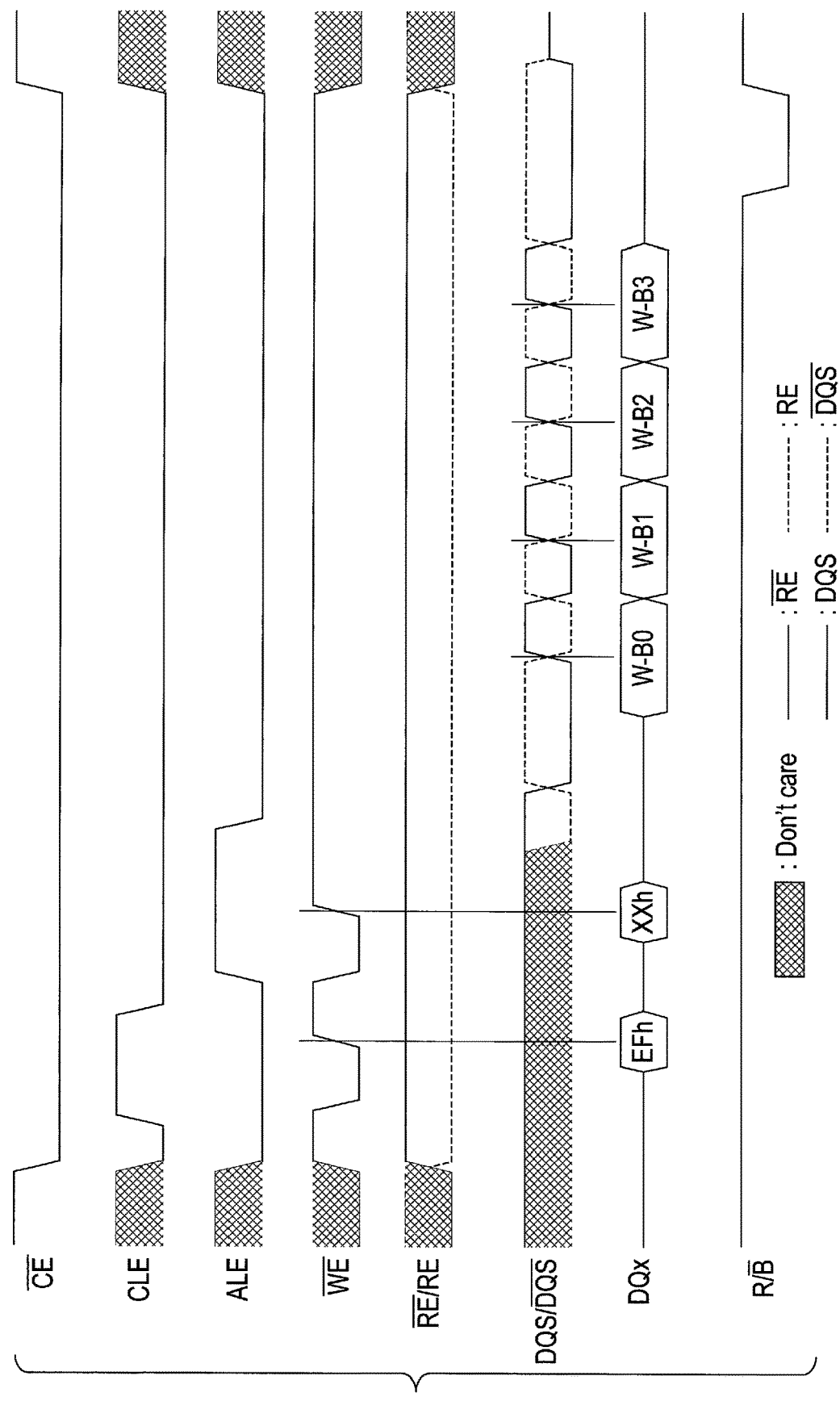
FIG. 15 is a timing chart showing an example of a Set Feature command sequence for setting the write parameter value into the register at the "programming with tuned parameter".

FIG. 15 is a timing chart showing an example of the Set Feature command sequence for the controller 200 storing the write parameter obtained from the RAM 220 of the controller 200 into the register 170A of the flash memory chip 100 as described in step S72 in FIG. 10.

The chip enable signal CEn is activated, and the command latch enable signal CLE, the address latch enable signal ALE, the write enable signal WEn, and the read enable signal REn/RE are deactivated. After that, the command latch enable signal CLE and the write enable signal WEn are activated, and "EFh" is transmitted via the I/O signal DQx. "EFh" of the I/O signal DQx is fetched in the flash memory chip 100 as a command in synchronization with the rise of the write enable signal WEn. The command "EFh" indicates a command for starting the Set Feature sequence. The Set Feature sequence sets data W-B0, W-B1, W-B2, and W-B3 indicating the write parameter value held in the register 170A of the address "XXh" of the flash memory chip 100.

The command latch enable signal CLE is deactivated, the address latch enable signal ALE and the write enable signal WEn are activated, and "XXh" is transmitted via the I/O signal DQx. "XXh" of the I/O signal DQx is fetched in the flash memory chip 100 as an address in synchronization with the rise of the write enable signal WEn. After that, the address latch enable signal ALE is deactivated, and data W-B0, W-B1, W-B2, and W-B3 indicating the write parameter value are transmitted to the flash memory chip 100 via the I/O signal DQx. W-B0, W-B1, W-B2, and W-B3 of the I/O signal DQx are fetched in the flash memory chip 100 as data in synchronization of the data strobe signal DQS/DQSn, and the data W-B0, W-B1, W-B2, and W-B3 are set in the address "XXh" of the register 170A. Thus, the write parameter value of the register 170A is set in the register 170A by the Set Feature sequence.

Figure 16:
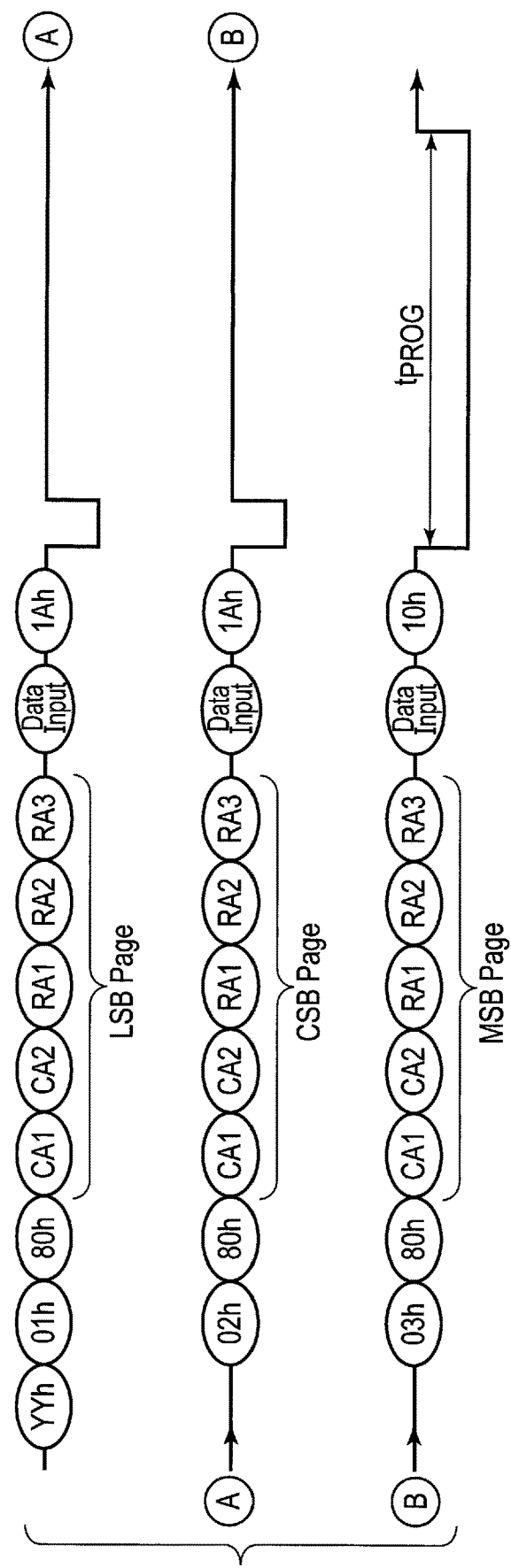
FIG. 16 shows an example of a command sequence for distinguishing the "programming for parameter tuning" from the "programming with tuned parameter" by a prefix command and appending information of the write parameter value after the prefix command.

Still other command sequences will be described. FIG. 12 and FIG. 14 show the "programming for parameter tuning"

sequence and the "programming with tuned parameter" sequence using the different commands, respectively, but a common command sequence may be employed both for the "programming for parameter tuning" and the "programming with tuned parameter", with a prefix command to indicate the "programming for parameter tuning" or the "programming with tuned parameter" as shown in FIG. 16. Further, FIG. 12 and FIG. 14 show the write operation of 1 bit of the plural bits written to the memory cell transistor, but the sequences shown in FIG. 12 and FIG. 14 may be repeated for the plural bits. If the plural bits are 3 bits, the sequences shown in FIG. 12 and FIG. 14 are repeated three times. Alternatively, the sequences shown in FIG. 12 and FIG. 14 may not be repeated for the plural bits, but the sequences may be distinguished by one command such that the sequence shown in FIG. 12 or FIG. 14 is executed once and a conventional program sequence is repeated twice. FIG. 16 shows states of the I/O signal DQx and the ready/busy signal R/Bn in 3-bit full sequence program, where all of 3 bits are programmed at once with one command. The first row, the second row, and the third row correspond to the write of the data of a low-order bit (LSB page), a middle-order bit (CSB page), and a high-order bit (MSB page), respectively. In a time-axis relationship, right end "A" in the first row is linked to left end "A" in the second row, and right end "B" in the second row is linked to left end "B" in the third row.

Prefix command "YYh" show in FIG. 16 indicates, for example, the "programming for parameter tuning" and another prefix command (not shown), for example, "YZh" denotes the "programming with tuned parameter". Thus, the "programming for parameter tuning" or the "programming with tuned parameter" may be indicated by the type of the prefix commands. Indicating the "programming for parameter tuning" or the "programming with write after detection" may be realized by the presence or the absence of the prefix commands, instead of using different types of prefix commands. Command "01h" indicating the LSB page is supplied subsequently with the prefix command "YYh" via the I/O signal DQx and then write command "80h" is supplied. The write command "80h" may be the same as the conventional write command. The write command "80h" corresponds to "8xh" in FIG. 12 and "8yh" in FIG. 14. Column addresses CA1 and CA2 and row addresses RA1, RA2, and RA3 are supplied subsequently with the write command "80h", similarly to the sequences shown in FIG. 12 and FIG. 14. The data input subsequent with the row address RA3 corresponds to the write data D0, D1, . . . , DN shown in FIG. 12 and FIG. 14.

Command "1Ah" after the input of the data of the LSB page is a command for writing the data to a register in the flash memory chip 100 (not shown). In the data write, ready/busy signal R/Bn is set to be busy.

After that, the write data of the CSB page and the MSB page are supplied, similarly to the case of the LSB page. Command "10h" after the input of the data of the MSB page is an internal chip program start command, and the full sequence programming is thereby started. In write period $t_{PROG}$, the ready/busy signal R/Bn is set to be busy.

Figure 17:
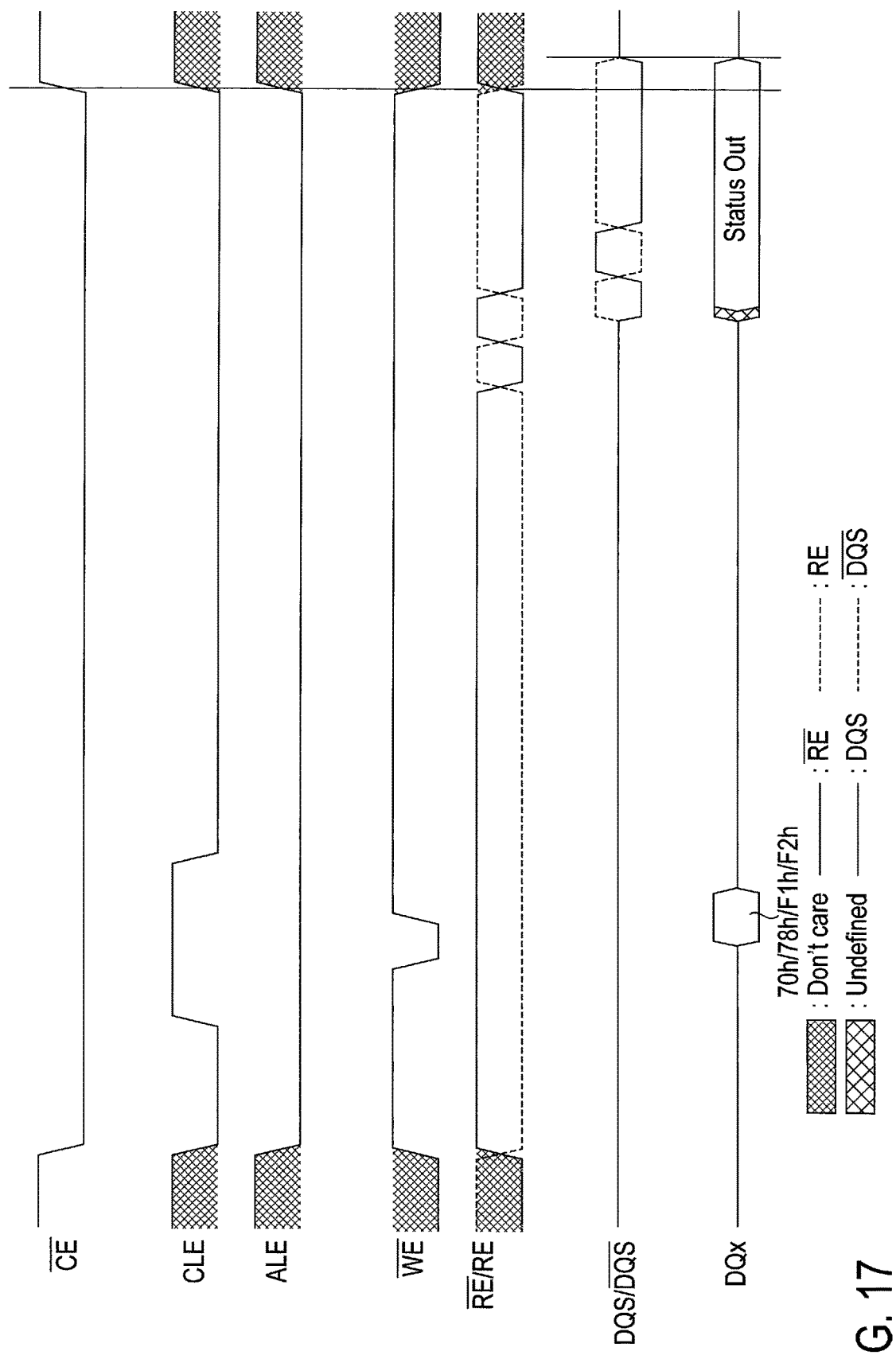
FIG. 17 is a timing chart showing an example of a Status Read command sequence for getting the write parameter value from the register at the "programming for parameter tuning".

FIG. 17 is a timing chart showing an example of the command sequence for the controller 200 getting the write parameter value from the register 170A of the flash memory chip 100 by using the Status Read command instead of the Get Feature command. The timing chart shown in FIG. 17 is different from the timing chart shown in FIG. 13 in that Status Read command "70h/78h/F1h/F2h" is transmitted instead of the Get Feature command "EEh" and the address "XXh" is not transmitted. Furthermore, the status is output instead of the read data shown in FIG. 13, in the timing chart shown in FIG. 17. An example of the status is 8-bit status data, and the write parameter value is indicated by using several bits of the status data.

The command sequence is not limited to these, but a similar command sequence may be used as the command sequence.

Next, a command sequence for writing the data of a plurality of bits to the memory cell transistor in multiple steps by a plurality of program commands will be explained. In the method of writing in multiple steps, the data are written to the memory cell transistor in multiple steps while selecting the word lines in moving forwards and backwards. There are two example approaches for executing the "programming for parameter tuning" in the method of writing in multiple steps. The first approach is executing the "programming for parameter tuning" and the "programming with tuned parameter" independently for each write step. That is, for each write step, the first approach maintains a write parameter table, executing the "programming for parameter tuning", storing the write parameter value into the table, and executing the "programming with tuned parameter" using the parameter value stored in the table. The second approach shares a write parameter value among the write steps. That is, second approach maintains a common write parameter table which is shared among the write steps, executing the "programming for parameter tuning" only in the first step of the write steps, storing the detected write parameter value into the table, and executing the "programming with tuned parameter" in another write step using the write parameter value stored in the table. In the "programming with tuned parameter" in said another write step, the write parameter value may be adjusted for said another write step, rather than using the raw value stored in the table. The "programming with tuned parameter" may be performed using the write parameter value stored in the table also in the first step of the write steps.

Figures 18A, 18B:
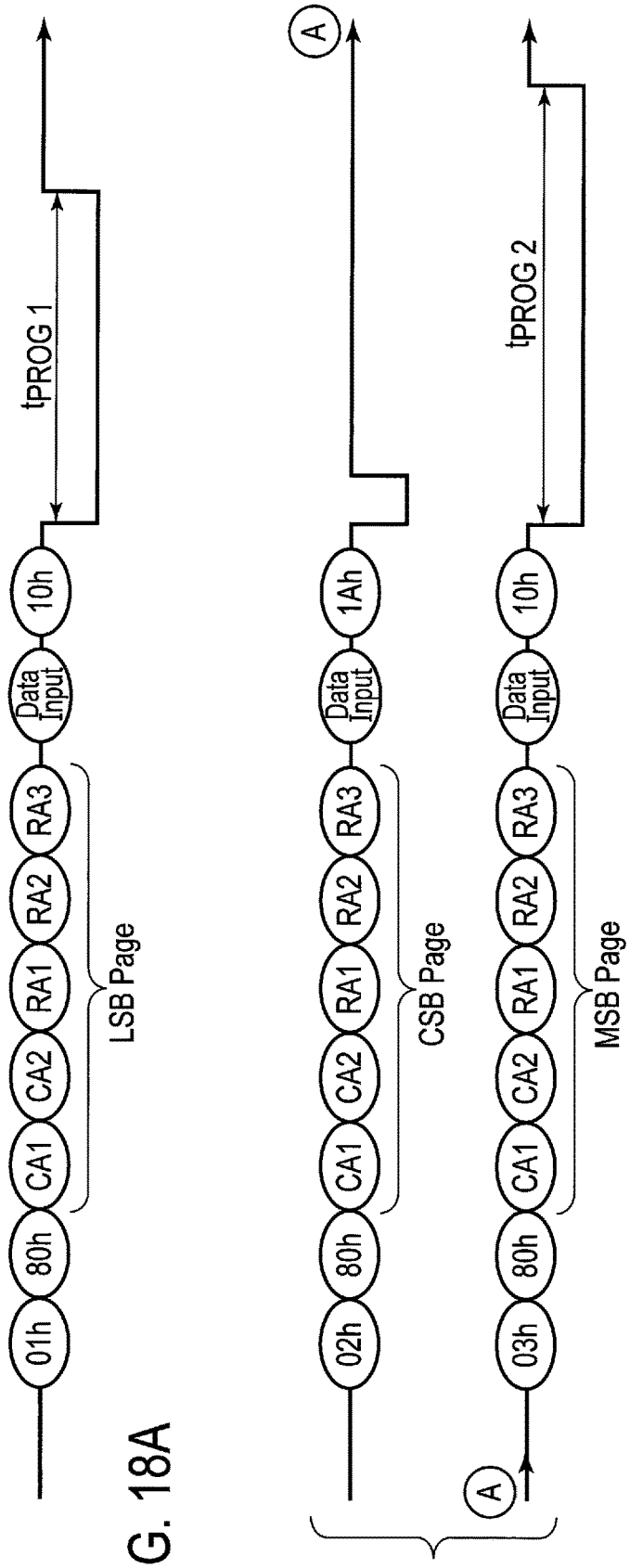
FIG. 18A and FIG. 18B show an example of a command sequence for writing data of three pages in two steps.

The methods of writing in multiple steps include a method wherein the write pages are different in steps and a method wherein accuracies are different in steps. FIG. 18A and FIG. 18B show a write command sequence for writing the data of three pages in two steps. FIG. 18A shows the sequence of the first step of writing the data of the LSB page, and FIG. 18B shows the sequence of the second step of collectively writing the data of the CSB and MSB pages. The write time of the data write in the first step is denoted by $t_{PROG1}$, and the write time of the write in the second step is denoted by $t_{PROG2}$. This sequence is similar to the sequence of the full sequence programming shown in FIG. 16 but is different with reference to features that the sequence includes no prefix commands and that the data write of the LSB page alone is also executed. The data are written while selecting the word lines in moving forwards and backwards such that the data of the LSB page is written to the word line #0 for the first-step, the data of the LSB page is written to the word line #1 for the first-step, the data of the CSB page and the MSB page are written to the word line #0 for the second-step, the data of the LSB page is written to the word line #3 for the first-step.

Also in the write of two steps, by executing the "programming with tuned parameter" using the result of the "programming for parameter tuning" the program time can be reduced. FIG. 19A shows a threshold voltage distribution after the first write step shown in FIG. 18A. Only the data of the LSB page is written in the first write step. The data including the data of the other pages are written in the second write step. FIG. 19B shows a threshold voltage distribution after the second write step shown in FIG. 18B. The first write step is different in threshold voltage distribution from the second write step. In the first write step and the second write step, the smart verify reference voltage is different from the program verify voltage and is, for example, a slightly lower voltage.

Figures 20A, 20B:
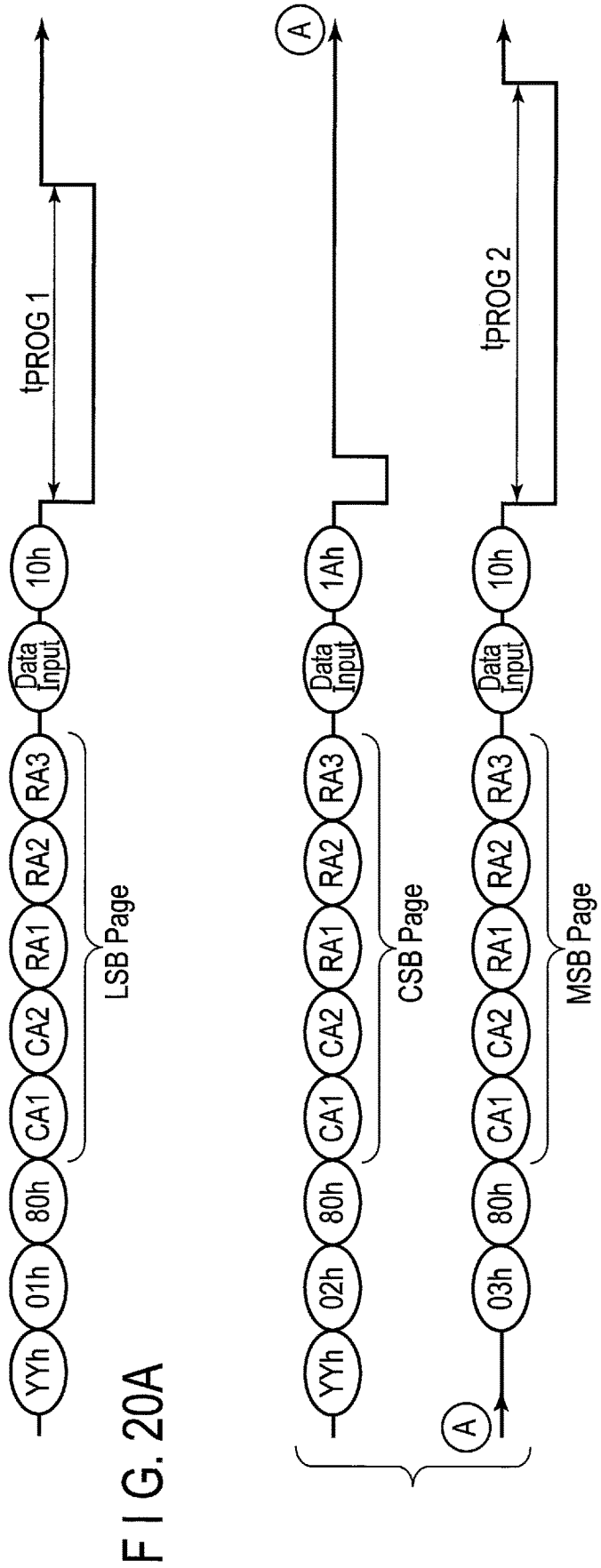
FIG. 20A and FIG. 20B show an example of a command sequence indicative of the "programming for parameter tuning" executed by a write method shown in FIG. 18A and FIG. 18B.

FIG. 20A and FIG. 20B show the command sequences of the first write step "programming for parameter tuning" and the second write step "programming for parameter tuning". Unlike FIG. 18A and FIG. 18B, the prefix command "YYh" indicating the "programming for parameter tuning" is input before the commands "01h" and "02h". The detection result is got from the register 170A by the Get Feature sequence as shown in FIG. 13 and stored in the write parameter table 502.

Figure 21A:
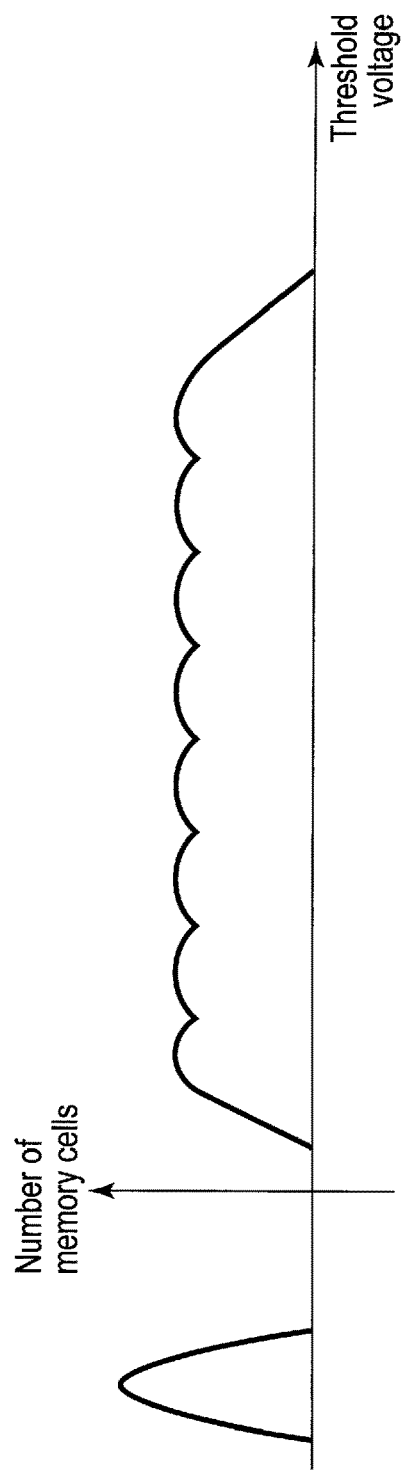
FIG. 21A and FIG. 21B show an example of a threshold voltage distribution after the write operation by another example of the two-step write command sequence.
Figure 21B:
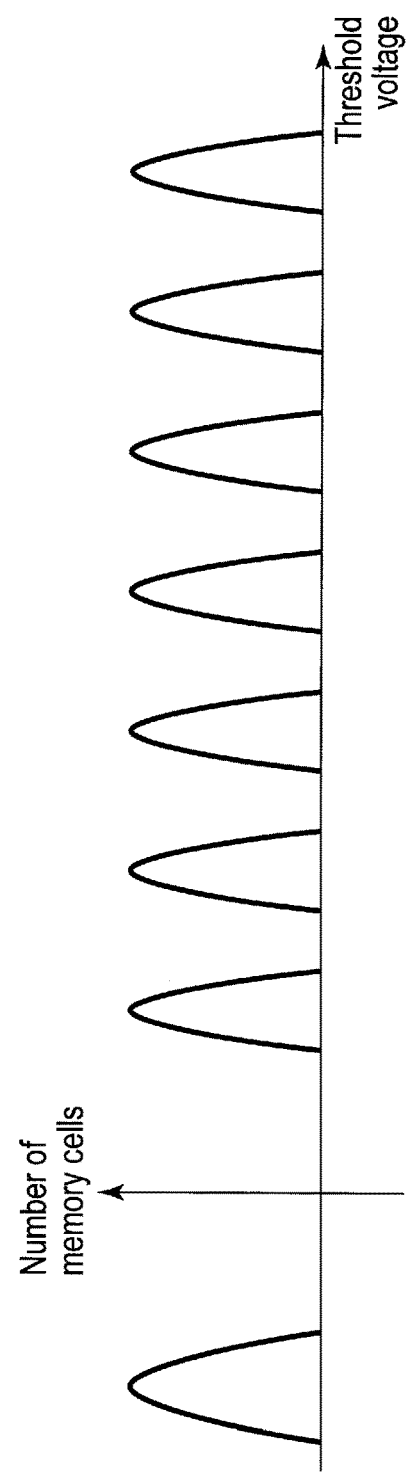

FIG. 21A and FIG. 21B show another example of multi-step write. In the examples shown in FIG. 18A and FIG. 18B (or FIG. 20A and FIG. 20B), pages of writing target are different in the first write step and the second write step. On the other hand, in the examples shown in FIG. 21A and FIG. 21B, accuracies of resulting threshold voltage distribution are different in the first write step and the second write step. In the first write step, a verify voltage lower than the verify voltage defined as shown in FIG. 5 is used, the threshold voltage distributions of the seven written states are overlapped with each other as shown in FIG. 21A, and a broad threshold voltage distribution can be obtained. In the second write step, the defined verify voltage is used and overlap of the threshold voltage distributions is not made as shown in FIG. 21B.

FIG. 22A shows the first write step sequence of the two-step write as shown in FIG. 21A and FIG. 21B, and FIG. 22B shows the sequence of the second write step of the two-step write as shown in FIG. 21A and FIG. 21B. The sequences shown in FIG. 22A and FIG. 22B are similar to the sequences shown in FIG. 16 but are different in that the prefix command "YYh" indicating the "programming for parameter tuning" is not included. In the example shown in FIG. 22A and FIG. 22B, the first write step and the second write step are common in command "80h" indicating the program, but different commands may be used for each step, instead. The same data is input from the host 300 as write data (Data input) in the first write step and the second write step.

FIG. 23A and FIG. 23B show the first write step sequence and the second write step sequence wherein the "programming for parameter tuning" is executed in the two-step write shown in FIG. 22A and FIG. 22B, respectively. The sequences shown in FIG. 23A and FIG. 23B are different from the sequences shown in FIG. 22A and FIG. 22B in that the prefix command "YYh" indicating the "programming for parameter tuning" is included. Similarly to the example shown in FIG. 16, the "programming for parameter tuning" and the "programming with tuned parameter" are distinguished in accordance with not only the type of the prefix command, but may be distinguished in accordance with the presence or absence of the prefix command. In the "programming for parameter tuning" shown in FIG. 23A and FIG. 23B, the write time $t_{PROG1}$ of the first write step is shorter than the write time $t_{PROG2}$ of the second write step. Furthermore, when the "programming for parameter tuning" and the "programming with tuned parameter" are distinguished by the prefix command, the write parameter may be transmitted to the flash memory chip 100 by adding information of the write parameter detected by the "programming for parameter tuning" after the prefix command indicating the "programming with tuned parameter".

[Reducing the Frequency of "Programming for Parameter Tuning"]

Since the "programming for parameter tuning" takes more time than the "programming with tuned parameter" as explained above, the average program time can be reduced by reducing the frequency of executing the "programming for parameter tuning". However, since the characteristic of the memory cell transistor gradually changes as the number of P/E cycles grows larger, it is desired to execute the "programming for parameter tuning" in an appropriate interval. For example, when the number of P/E cycles reaches a predetermined number, a request to execute the "programming for parameter tuning" and detect the initial value of the program voltage on the desired write characteristic will be made. It is known that the characteristic of the memory cell transistors connected to adjacent word lines are similar to each other. Furthermore, it is known that the characteristic of the memory cell transistors having the similar number of P/E cycles are similar to each other. Examples of measures for reducing the frequency of executing the "programming for parameter tuning" (or reducing the execution count of the "programming for parameter tuning") by the controller 200 instructing the "programming for parameter tuning" to be executed at appropriate timing, utilizing similarity in the characteristic of the memory cell transistors will be explained.

FIG. 24 shows a principle of a first measure example. In the first measure example, the adjacent word lines considered to have similar characteristic in the block are grouped. A block is assumed to be composed of 64 layers of word lines WLs. For example, word line WL0 is classified into group Gr0, word line WL1 is classified into group Gr1, word lines WL2 to WL31 are classified into group Gr2, word lines WL32 to WL61 are classified into group Gr3, word line WL62 is classified into group Gr4, and word line WL63 is classified into group Gr5. This group classification is executed in one block, and the group classification is similarly executed in other blocks as shown in FIG. 24. However, the number of groups and the number of word lines belonging to each group may be changed for each block. In a case where one block is composed of four string units Str0 to Str3 and the string units are written in order from string unit Str0 to string unit Str3 for each word line, the "programming for parameter tuning" is executed for the memory cell transistors connected to first string unit Str0 of the first word line first written in each group, and the "programming with tuned parameter" is executed for the remaining memory cell transistors in the group. In FIG. 24, the numbers represent the order of write, the write of the order represented by shading lines corresponds to the "programming for parameter tuning", and the numbers not covered with shading lines correspond to the "programming with tuned parameter".

As a comparative example, an example of executing the "programming for parameter tuning" of the memory cell transistors in all of the string units Str0 to Str3 connected to the first word lines (WL0 in group 0, WL1 in group 1, WL2 in group 2, WL32 in group 3, WL62 in group 4, and WL63 in group 5) to which the data are first written in the respective groups will be considered. In the example shown in FIG. 24, the "programming for parameter tuning" count is reduced to a reciprocal of the number of string units connected to the word lines, and the average program time is shortened as compared with the comparative example.

In the first measure example, the frequency of executing "programming for parameter tuning" is somewhat high since the "programming for parameter tuning" is executed in each P/E cycle. A second measure example of further reducing the frequency of executing the "programming for parameter tuning" as compared to the first measure example will be explained. The first measure example is spatially distributing the executions of the "programming for parameter tuning" over the word lines and/or the string units. The second measure example is temporally distributing the executions of the "programming for parameter tuning" over the P/E cycles. The word lines are grouped in the first measure example shown in FIG. 24 but the word lines may not be grouped in the second measure example shown in FIG. 25. FIG. 25 shows a principle of the second measure example wherein the word lines are not grouped and the same write parameter is used for all of the string units Str0 to Str3 of each word line. In a case where the word lines are not grouped, the "programming for parameter tuning" is executed for the first string unit Str0 of each word line and the "programming with tuned parameter" is executed for the string units Str1 to Str3 other than the first string unit Str0 of each word line.

In the second measure example, the "programming for parameter tuning" is not executed in each P/E cycle, but the "programming for parameter tuning" is executed in every several P/E cycles as shown in FIG. 25. It is known that the characteristic of a memory cell transistor in the flash memory chip 100 changes gradually over P/E cycling, and it is expected that the characteristic change is small for a small number of P/E cycles. For this reason, the detection result of certain "programming for parameter tuning" may be used as the initial value of the program voltage of another "programming with tuned parameter" as long as the number of P/E cycles after the detection is smaller than a certain value. In the second measure example, an average program time can be also shortened since the execution count of the "programming for parameter tuning" is reduced.

The "programming for parameter tuning" is executed for the string unit Str0 of each word line in the second measure example shown in FIG. 25. But, if the word lines are grouped in the second measure example, the "programming for parameter tuning" is executed for first string unit Str0 of the first word line to which the data is first written in each group. In other words, the "programming for parameter tuning" as shown in FIG. 24 is executed in N-th P/E cycle and (N+a)-th P/E cycle shown in FIG. 25.

In the second measure example shown in FIG. 25, since the "programming for parameter tuning" is executed for the first string unit Str0 of each word line in the P/E cycles at every "a" times, the average program time is long in a P/E cycle wherein the "programming for parameter tuning" is executed, the average program time is short in other P/E cycles, and the average program time changes between P/E cycles. A third measure example of making this change uniform will be explained with reference to FIG. 26. The "programming for parameter tuning" is executed for the string unit Str0 of all of the word lines in one P/E cycle in the second measure example shown in FIG. 25. In the third measure example shown in FIG. 26, on the other hand, the number of word lines where the "programming for parameter tuning" is executed in one P/E cycle is reduced so that the "programming for parameter tuning" is executed for the string unit Str0 of several word lines (one word line in the illustrated example) in each P/E cycle. For example, the "programming for parameter tuning" is executed for the string unit Str0 of word line WL0 in N-th P/E cycle, (N+b)-th P/E cycle, . . . , the "programming for parameter tuning" is executed for string unit Str0 of word line WL1 in (N+1)-th P/E cycle, (N+1+b)-th P/E cycle, . . . , the "pro-gramming for parameter tuning" is executed for string unit Str0 of word line WL2 in (N+2)-th P/E cycle, (N+2+b)-th P/E cycle, . . . . Similarly, the subsequent "programming for parameter tuning" is executed for string unit Str0 of one word line in each P/E cycle.

The third measure example shown in FIG. 26 may be modified so that the "programming for parameter tuning" is executed for all of the string units Str0 to Str3 of one word line in each P/E cycle.

A fourth measure example shown in FIG. 27 is a modification of the third measure example shown in FIG. 26 and indicates an example wherein adjacent word lines considered to have similar characteristic are grouped, as in the first measure example shown in FIG. 25. In other words, the fourth measure example shown in FIG. 27 is an example of dispersing executions of the "programming for parameter tuning" in one P/E cycle in the first measure example shown in FIG. 24 into a plurality of P/E cycles and hence the timings of the "programming for parameter tuning" is dispersed also with respect to the P/E cycles. By timely dispersing the "programming for parameter tuning" similarly to the third and fourth measure examples, a comparatively long program operation, i.e. the "programming for parameter tuning" is not executed consecutively at plural times in a short time of one P/E cycle, and the write performance (for example, the moving average of write performance within one second window) of the memory system 1 can be stabilized.

[Determination of Timing of Executing "Programming for Parameter Tuning"]

The example of reducing the count of execution of the "programming for parameter tuning" by executing the "programming for parameter tuning" with a certain interval has been explained with reference to FIG. 26 and FIG. 27. An example wherein the controller 200 determines the timing of the "programming for parameter tuning" will be explained below.

FIGS. 28A to 28E and FIGS. 29A and 29B show tables necessary for this control, which are stored in the RAM 220. Also in this case, the memory cell transistors considered to have similar characteristic are grouped and the "programming for parameter tuning" is executed for each group. In a case where the characteristic of the memory cell transistors is different from each other depending on the word lines connected to the transistors, the groups are defined based on the word lines. The tables for certain blocks are illustrated for convenience, but the illustrated tables may be provided independently for each block. Furthermore, the memory cell transistors may be grouped more finely than the word lines, based on combination of the word lines and the string units. But the characteristic of memory cell transistors in different string units is assumed to be the same for convenience of explanations.

Figures 28A, 28B, 28C, 28D, 28E:
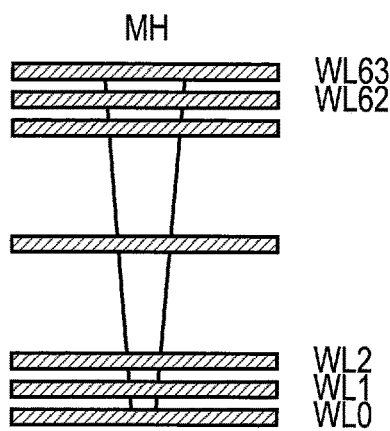
FIG. 28A, FIG. 28B, FIG. 28C, FIG. 28D, and FIG. 28E show examples of tables necessary for the "programming for parameter tuning" shown in FIG. 24 to FIG. 27.

FIG. 28A shows an example of a stacked layer structure of the word lines. Sixty-four word lines WL0 to WL63 are stacked in order from the lower side. For example, the diameter of the memory hole MH is large in the upper layer area but may become smaller toward the lower layer area. The memory cell transistors connected to the word lines WL0 and WL1 in the lower layer area and the memory cell transistors connected to the word lines near the central portion may be different in characteristic and are classified in different groups. Similarly, the memory cell transistors connected to the word lines WL63 and WL62 in the upper layer area and the memory cell transistors connected to the word lines near the central portion may be different in characteristic and are classified in different groups. Since the memory cell transistors connected to the word lines near the central portion are similar in characteristic, the memory cell transistors may be classified in one group or several groups.

FIG. 28B shows a group table indicating correspondences of group indices to word line ranges included in the groups. This table corresponds to the group table 504 shown in FIG. 9 (here, groups are defined by blocks). The group table indicates that, for example, group 0 is composed of word line WL0, group 1 is composed of word line WL1, group 2 is composed of word lines WL2 to WL31, group 3 is composed of word lines WL32 to WL61, group 4 is composed of word line WL62, group 5 is composed of word line WL63.

FIG. 28C shows an update interval table indicating correspondences of group indices to update intervals (the number of P/E cycles) set in the groups. The update interval is an interval (or frequency) of executing the "programming for parameter tuning", and is indicated by the number of P/E cycles. The update interval table indicates that, for example, the "programming for parameter tuning" for group #0 should be executed once in 100 P/E cycles, the "programming for parameter tuning" for group #1 should be executed once in 300 P/E cycles, the "programming for parameter tuning" for group #2 should be executed once in 1000 P/E cycles, the "programming for parameter tuning" for group #3 should be executed once in 1000 P/E cycles, the "programming for parameter tuning" for group #4 should be executed once in 300 P/E cycles, and the "programming for parameter tuning" for group #5 should be executed once in 100 P/E cycles.

FIG. 28D shows a timing offset table indicating correspondences of group indices to offset values set in the groups. The offset values are set to disperse the update timing for each group. The timing offset value table indicates that, for example, the offset value of group #0 is 0, the offset value of group #1 is 1, the offset value of group #2 is 2, the offset value of group #3 is 3, the offset value of group #4 is 4, and the offset value of group #5 is 5.

The tables shown in FIG. 28B, FIG. 28C, and FIG. 28D are not updated once the tables have been prepared. FIG. 28E shows a P/E cycle table indicating correspondences of block indices to current numbers of P/E cycles of the blocks. This table corresponds to the P/E cycle table 506 shown in FIG. 9. The initial value of the number of P/E cycles is set to 0 and is incremented every time the blocks are erased.

FIG. 29A shows a write parameter table indicating correspondences of group indices to write parameter values indicating the initial values of the program voltage relating to the desired program characteristic detected by the "programming for parameter tuning" of the groups. This table corresponds to the write parameter table 502 shown in FIG. 9. FIG. 29B shows an update schedule table indicating correspondences of group indices to numbers of P/E cycles at which the "programming for parameter tuning" is executed last, and the numbers of P/E cycles at which a next "programming for parameter tuning" is scheduled. FIG. 29A and FIG. 29B are updated when the "programming for parameter tuning" is executed.

Figure 30:
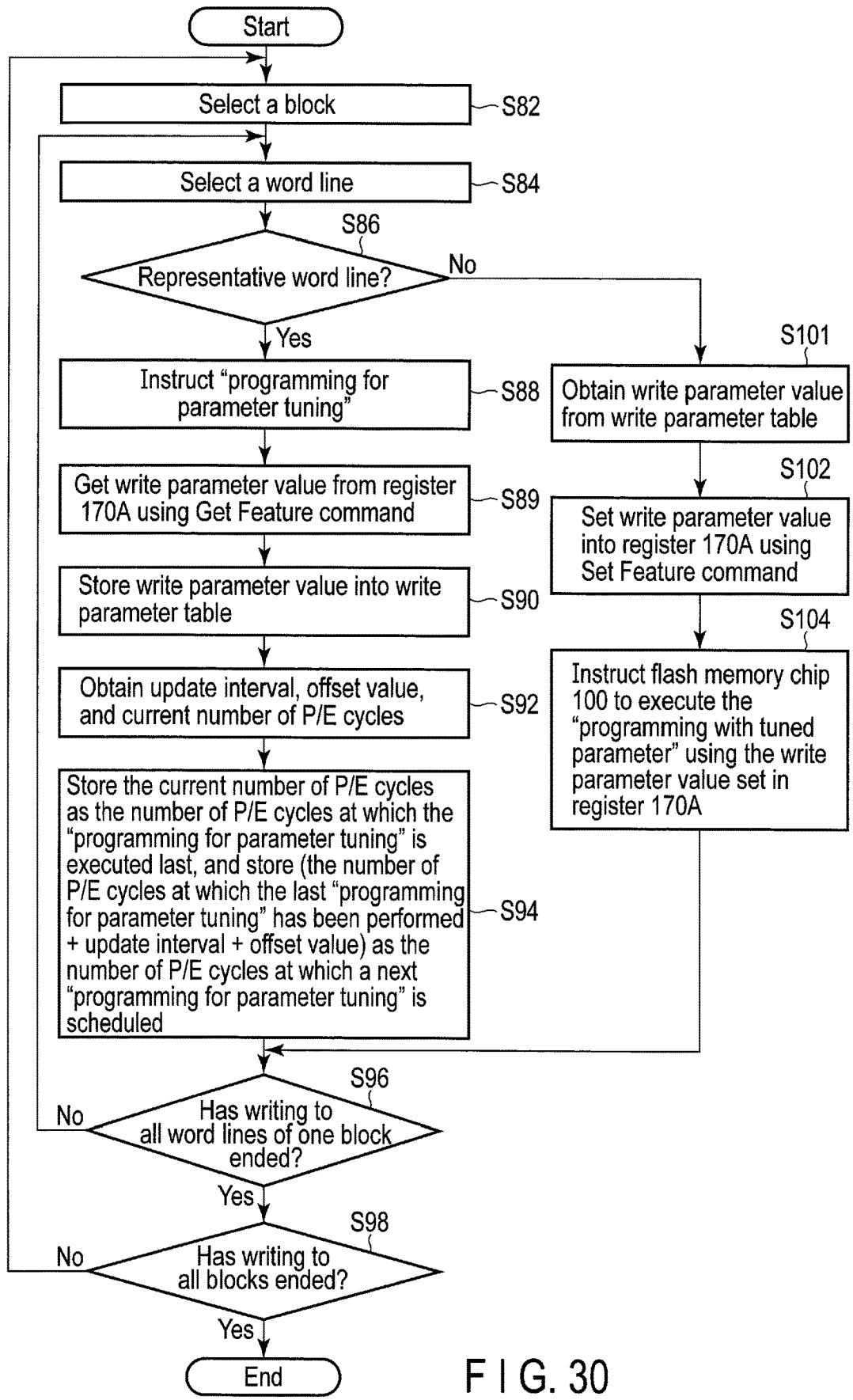
FIG. 30 is a flowchart showing an example of a write operation at manufacturing necessary for the "programming for parameter tuning" shown in FIG. 24 to FIG. 27.

FIG. 30 is a flowchart showing an example of initial setting of the write parameter table shown in FIG. 29A. This process is executed before shipment of the memory system (i.e., at the manufacturing of the memory system). The controller 200 selects a block in step S82 and selects a word line in step S84. The controller 200 determines, in step S86, whether the selected word line is the representative word line of the group defined by a set of the word lines or not. The representative word line is a word line, to which the data pattern is first written, of the word lines included in the group, for example, word line WL0. The data pattern is, for example, any random pattern.

If the determination in step S86 is YES (i.e., the selected word line is the representative word line), the controller 200 instructs, in step S88, the flash memory chip 100 to execute the "programming for parameter tuning" for the memory cell transistors connected to the word line. The write parameter obtained by the "programming for parameter tuning" is set in the register 170A of the flash memory chip 100. The controller 200 gets, in step S89, the write parameter value from the register 170A by using, for example, the Get Feature command. The controller 200 stores the write parameter in the write parameter table (FIG. 29A) in step S90. The controller 200 obtains, in step S92, the update interval from the update interval table (FIG. 28C), the offset value from the timing offset value table (FIG. 28D), and the current number of P/E cycles from the P/E cycle table (FIG. 28E). In step S94, the controller 200 stores the current number of P/E cycles as the number of P/E cycles at which the "programming for parameter tuning" is executed last, and stores (the number of P/E cycles at which the last "programming for parameter tuning" has been performed+update interval+offset value) as the number of P/E cycles at which a next "programming for parameter tuning" is scheduled in the update schedule table (FIG. 29B). The controller 200 determines, in step S96, whether writing to all the word lines of one block has ended or not.

If the determination in step S96 is NO (i.e., the writing to all the word lines has not ended), the process goes back to step S84 and the controller 200 selects a next word line. The process following step S86 is also executed for the next word line. If the determination in step S96 is YES (i.e., the writing to all the word lines has ended), the controller 200 determines, in step S98, whether writing to all the blocks has ended or not.

If the determination in step S98 is NO (i.e., the writing to all the blocks has not ended), the process goes back to step S82 and the controller 200 selects a next block. The processing following step S84 is also executed for the next block. If the determination in step S98 is YES (i.e., the writing to all the blocks has ended), the process ends.

If the determination result in step S86 is NO (i.e., the selected word line is not the representative word line), the controller 200 obtains, in step S101, the write parameter value from the write parameter table and the controller 200 sets, in step S102, the write parameter value into the register 170A of the flash memory chip 100 by using, for example, the Set Feature command. The controller 200 instructs, in step S104, the flash memory chip 100 to execute the "programming with tuned parameter" set in the register 170A. If the "programming with tuned parameter" has ended, step S96 is executed.

Figure 31:
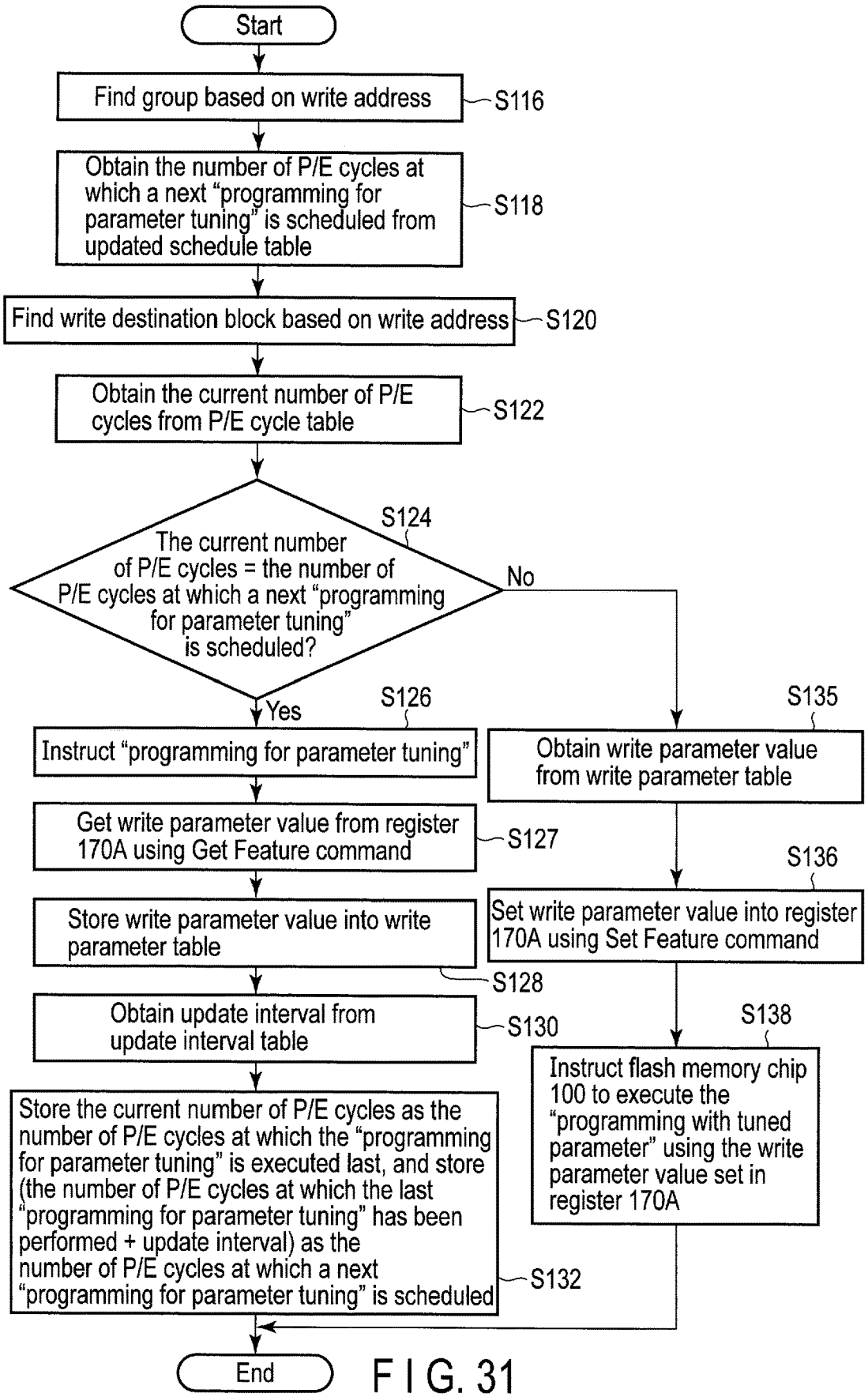
FIG. 31 is a flowchart showing an example of the "programming for parameter tuning" shown in FIG. 24 to FIG. 27.

FIG. 31 is a flowchart showing an example of a write operation. A user actually uses the memory system after manufacturing. When the user data write by command received from the host 300 or by garbage collection starts, the controller 200 identifies the block by the write destination address and finds the group by the identified block in step S116, and the controller 200 obtains, in step S118, the number of P/E cycles at which a next "programming for parameter tuning" is scheduled from the update schedule table (FIG. 29B). The controller 200 identifies, in step S120, the write destination block by the write destination address, and the controller 200 finds, in step S122, the current number of P/E cycles from the P/E cycle table (FIG. 28E).

The controller 200 determines, in step S124, whether the current number of P/E cycles is equal to the number of P/E cycles at which a next "programming for parameter tuning" is scheduled or not. If the determination is YES (i.e., the current number of P/E cycles is equal to the number of P/E cycles at which a next "programming for parameter tuning" is scheduled), the current P/E cycle is a cycle wherein the "programming for parameter tuning" should be executed, and the controller 200 instructs, in step S126, the flash memory chip 100 to execute the "programming for parameter tuning" for the memory cell transistors identified by the write destination address. The write parameter value obtained by the "programming for parameter tuning" is set into the register 170A of the flash memory chip 100. The controller 200 gets, in step S127, the write parameter value from the register 170A of the flash memory chip 100 by using, for example, the Get Feature command and the controller 200 stores, in step S128, the acquired write parameter value into the write parameter table (FIG. 29A).

The controller 200 obtains the update interval from the update interval table (FIG. 28C) in step S130. In step S132, the controller 200 stores the current number of P/E cycles as the number of P/E cycles at which the "programming for parameter tuning" is executed last, and stores (the number of P/E cycles at which the last "programming for parameter tuning" has been performed+update interval) as the number of P/E cycles at which a next "programming for parameter tuning" is scheduled in the update schedule table (FIG. 29B).

If the determination in step S124 is NO (i.e., the current number of P/E cycles is not equal to the number of P/E cycles at which a next "programming for parameter tuning" is scheduled), the current P/E cycle is a cycle wherein the "programming with tuned parameter" should be executed, and the controller 200 obtains, in step 3135, the write parameter value from the write parameter table and the controller 200 sets, in step S136, the write parameter value into the register 170A of the flash memory chip 100 by using, for example, the Set Feature command. In step S138, the controller 200 instructs the flash memory chip 100 to execute the "programming with tuned parameter" using the write parameter value set in the register 170A for the memory cell transistors identified by the write destination address.

FIG. 32A to FIG. 39B show transition of the write parameter table and the update schedule table according to increase of the number of P/E cycles.

Before shipment of the memory system 1, the "programming for parameter tuning" is executed for the representative word line of each group as described in step S88 in FIG. 30. The program voltages at completion of the smart verify detection of groups #0 to #5 as obtained by the "programming for parameter tuning" are stored into the write parameter table as write parameter values V0_0 to V5_0, as shown in FIG. 32A. When the "programming for parameter tuning" is executed before shipment of the memory system 1, the number of P/E cycles at this time is detected and stored into the update schedule table, as shown in FIG. 32B. The update schedule table shown in FIG. 32B is the same as the table shown in FIG. 29B.

FIG. 33A and FIG. 33B show a state of the write parameter table and a state of the update schedule table wherein the number of P/E cycles reaches 100. The controller 200 refers to the P/E cycle table (FIG. 28E) and the update schedule table (latest state shown in FIG. 32B). According to the update schedule table, a group wherein the "programming for parameter tuning" is first executed is group #0 and the number of P/E cycles at which a next "programming for parameter tuning" is scheduled is 100. For this reason, when the number of P/E cycles reaches 100, the controller 200 instructs the flash memory chip 100 to execute the "programming for parameter tuning" of group #0 as described in step S126 in FIG. 31. The initial value of the program voltage relating to the desired program characteristic of group #0 obtained by the "programming for parameter tuning" is stored into the write parameter table as write parameter value V0_1, as shown in FIG. 33A. The current number of P/E cycles (100) is stored into the update schedule table as the number of P/E cycles at which the "programming for parameter tuning" of group #0 is executed last, as shown in FIG. 33B. Furthermore, the update interval (100) of group #0 is obtained from the update interval table shown in FIG. 28C. The obtained update interval (100) and the current number of P/E cycles (100) are summed. The sum (200) is stored into the update schedule table as the number of P/E cycles at which a next "programming for parameter tuning" of group #0 is scheduled, as shown in FIG. 33B.

FIG. 34A and FIG. 34B show a state of the write parameter table and a state of the update schedule table wherein the number of P/E cycles reaches 105. The controller 200 refers to the P/E cycle table (FIG. 28E) and the update schedule table (latest state shown in FIG. 33B). According to the update schedule table, a group wherein the "programming for parameter tuning" is first executed after the number of P/E cycles is 100 is group #5, and the number of P/E cycles at which a next "programming for parameter tuning" is scheduled is 105. For this reason, when the number of P/E cycles reaches 105, the controller 200 instructs the flash memory chip 100 to execute the "programming for parameter tuning" of group #5 as described in step S126 in FIG. 31. The initial value of the program voltage relating to the desired program characteristic of group #5 obtained by the "programming for parameter tuning" is stored into the write parameter table as write parameter value V5_1, as shown in FIG. 34A. The current number of P/E cycles (105) is stored into the update schedule table as the number of P/E cycles at which "programming for parameter tuning" of group #5 is executed last, as shown in FIG. 34B. Furthermore, the update interval (100) of group #5 is obtained from the update interval table shown in FIG. 28C. The obtained update interval (100) and the current number of P/E cycles (105) are summed. The sum (205) is stored into the update schedule table as the number of P/E cycles at which next "programming for parameter tuning" of group #5 is scheduled, as shown in FIG. 34B.

FIG. 35A and FIG. 35B show a state of the write parameter table and a state of the update schedule table wherein the number of P/E cycles reaches 200. The controller 200 refers to the P/E cycle table (FIG. 28E) and the update schedule table (latest state shown in FIG. 34B). According to the update schedule table, a group wherein the "programming for parameter tuning" is first executed after the number of P/E cycles is 105 is group #0, and the number of P/E cycles at which next "programming for parameter tuning" is scheduled is 200. For this reason, when the number of P/E cycles reaches 200, the controller 200 instructs the flash memory chip 100 to execute the "programming for parameter tuning" of group #0 as described in step S126 in FIG. 31. The initial value of the program voltage relating to the desired program characteristic of group #0 obtained by the "programming for parameter tuning" is stored into the write parameter table as write parameter value V0_2, as shown in FIG. 35A. The current number of P/E cycles (200) is stored into the update schedule table as the number of P/E cycles at which "programming for parameter tuning" of group #0 is executed last, as shown in FIG. 35B. Furthermore, the update interval (100) of group #0 is obtained from the update interval table shown in FIG. 28C. The obtained update interval (100) and the current number of P/E cycles (200) are summed. The sum (300) is stored into the update schedule table as the number of P/E cycles at which next "programming for parameter tuning" of group #0 is scheduled, as shown in FIG. 35B.

FIG. 36A and FIG. 36B show a state of the write parameter table and a state of the update schedule table wherein the number of P/E cycles reaches 205.

The controller 200 refers to the P/E cycle table (FIG. 28E) and the update schedule table (latest state shown in FIG. 35B). According to the update schedule table, a group wherein the "programming for parameter tuning" is first executed after the number of P/E cycles is 200 is group #5 and the number of P/E cycles at which next "programming for parameter tuning" is scheduled is 205. For this reason, when the number of P/E cycles reaches 205, the controller 200 instructs the flash memory chip 100 to execute the "programming for parameter tuning" of group #5 as described in step S126 in FIG. 31. The initial value of the program voltage relating to the desired program characteristic of group #5 obtained by the "programming for parameter tuning" is stored into the write parameter table as write parameter value V5_2 as shown in FIG. 36A. The current number of P/E cycles (205) is stored into the update schedule table as the number of P/E cycles at which "programming for parameter tuning" of group #5 is executed last as shown in FIG. 36B. Furthermore, the update interval (100) of group #5 is obtained from the update interval table shown in FIG. 28C. The obtained update interval (100) and the current number of P/E cycles (205) are summed. The sum (305) is stored into the update schedule table as the number of P/E cycles at which next "programming for parameter tuning" of group #5 is scheduled, as shown in FIG. 36B.

FIG. 37A and FIG. 37B show a state of the write parameter table and a state of the update schedule table wherein the number of P/E cycles reaches 300. The controller 200 refers to the P/E cycle table (FIG. 28E) and the update schedule table (latest state shown in FIG. 36B). According to the update schedule table, a group wherein the "programming for parameter tuning" is first executed after the number of P/E cycles is 205 is group #0, and the number of P/E cycles at which a next "programming for parameter tuning" is scheduled is 300. For this reason, when the number of P/E cycles reaches 300, the controller 200 instructs the flash memory chip 100 to execute the "programming for parameter tuning" of group #0 as described in step S126 in FIG. 31. The initial value of the program voltage relating to the desired program characteristic of group #0 obtained by the "programming for parameter tuning" is stored into the write parameter table as write parameter value V0_3 as shown in FIG. 37A. The current number of P/E cycles (300) is stored into the update schedule table as the number of P/E cycles at which the "programming for parameter tuning" of group #0 is executed last as shown in FIG. 37B. Furthermore, the update interval (100) of group #0 is obtained from the update interval table shown in FIG. 28C. The obtained update interval (100) and the current number of P/E cycles (300) are summed. The sum (400) is stored into the update schedule table as the number of P/E cycles at a next "programming for parameter tuning" of group #0 is scheduled, as shown in FIG. 37B.

FIG. 38A and FIG. 38B show a state of the write parameter table and a state of the update schedule table wherein the number of P/E cycles reaches 301. The controller 200 refers to the P/E cycle table (FIG. 28E) and the update schedule table (latest state shown in FIG. 37B). According to the update schedule table, a group wherein the "programming for parameter tuning" is first executed after the number of P/E cycles is 300 is group #1, and the number of P/E cycles at which a next "programming for parameter tuning" is scheduled is 301. For this reason, when the number of P/E cycles reaches 301, the controller 200 instructs the flash memory chip 100 to execute the "programming for parameter tuning" of group #1 as described in step S126 in FIG. 31. The initial value of the program voltage relating to the desired program characteristic of group #1 obtained by the "programming for parameter tuning" is stored into the write parameter table as write parameter value V1_1 as shown in FIG. 38A. The current number of P/E cycles (301) is stored into the update schedule table as the number of P/E cycles at which the "programming for parameter tuning" of group #1 is executed last, as shown in FIG. 38B. Furthermore, the update interval (300) of group #1 is obtained from the update interval table shown in FIG. 28C. The obtained update interval (300) and the current number of P/E cycles (301) are summed. The sum (601) is stored into the update schedule table as the number of P/E cycles at which a next "programming for parameter tuning" of group #1 is scheduled, as shown in FIG. 38B.

FIG. 39A and FIG. 39B show a state of the write parameter table and a state of the update schedule table wherein the number of P/E cycles reaches 304. The controller 200 refers to the P/E cycle table (FIG. 28E) and the update schedule table (latest state shown in FIG. 38B). According to the update schedule table, a group wherein the "programming for parameter tuning" is first executed after the number of P/E cycles is 301 is group #4 and the number of P/E cycles at which a next "programming for parameter tuning" is scheduled is 304. For this reason, when the number of P/E cycles reaches 304, the controller 200 instructs the flash memory chip 100 to execute the "programming for parameter tuning" of group #4 as described in step S126 in FIG. 31. The initial value of the program voltage relating to the desired program characteristic of group #4 obtained by the "programming for parameter tuning" is stored into the write parameter table as write parameter value V4_1 as shown in FIG. 39A. The current number of P/E cycles (304) is stored into the update schedule table as the number of P/E cycles at which the "programming for parameter tuning" of group #4 is executed last, as shown in FIG. 39B. Furthermore, the update interval (300) of group #4 is obtained from the update interval table shown in FIG. 28C. The update interval (300) and the current number of P/E cycles (304) are summed. The sum (604) is stored into the update schedule table as the number of P/E cycles at which a next "programming for parameter tuning" of group #4 is scheduled, as shown in FIG. 39B.

After that, when the current number of P/E cycles reaches the number of P/E cycles at which a next "programming for parameter tuning" is scheduled in the same manner as explained above, the "programming for parameter tuning" is executed, and the write parameter table and the update schedule table are updated.

Thus, the "programming for parameter tuning" is executed with a certain time interval (P/E cycle interval), instead of executing in every P/E cycle, according to the degree of the program characteristic variation, by controlling the "programming for parameter tuning" timing for each group as defined as a set of word lines. For this reason, the write parameter obtained by the "programming for parameter tuning" is maintained to be appropriate for the memory cell transistors even if the characteristic changes over P/E cycles. The above explanations are based on an assumption that the memory cell transistors have similar characteristic among the string units connected to the same word line. Alternatively, different groups may be defined for different string units in a case where the memory cell transistors have different characteristic among the string units.

Figures 40A, 40B, 40C:
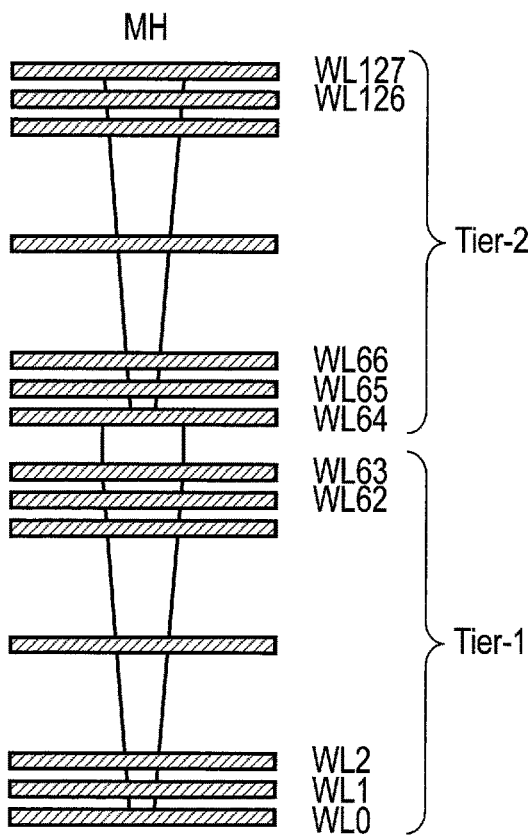
FIG. 40A, FIG. 40B, and FIG. 40C show examples of a three-dimensional flash memory of a two-tier structure, a group table, and an update interval table.

In the above explanations, the flash memory is assumed to have one-tier three-dimensional structure. Recently, 2-tier flash memory as shown in FIG. 40A has been developed. The diameter of a memory hole MH becomes, for example, smaller from the upper side to the lower side in a layer group of the upper half (tier-2), the diameter becomes, for example, smaller from the upper side to the lower side in a layer group of the lower half (tier-1), and the shape of the memory hole MH may be discontinuous at a boundary between tier-1 and tier-2. FIG. 40B shows a group table and FIG. 40C shows an update interval table. The group table indicates that, for example, group #0 is composed of word lines WL0 to WL1 of tier-1, group #1 is composed of word lines WL2 to WL31 of tier-1, group #2 is composed of word lines WL32 to WL61 of tier-1, group #3 is composed of word lines WL62 to WL63 of tier-1, group #4 is composed of word lines WL64 to WL65 of tier-2, group #5 is composed of word lines WL66 to WL95 of tier-2, group #6 is composed of word lines WL96 to WL125 of tier-2, group #7 is composed of word lines WL126 to WL127 of tier-2, and the like. The group table of FIG. 40B corresponds to the group table 504 shown in FIG. 9 (wherein the group is defined by blocks) and the group table shown in FIG. 28B. The update interval table indicates that, for example, the "programming for parameter tuning" for group #0 should be executed once in 100 P/E cycles, the "programming for parameter tuning" for group #1 should be executed once in 1000 P/E cycles, the "programming for parameter tuning" for group #2 should be executed once in 1000 P/E cycles, the "programming for parameter tuning" for group #3 should be executed once in 100 P/E cycles, the "programming for parameter tuning" for group #4 should be executed once in 100 P/E cycles, the "programming for parameter tuning" for group #5 should be executed once in 1000 P/E cycles, the "programming for parameter tuning" for group #6 should be executed once in 1000 P/E cycles, and the "programming for parameter tuning" for group #7 should be executed once in 100 P/E cycles. The update interval table of FIG. 40C corresponds to the update interval table shown in FIG. 28C.

Allocation order of several or all addresses may be opposite to that shown in FIG. 40A. For example, word line addresses WL0 to WL63 may be allocated from the upper to the lower layers in tier-1.

[Recomposing Groups]

As explained above, it is expected that the elements (e.g., the memory cells) in a group have similar characteristic, and a write parameter value is stored for each group and applied to elements of the group upon writing. To execute the "programming with tuned parameter" appropriately (i.e., being performed fast without over-program), the characteristic of all the memory cell transistors in the group need to match or to be similar, and the characteristic does not deviate too much from those wherein the detection is executed. If the characteristic of all the memory cell transistors in the group are not similar, the write parameter value detected by the "programming for parameter tuning" may not be appropriate. In addition, when the number of P/E cycles increases after forming the group based on the characteristic of the memory cell transistors, the variation of the characteristic of the memory cell transistors within the group may have grown large.

An example of dynamically constituting groups sharing a write parameter value by the controller 200 will be explained below. The controller 200 forms a group with a set of blocks, word lines, or the like, where memory cell transistors belonging therein are expected to have similar characteristic, and determines which of the "programming for parameter tuning" and the "programming with tuned parameter" should be executed upon writing. A set of cell units such as blocks, word lines, or the like belonging to a group is called elements. One of elements in the group is called a representative element, and a write parameter value relating to the desired program characteristic obtained by executing the "programming for parameter tuning" of the representative element is called a group representative value.

The controller 200 executes the "programming for parameter tuning" once for the representative element, in the group, detects the group representative value, and stores the group representative value. The controller 200 executes the "programming with tuned parameter" using the group representative value for non-representative elements belonging to the group. The group representative value is not changed after determined. For this reason, suitability of the group representative value to the belonging elements may be lowered in accordance with the change in characteristic of the cells. In this case, in the embodiment, the group representative value is not changed, but, instead, the belonging group of the element is changed from the original group to another group which has a more suitable group representative value. Thus, the controller 200 inspects whether the group representative value is suitable for the belonging elements. If the group representative value is found not to be suitable for a belonging element, the controller 200 dynamically changes the group to which the element belongs. In addition, the controller 200 defines a group belonging condition of an element for belonging to a group (hereinafter, denoted by a group condition) of the elements for each group, and regards that the characteristic of the memory cell transistors belonging to the group is not changed as long as the elements satisfy the group condition. Examples of the group condition are a range of the P/E cycles (for example, 1 to 100), a range of word lines (for example, word lines WL2 to WL31), and the like. The controller 200 determines both following two are satisfied or not; whether a write parameter value of the element (obtained by a sampling inspection), for achieving the desired program characteristic, matches the group representative value, and whether the element satisfies the group condition. If the obtained write parameter value is significantly different from the group representative value, the element is moved to a group having a group representative value similar to the obtained write parameter value. After an element belonging to group G changes the group to which the element belongs to group G' as a result of the "programming for parameter tuning", another element in group G may successively change the group to which the element belongs to group G' without executing the "programming for parameter tuning". This is called succession.

Figure 41A:
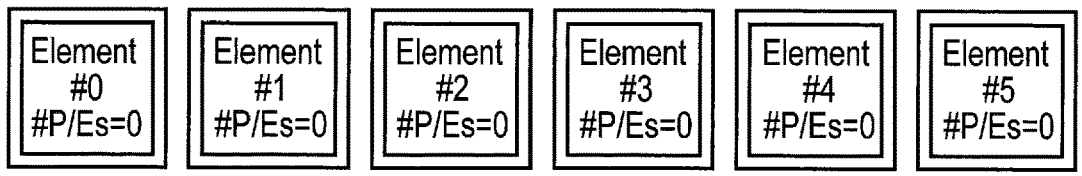
FIG. 41A, FIG. 41B, FIG. 41C, FIG. 41D, and FIG. 41E show an example wherein elements composing a group are changed in accordance with increase in the number of P/E cycles so that the elements of the group are maintained to have similar write parameter values.
Figure 41B:
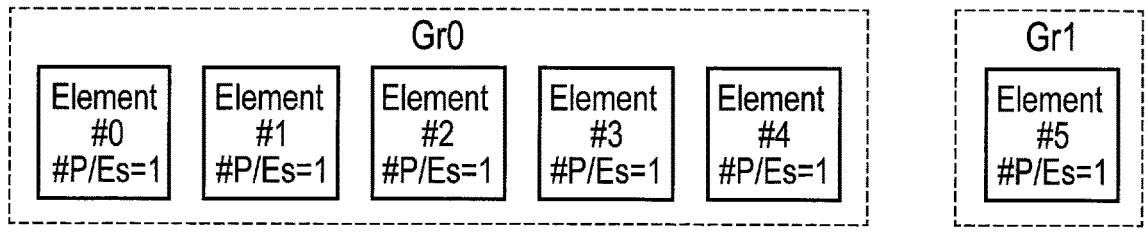
Figure 41C:
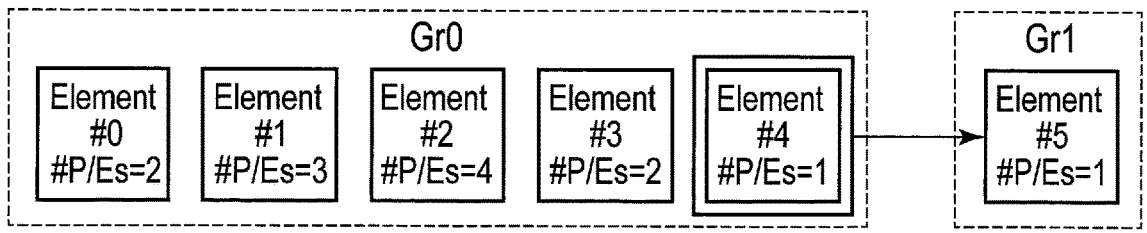
Figure 41D:
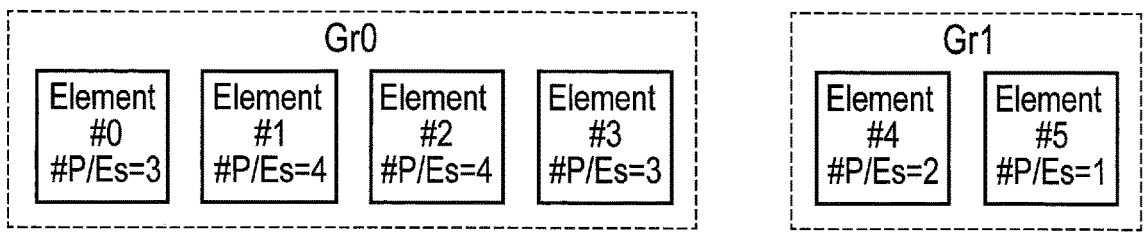
Figure 41E:
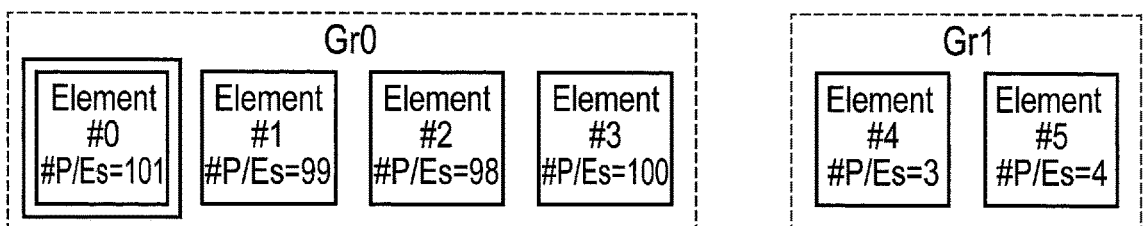

FIG. 41A to FIG. 41E show a summary of process of moving elements between groups (i.e., changing belonging groups of the elements), in order to maintain the suitability of the group representative value for the elements, and to reduce the frequency of executing the "programming for parameter tuning". FIG. 41A to FIG. 41E show transitions of states of elements according to lapse of time, and FIG. 41A shows the oldest state. Elements surrounded by double squares are targets of the "programming for parameter tuning", and elements surrounded by single squares are targets of the "programming with tuned parameter". An expression #P/Es denotes a number of P/E cycles of each element. In the initial stage, as shown in FIG. 41A, since six elements #0 to #5 do not belong to any groups, the "programming for parameter tuning" is executed for each of elements #0 to #5 to detect an appropriate write parameter value. Suppose that the write parameter values of elements #0 to #4 are recognized to be similar as a result of the "programming for parameter tuning", and the controller 200 makes elements #0 to #4 belong to group Gr0 as shown in FIG. 41B. On the other hand, since the write parameter value of element #5 is not similar to the write parameter values of elements #0 to #4, the controller 200 makes element #5 belong to group Gr1. The elements are subjected to the sampling inspection at random while the P/E cycle is repeated. Element #4 is subjected to the sampling inspection at certain timing and the write parameter value of element #4 is detected as shown in FIG. 41C. If the detected write parameter value of element #4 is more similar to the group representative value of group Gr1 than to the group representative value of group Gr0, the controller 200 moves element #4 from group Gr0 to group Gr1 as shown in FIG. 41C. As a result, the elements belonging to group Gr0 become elements #0 to #3, and the elements belonging to group Gr1 become elements #4 and #5, as shown in FIG. 41D. After that, if the number of P/E cycles of a certain element, e.g. element #0 is changed from that shown in FIG. 41A by a predetermined number (for example, 101), the "programming for parameter tuning" is executed for element #0 of group Gr0 as shown in FIG. 41E. In the state shown in FIG. 41E, since the number of P/E cycles of each of the elements belonging to group Gr1 does not reach the update interval, the "programming with tuned parameter" is executed when the data write for the elements belonging to group Gr1 occurs. The "programming for parameter tuning" based on the sampling inspection may be executed for the elements belonging to group Gr1.

FIG. 42 shows a status of moving of an element between groups.

(a) Eviction: If an element is determined not to satisfy the group condition of group G as a result of sampling inspection, the controller 200 evicts the element from group G (the element is removed from group G).

(b) Releasing: If an element becomes not to satisfy the group condition of group G as the number of P/E cycles increases, the controller 200 releases the element from group G (the element is removed from group G).

(c) Succeeding: When the controller 200 releases an element from group G, if group G' is defined as a succession destination group of group G, the controller 200 makes the belonging group of the element succeed to group G' (the belonging group of the element is changed).

(d) Staying: When it is expected that the program characteristic of the memory cell transistors of an element has not changed over a certain P/E cycles, and when it is determined that the program characteristic of the memory cell transistors of the element has not changed by a sampling inspection, the controller 200 makes the element stay in group G (i.e., the belonging group of the element is not changed).

(e) Joining: If the controller 200 obtains a write parameter value on the desired program characteristic of an element by executing the "programming for parameter tuning" of the element belonging to group G, the controller 200 makes the element join group G' having the write parameter on the desired program characteristic as the group representative value (the belonging group of the element is changed). If the controller 200 releases the element from group G wherein the succession destination group is not defined, the controller 200 registers group G' of the joining destination group as the succession destination group of group G.

To belong to a group, an element needs to satisfy the group condition of the group. The element is moved in the following manner according to whether the element satisfies the group condition or not. The element belongs to only one group but does not belong to a plurality of groups at a time. In other words, the group conditions of any two groups among all the groups do not overlap.

Figure 43:
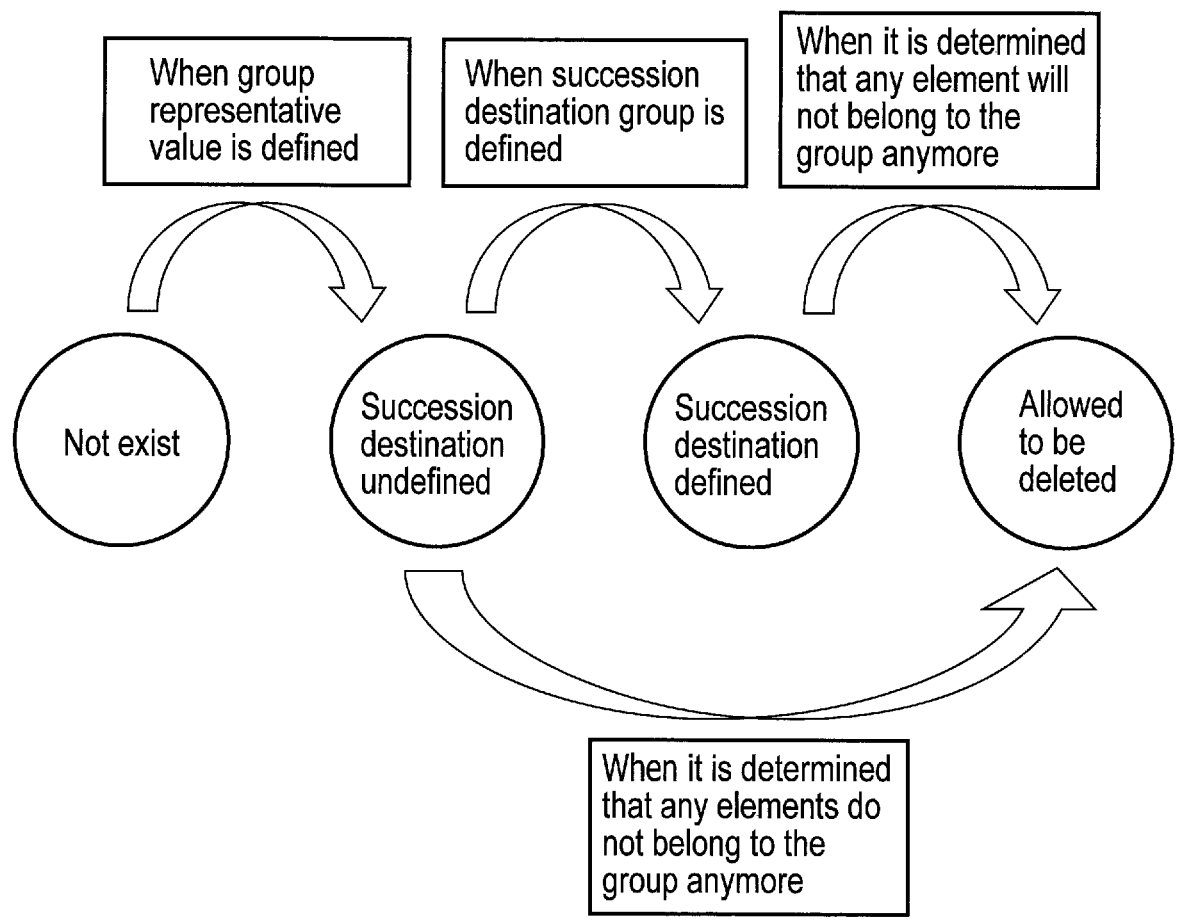
FIG. 43 shows an example of group state transitions.

When the controller 200 detects that an element does not satisfy the group condition of the belonging group of the element as a result of sampling inspection, the controller 200 evicts the element from the belonging group. When the element is found not to satisfy the group condition of the belonging group in a situation other than the sampling inspection, the controller 200 releases the element from the belonging group. For example, if the group condition is the number of P/E cycles which increases as elapse of the time, the element may not satisfy the group condition of the belonging group when the number of P/E cycles increases. The controller 200 determines whether the element satisfies the group condition of the belonging group or not. If the controller 200 determines that the element satisfies the group condition, the controller 200 makes the element stay in the belonging group. If the controller 200 determines that the element does not satisfy the group condition of the belonging group, the controller 200 determines whether the element satisfies the group condition of another group or not. If the controller 200 determines that the element satisfies the group condition of said another group, the controller 200 makes the element join said another group wherein the element satisfies the group condition (change the belonging group). When the controller 200 is to change the belonging group of the element, if there is no existing group with a group condition that the element satisfies, the controller 200 creates a new group for the element. When a group is defined as the succession destination of the belonging group of the element, the controller 200 releases the element from the belonging group and causes the element to belong to the succession destination group (i.e., the element follows a succession relation of the group). FIG. 43 shows an example of state transitions of a group. A "not exist" state indicates a group not generated. When a group representative value is defined for the "not exist" group, transition from the "not exist" state to a "succession destination undefined" state is executed. When a succession destination is defined for the "succession destination undefined" group, transition from the "succession destination undefined" state to a "succession destination defined" state is executed.

When it is assumed that any element in the memory system will not belong to a group, the group may be deleted. For example, it is assumed that the P/E cycle range of group Gj is 101-200 and the number of P/E cycles of all elements in the memory system is 201 or more. The number of P/E cycles of all elements in the memory system will not be 101-200. Therefore, the group Gj may be deleted.

FIG. 44A to FIG. 44C and FIG. 45A to FIG. 45B show examples of tables, stored in the RAM 220, used to control moving elements between groups. FIG. 44A shows an element-group table indicating correspondences of elements to group indices and detection reservation flags. The elements are specified by the block indices and the word line ranges. The detection reservation flag indicates whether the sampling inspection needs to be executed or not to determine whether the element satisfies the group condition or not. The sampling inspection is executed when the flag is "1", and the sampling inspection is not executed when the flag is "0".

The element-group table indicates that, for example, element (word line WL0 of block #0) is included in group #0, element (word line WL1 of block #0) is included in group #1, element (word lines WL2 to WL31 of block #0) is included in group #2, element (word lines WL32 to WL61 of block #0) is included in group #3, element (word line WL62 of block #0) is included in group #4, element (word line WL63 of block #0) is included in group #5, element (word line WL0 of block #1) is included in group #6, element (word line WL1 of block #1) is included in group #7, element (word lines WL2 to WL31 of block #1) is included in group #8, detection reservation flags of all elements shown in FIG. 44A are 0, and the like.

FIG. 44B shows a group table indicating correspondences of group indices to word line ranges, P/E cycle ranges, and group representative values. The word line range is included in the group condition in order to make the group condition more strict when the characteristic variation is large. The element should not join only because its write parameter value is the same as the representative value of the group at a certain time. The word line ranges and the P/E cycle ranges are included in the group condition of the group. Each of the word line ranges and the P/E cycle ranges is called a sub-condition. A conjunction of the sub-conditions corresponds to the group condition. If the word line and the P/E cycle of an element fall within these ranges, the element satisfies the group condition.

The group table indicates, for example, that the word line range of group #0 is word line #0, the P/E cycle range of group #0 is 0 to 100, and the group representative value of group #0 is V1, that the word line range of group #1 is word line #1, the P/E cycle range of group #1 is 0 to 300, and the group representative value of group #1 is V2, that the word line range of group #2 is word lines #2 to #31, the P/E cycle range of group #2 is 0 to 1000, and the group representative value of group #2 is V3, that the word line range of group #3 is word lines #32 to #61, the P/E cycle range of group #3 is 0 to 1000, and the group representative value of group #3 is V4, that the word line range of group #4 is word line #62, the P/E cycle range of group #4 is 0 to 300, and the group representative value of group #4 is V5, that the word line range of group #5 is word line #63, the P/E cycle range of group #5 is 0 to 100, and the group representative value of group #5 is V6, that the word line range of group #6 is word line #0, the P/E cycle range of group #6 is 101 to 200, and the group representative value of group #6 is V7, that the word line range of group #7 is word line #1, the P/E cycle range of group #7 is 301 to 600, and the group representative value of group #7 is V4, that the word line range of group #8 is word lines #2 to #31, the P/E cycle range of group #8 is 1001 to 2000, and the group representative value of group #8 is V5, that the word line range of group #9 is word lines #32 to #61, the P/E cycle range of group #9 is 1001 to 2000, and the group representative value of group #9 is V6, and the like.

The reason why a word line range is included in a group condition is as follows. In a case where the word line range is not included in the group condition irrespective of large characteristic variation of the word lines, the element may belong to the group having the group representative value which accidentally matches the write parameter of the element at a certain time in the joining and, after that, even when the characteristic has changed and deviated from the original value, the change in the characteristic of the element may not be found (until the element becomes a target of the sampling inspection) and the "programming with tuned parameter" may be executed by using an inappropriate write parameter value.

FIG. 44C shows a succession destination table indicating correspondences of group indices to succession destination groups. The succession destination table indicates that, for example, the succession destination of group #0 is not defined, the succession destination of group #1 is not defined, the succession destination of group #2 is group #8, the succession destination of group #3 is not defined, and the succession destination of group #4 is not defined.

FIG. 45A shows a P/E cycle table indicating correspondences of block indices to current numbers of P/E cycles. The P/E cycle table indicates that, for example, the number of P/E cycles of block #0 is 20, the number of P/E cycles of block #1 is 35, the number of P/E cycles of block #2 is 25, and the number of P/E cycles of block #3 is 80.

FIG. 45B shows a P/E cycle interval table indicating correspondences of word line ranges to P/E cycle intervals to set the group condition. The P/E cycle interval table indicates, for example, that the P/E cycle interval for the word line #0 is 100, the P/E cycle interval for the word line #1 is 300, the P/E cycle interval for the word line ranges of word lines #2 to #31 is 1000, the P/E cycle interval for the word line ranges of word lines #32 to #61 is 1000, the P/E cycle interval for word line #62 is 300, the P/E cycle interval for word line #63 is 100, and the like.

Figure 46:
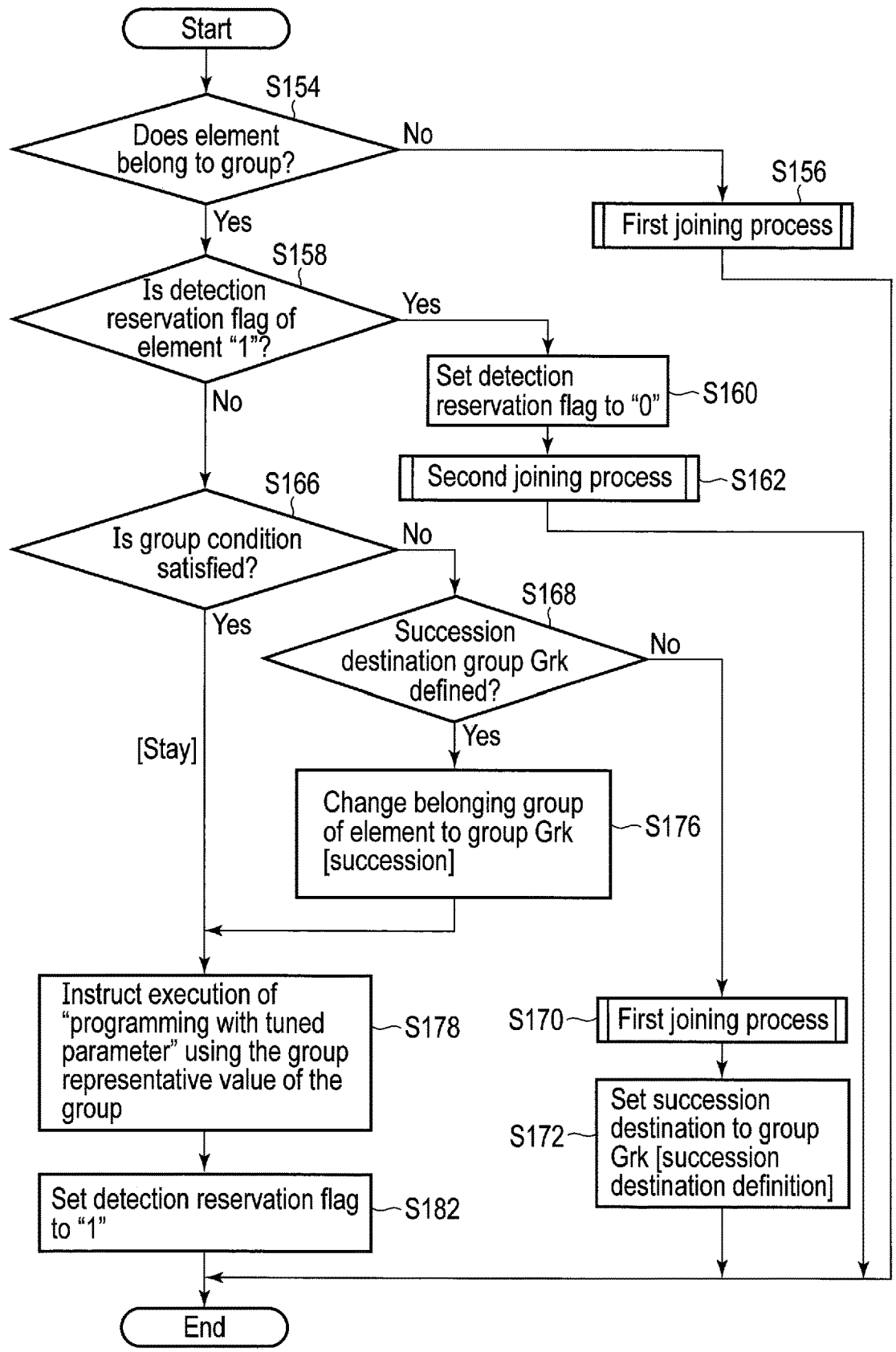
FIG. 46 is a flowchart showing an example of the write operation accompanied by the group recomposition.

FIG. 46 shows a flowchart for explanation of a process example of group recomposition based on moving element between groups. When the write of user data by the command received from the host 300 or by the garbage collection starts, the controller 200 determines, in step S154, whether the element (block and word line) corresponding to the address of the write destination belongs to a group or not, by referring to the element-group table (FIG. 44A). If the determination is NO (i.e., the element does not belong to any group), the controller 200 executes first joining process in step S156.

Figure 47A:
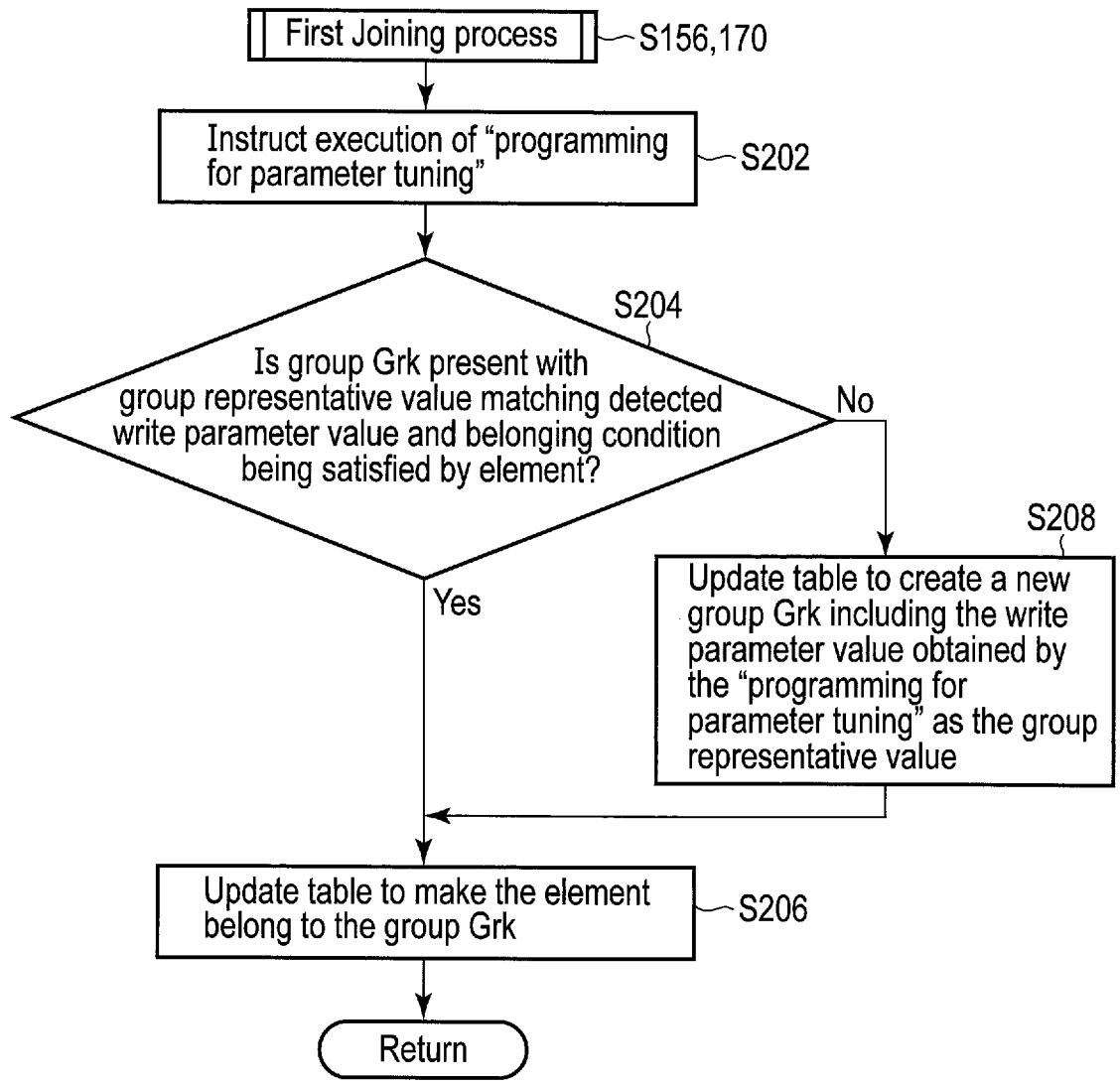
FIG. 47A is a flowchart showing an example of a first joining step in the flowchart shown in FIG. 46.

FIG. 47A is a flowchart showing an example of the first joining process in steps S156 and S170, and FIG. 47B is a flowchart showing an example of second joining process in step S162.

In the first joining process shown in FIG. 47A, the controller 200 instructs, in step S202, the flash memory chip 100 to execute the "programming for parameter tuning" for an element. The write parameter value obtained by the "programming for parameter tuning" is set into the register 170A and then the controller 200 obtains the write parameter value. In step S204, the controller 200 determines whether or not the group representative value matching the write parameter value obtained by the "programming for parameter tuning" exists in the group table (FIG. 44B) (assumed to exist in a group Grk) and the element satisfies the group condition of the group Grk. Matching is not limited to strict equivalence. The group representative value may be considered to match the write parameter value, if the difference is within an allowable range. If the determination in step S204 is YES (i.e., the group representative value exists and the element satisfies the group condition), the controller 200 updates, in step S206, each table to make the element belong to the group Grk. An example of updating the table will be explained later.

If the determination in step S204 is NO (i.e., the group representative value does not exist or the element does not satisfy the group condition), the controller 200 updates, in step S208, each table to create a new group Grk including the write parameter value obtained by the "programming for parameter tuning" as the group representative value. The group condition of the new group Grk is set by referring to the P/E cycle table, the P/E cycle interval table, and the element-group table. The word line range included in each element is previously registered in the element-group table. After that, the controller 200 makes the element belong to the new group Grk in step S206.

In the flowchart of FIG. 46, if the determination in step S154 is YES (i.e., the element belongs to the group), the controller 200 determines, in step S158, whether the detection reservation flag of the element is "1" or not, by referring to the element-group table (FIG. 44A). If the determination in step S154 is YES (i.e., the detection reservation flag is "1"), the controller 200 sets the detection reservation flag to 0 in step S160. After that, the controller 200 executes second joining process in step S162.

In the second joining process shown in FIG. 47B, the controller 200 instructs, in step S302, the flash memory chip 100 to execute the "programming for parameter tuning" for the element. The write parameter value obtained by the "programming for parameter tuning" is set into the register 170A. The controller 200 determines, in step S304, whether or not a group representative value matching the write parameter value obtained by the "programming for parameter tuning" exists in the group table (FIG. 44B). If the determination in step S304 is YES, the flow ends (i.e., the element stays). If the determination in step S304 is NO, the controller 200 evicts the element from the group (the element is removed from the group) in step S306.

In step S308, the controller 200 determines whether or not a group representative value matching the write parameter value obtained by the "programming for parameter tuning" exists in the group table (FIG. 44B) (here, it is assumed to exist in a group Grk) and the element satisfies the group condition of the group Grk. If the determination in step S308 is YES (i.e., the group representative value exists and the element satisfies the group condition), the controller 200 updates each table to make the element belong to the group Grk in step S310. An example of updating the table will be explained later.

If the determination in step S308 is NO (i.e., the group representative value does not exist or the element does not satisfy the group condition), the controller 200 updates, in step S312, each table to create a new group Grk including the write parameter value obtained by the "programming for parameter tuning" as the group representative value. The group condition of the new group Grk is set by referring to the P/E cycle table, the P/E cycle interval table, and the element-group table. After that, the controller 200 makes the element belong to the new group Grk in step S310. In step S310, the second joining process has ended.

In the flowchart of FIG. 46, if the determination in step 3158 is NO (i.e., the detection reservation flag is "0"), the controller 200 determines, in step S166, whether the element satisfies the group condition of the group to which the element belongs or not, by referring to the group table (FIG. 44B). If the determination result in step S166 is YES (i.e., the element satisfies the group condition of the group to which the element belongs), the controller 200 instructs, in step S178, the flash memory chip 100 to execute the "programming with tuned parameter" using the group representative value of the group to which the element belongs. In this case, the element stays in the group to which the element belongs. After that, the controller 200 sets, in step S182, the detection reservation flag of this element in the element-group table to "1". However, the controller 200 may set the detection reservation flag of this element in the element-group table to "0" in step S182. Furthermore, the controller 200 randomly sets the detection reservation flag of this element in the element-group table to "1" in step S182. If the detection reservation flag is set to "0", the number of executions of the sampling inspection is reduced.

If the determination in step S166 is NO (i.e., the element does not satisfy the group condition of the group to which the element belongs), the controller 200 determines, in step S168, whether the succession destination of the group to which the element belongs is defined or not, by referring to the succession destination table (FIG. 44C). If the determination in step S168 is NO (i.e., the succession destination of the group to which the element belongs is not defined), the controller 200 executes the first joining process in step S170. After the first joining process, the controller 200 updates, in step S172, the succession destination table to set the succession destination to a group Grk (referring to step S206 in FIG. 47A) (succession destination is held).

If the determination in step S168 is YES (i.e., the group Grk is defined as the succession destination), in step S176, the controller 200 updates the element-group table to change the group to which the element belongs to the group Grk (succession) and instructs the flash memory chip 100 to execute the "programming with tuned parameter" using the group representative value of the group Grk.

FIG. 48A to FIG. 54D show examples of updating the tables in various states of moving elements between groups.

FIG. 48A to FIG. 48E show states of the element-group table, the group table, the succession destination table, the P/E cycle interval table, and the P/E cycle table when an element which does not belong to any group joins a newly created group, for example, in steps S204, S208, and S206 in the first joining process in step S156 shown in FIG. 46.

Groups #0 and #1 exist, entries of hatch lines (third rows) in the element-group table, the group table, and the succession destination table do not exist, and the target element is the element including word line #2 of block #0. Since the element including word line #2 of block #0 does not belong to any group as shown in FIG. 48A (NO in step S154 of FIG. 46), "programming for parameter tuning" is executed for the element including word line #2 of block #0 in step S202 of FIG. 47A and a write parameter value V0 is detected. It is determined in step S204 of FIG. 47A whether or not a group with a group representative value matching the write parameter value V0 is present and whether or not the element including word line #2 of block #0 satisfies the group condition of the group with the group representative value matching the write parameter value V0 if the group with the group representative value matching the write parameter value V0 is present.

The group representative value of the groups #0 and #1 is V0 as shown in FIG. 48B, the element including word line #2 of block #0 does not satisfy any of the group conditions (word line range) of the groups #0 and #1, a new group #2 with the group representative value matching the write parameter value V0 is created and the element is made to belong to the new group #2. As a result, an entry of group 2 is added to the group table as shown in FIG. 48B and an entry of group 2 is added to the succession destination table as shown in FIG. 48C.

The word line range and the P/E cycle range as the group condition of the group #2 are set with reference to the P/E cycle table (entry of block #0 in FIG. 48E) and the P/E cycle interval table (entry of word line range 2-31 in FIG. 48D). If the number of P/E cycles is smaller than the P/E cycle interval, the P/E cycle range as the group condition is obtained from the P/E cycle interval table. On the other hand, if the number of P/E cycles is 1020, the P/E cycle range as the group condition is calculated from the P/E cycle interval table and the number of P/E cycles. For example, when M (integer) satisfying N×M≤k<N×(M+1) is obtained, the P/E cycle interval is set to a range from N×M to N×(M+1).

FIG. 49A to FIG. 49C show states of the element-group table, the group table, and the P/E cycle table when an element which does not belong to a group joins an existing group, for example, in steps S204 and S206 in the first joining process in FIG. 47A in step S156 shown in FIG. 46. It is assumed that entries of hatch lines (third row) in the element-group table do not exist (not defined), and the target element is the element including word line #0 of block #1.

Since the element including word line #0 of block #1 does not belong to any group (NO in step S154 shown in FIG. 46), the "programming for parameter tuning" is executed and program voltage V0 is detected in step S202 shown in FIG. 47A. The controller 200 determines whether the group representative value of the group is V0 or not. If the group representative value matches the write parameter value V0, the controller 200 determines whether the element satisfies the group condition or not, in step S204 shown in FIG. 47A. The group representative value of each of groups #0 and #1 is V0. The element including word line #0 satisfies the sub-condition (word line #0) of group #0, the number of P/E cycles of the element (block #1) is 20, and satisfies the sub-condition (P/E cycle range: 0 to 100) of group #0. To make the element belong to group #0, an entry of group #0 of the word line #0 represented by hatch lines is added to the element-group table in step S206 shown in FIG. 47A.

FIG. 50A to FIG. 50E show states of the element-group table, the group table, the succession destination table, the P/E cycle interval table, and the P/E cycle table wherein an element belonging to a group is released from the group and joins a newly created group. For example, FIG. 50A to FIG. 50E show states of the tables wherein the determination in step S154 is YES, the determination in step S158 is NO, the determination in step S166 is NO, and the determination in step S168 is NO, in the flowchart of FIG. 46. Groups #0 and #1 exist (defined), entries of hatch lines (third row) in the group table and the succession destination table do not exist (not defined), and the target element is the element including word line #0 of block #1.

The element (including word line #0 of block #1) belongs to group #0, but the number of P/E cycles of the element (block #1) is 101 and the element does not satisfy the sub-condition (P/E cycle range: 0 to 100) of group #0 anymore. Since the succession destination of group #0 is not defined, the "programming for parameter tuning" is executed for the element and a write parameter value V1 is detected. A new group #2 wherein the group representative value matches V1 is created, and the element is made to belong to group #2. As a result, the group index corresponding to word line #0 of block #1 is changed from #0 to #2 in the element-group table, as shown in FIG. 50A, and an entry of group #2 represented by hatch lines is added to the group table, as shown in FIG. 50B. A group condition of group #2 including the sub-condition of word line range and the sub-condition of P/E cycle range is set by referring to the P/E cycle table (entry of block #1 represented by hatch lines), as shown in FIG. 50E and the P/E cycle interval table (word line #0 represented by hatch lines), as shown in FIG. 50D. The succession destination group of group #0 in the succession destination table is set to group #2, as shown in FIG. 50C.

FIG. 51A and FIG. 51B show states of the element-group table and the group table when an element stays in an original group to which the element belongs as a result of the sampling inspection, for example, wherein the determination in step S304 in the second joining process in FIG. 47B in step S162 shown in FIG. 46 is NO. The target of the sampling inspection is assumed to be an element including word line #0 of block #0.

Since the element (including word line #0 of block #0) belongs to group #0 and the detection reservation flag is "1", the detection reservation flag is set to "0" in step S160, as shown in FIG. 51A. The "programming for parameter tuning" is executed for the element and a write parameter value V0 is detected in step S302 in FIG. 47B. Since the write parameter value V0 matches the group representative value V0 of group #0, the element stays in group #0.

FIG. 52A to FIG. 52D show states of the element-group table, the group table, the P/E cycle table, and the P/E cycle interval table when an element is evicted from a group to which the element currently belongs and joins a newly created group as a result of sampling inspection. For example, FIG. 52A to FIG. 52D show states of the tables in step S310 in the second joining process in step 3162 shown in FIG. 46. In the second joining process shown in FIG. 47B, it is assumed that the determination in step S304 is NO and the determination in step S308 is YES. The target of the sampling inspection is assumed to be the element including word line #0 of block #0 in the state wherein group #0 exists (defined).

Since an element (including word line #0 of block #0) belongs to group #0 and the detection reservation flag is "1", the detection reservation flag is set to "0" in step S160, as shown in FIG. 52A. The "programming for parameter tuning" is executed for the element and a write parameter value V1 is detected in step S302 shown in FIG. 47B. Since the write parameter value V1 does no match the group representative value V0 of group #0, the element is evicted from group #0. If a group with a group representative value that matches V1 is not found, a new group #1 is created. As a result, as shown in FIG. 52B, an entry of group #1 represented by hatch lines is added to the group table, and as shown in FIG. 52A, the belonging group of the element including word line range #0 of block #0 is changed from group #0 to group #1, by changing its group index from #0 to #1 in the element-group table. A group condition of group #1 including the sub-condition of word line range and the sub-condition of P/E cycle range is set by referring to the P/E cycle table (entry of block #0) shown in FIG. 52C and the P/E cycle interval table (word line range and P/E cycle interval) shown in FIG. 52D.

FIG. 53A to FIG. 53D show states of the element-group table, the group table, the succession destination table, and the P/E cycle table wherein an element which belongs to a group having the succession destination undefined does not satisfy the group condition and is made to change the belonging group to another group, for example, in steps S170 and S172 in FIG. 46. The target element is assumed to be an element including word line #0 of block 0.

The element (including word line #0 of block #0) belongs to group #0, but the number of P/E cycles of block #0 (101) is outside the P/E cycle range (0 to 100) of group #0, the element is evicted from group #0. Since the succession destination of group #0 is not defined, the "programming for parameter tuning" is executed for the element and a write parameter value V1 is detected. It is determined whether a group having the group representative value matching V1 exists in the group table or not. If such a group exists, it is determined whether the element satisfies the group condition of the group or not. The group representative value of group #2 is V1. The number of P/E cycles of the element including block #0 is 101 and satisfies the sub-condition (P/E cycle range: 101 to 200) of group #2, and the word line #0 of the element also satisfies the sub-condition (word line #0) of group #2. As a result, to make the element belong to group #2, the group index of the element including word line #0 of block #0 is changed from group #0 to group #2 in the element-group table shown in FIG. 53A, and the succession destination of group #0 is set to group #2 in the succession destination table shown in FIG. 53C.

If a group wherein a group representative value matches V1 does not exist, a new group wherein the group representative value is V1 is created.

FIG. 54A to FIG. 54D show states of the element-group table, the group table, the succession destination table, and the P/E cycle table wherein an element which belongs to a group having the succession destination defined does not satisfy the group condition and succession is performed, for example, in steps S168 and S176 in FIG. 46. The target element is assumed to be the element including word line #0 of block #0.

The element (including word line #0 of block #0) belongs to group #0, but the number of P/E cycles of block #0 (101) is outside the sub-condition of P/E cycle range (0 to 100) of group #0, the element is released from group #0. Since group #2 is defined as the succession destination of group #0, the group index of the element including word line #0 of block #0 is changed from group #0 to group #2 in the element-group table shown in FIG. 54A. In the succession, the "programming for parameter tuning" is not executed but the group to which the element belongs is changed. The interval of executing the "programming for parameter tuning" can be thereby shortened.

As explained above, the "programming for parameter tuning" is executed for the element which does not belong to a group, and the write parameter value is obtained. When the write parameter value is obtained, it is determined to which group the element is made to belong based on the obtained write parameter value. If there is no existing group to which the element is made to belong, a new group is created and the element is made to belong to the newly created group.

A group condition is defined for a group and it is assumed that characteristic of a memory cell transistor of an element of the group has changed when the element does not satisfy the group condition, and that the characteristic has not changed while the element satisfies the group condition. Before writing data to the element, it is determined whether the element satisfies the group condition of the group or not. If the element does not satisfy the group condition, the element is made to change the belonging group to another group. For this reason, the controller 200 can dynamically change elements included in a group as to recompose groups, based on the result of the "programming for parameter tuning" of the element and the group condition and, even when the characteristic of the element including the group has changed, the controller 200 can reduce an average program time by executing the "programming with tuned parameter" for other elements in the group by using the write parameter value obtained by the "programming for parameter tuning" executed for an element in the group.

It is assumed in the above description with reference to FIG. 24 to FIGS. 54A to 54D that data of plural bits are collectively written into a memory cell with a single program command. Data of plural bits may be written into a memory cell in multiple steps. It is assumed that the "programming for parameter tuning" is executed at the first step of writing in multiple steps. A threshold voltage distribution obtained at the first step of writing differs from a threshold voltage distribution obtained at another step. Thus, the initial value of the program voltage "Initial Vpgm" relating to the appropriate write parameter at the first step of writing differs from the initial value of the program voltage relating to the appropriate write parameter value at said another step. The group recomposition shown in FIG. 46 is executed at the first step of writing. At said another step of writing, the "programming with tuned parameter" may be executed. For the "programming with tuned parameter," the appropriate write parameter value at said another step may be estimated based on the write parameter value obtained by the "programming for parameter tuning" executed at the first step. Alternatively, at each step of multiple steps of writing, the "write for parameter tuning" may be executed, and individual group tables may be created for each step. Groups are created for each state and thus it is possible to determine whether the "programming for parameter tuning" or the "programming with tuned parameter" should be executed at each step of the multiple steps of writing.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined in any way.

What is claimed is:

1. A memory device connectable to a controller, the memory device comprising:
   at least a first memory cell configured to be programmed to store data corresponding to a threshold voltage of the first memory cell, the first memory cell being configured to store first data in a case where the threshold voltage of the first memory cell is higher than a second reference voltage; and
   a peripheral circuit configured to:
   write the first data to the first memory cell in a first programming operation by:
      applying a first program voltage to the first memory cell in a plurality of first loops, a level of the first program voltage applied to the first memory cell first in the plurality of first loops being a first initial voltage;
      obtaining a value of a first write parameter by comparing the threshold voltage of the first memory cell with a first reference voltage, the first reference voltage being lower than the second reference voltage, the first write parameter including a level of the first program voltage applied to the first memory cell in one of the plurality of first loops; and verifying that the first data is stored in the first memory cell by comparing the threshold voltage of the first memory cell with the second reference voltage; and output the value of the first write parameter to the controller.

2. The memory device of claim 1, wherein
the level of the first program voltage applied to the first memory cell is varied during one execution of the first programming operation.

3. The memory device of claim 1, wherein
the first memory cell is one of a plurality of first memory cells; and
the peripheral circuit is further configured to:
apply the first program voltage to the plurality of first memory cells in the plurality of first loops of the first programming operation, a level of the first program voltage applied to the plurality of first memory cells in a third loop being higher than a level of the first program voltage applied to the plurality of first memory cells in a second loop, the plurality of first loops including the third loop and the second loop, the third loop being subsequent to the second loop; and
obtain the value of the first write parameter in the one of the plurality of first loops in which a highest voltage of threshold voltage distribution of the plurality of first memory cells exceeds the first reference voltage.

4. The memory device of claim 1, wherein
the level of the first program voltage applied to the first memory cell in the one of the plurality of first loops is a level of the first program voltage applied to the first memory cell when the threshold voltage of the first memory cell becomes higher than the first reference voltage.

5. The memory device of claim 1, further comprising:
a second memory cell configured to be programmed to store data corresponding to a threshold voltage of the second memory cell, the second memory cell being configured to store second data in a case where the threshold voltage of the second memory cell is higher than a third reference voltage; wherein
the peripheral circuit is further configured to:
receive, from the controller, a value of a second write parameter including a level of a second initial voltage that is higher than the level of the first initial voltage; and
write, by using the received value of the second write parameter, the second data to the second memory cell in a second programming operation by:
applying a second program voltage to the second memory cell in a plurality of fourth loops, a level of the second program voltage applied to the second memory cell first in the plurality of fourth loops being the second initial voltage; and
verifying that the second data is stored in the second memory cell by comparing the threshold voltage of the second memory cell with the third reference voltage.

6. The memory device of claim 5, wherein
the first memory cell is in an erased state when the first program voltage whose level is the first initial voltage is applied to the first memory cell; and
the second memory cell is in an erased state when the second program voltage whose level is the second initial voltage is applied to the second memory cell.

7. The memory device of claim 5, wherein
the level of the second initial voltage included in the second write parameter is equal to a level of the first program voltage applied to the first memory cell when the threshold voltage of the first memory cell becomes higher than the first reference voltage.

8. The memory device of claim 5, wherein
the peripheral circuit is configured to:
execute the first programming operation in response to receiving a first instruction from the controller; and
execute the second programming operation in response to receiving a second instruction from the controller.

9. The memory device of claim 8, wherein
the first instruction includes a first command sequence including a first command for the first programming operation; and
the second instruction includes a second command sequence including a second command for the second programming operation, the second command being different from the first command.

10. The memory device of claim 8, wherein
one of the first instruction and the second instruction includes a first command sequence including a prefix command; and
the other of the first instruction and the second instruction includes a second command sequence not including the prefix command.

11. A memory system comprising:
a controller; and
a memory device electrically connected to the controller, the memory device including:
at least a first memory cell configured to be programmed to store data corresponding to a threshold voltage of the first memory cell, the first memory cell being configured to store first data in a case where the threshold voltage of the first memory cell is higher than a second reference voltage; and
a peripheral circuit configured to:
write the first data to the first memory cell in a first programming operation by:
applying a first program voltage to the first memory cell in a plurality of first loops, a level of the first program voltage applied to the first memory cell first in the plurality of first loops being a first initial voltage;
obtaining a value of a first write parameter by comparing the threshold voltage of the first memory cell with a first reference voltage, the first reference voltage being lower than the second reference voltage, the first write parameter including a level of the first program voltage applied to the first memory cell in one of the plurality of first loops; and
verifying that the first data is stored in the first memory cell by comparing the threshold voltage of the first memory cell with the second reference voltage; and
output the value of the first write parameter to the controller.

12. The memory system of claim 11, wherein
the level of the first program voltage applied to the first memory cell is varied during one execution of the first programming operation.

13. The memory system of claim 11, wherein
the first memory cell is one of a plurality of first memory cells; and the peripheral circuit is further configured to:
- apply the first program voltage to the plurality of first memory cells in the plurality of first loops of the first programming operation, a level of the first program voltage applied to the plurality of first memory cells in a third loop being higher than a level of the first program voltage applied to the plurality of first memory cells in a second loop, the plurality of first loops including the third loop and the second loop, the third loop being subsequent to the second loop; and
- obtain the value of the first write parameter in the one of the plurality of first loops in which a highest voltage of threshold voltage distribution of the plurality of first memory cells exceeds the first reference voltage.

14. The memory system of claim 11, wherein
the level of the first program voltage applied to the first memory cell in the one of the plurality of first loops is a level of the first program voltage applied to the first memory cell when the threshold voltage of the first memory cell becomes higher than the first reference voltage.

15. The memory system of claim 11, wherein
the memory device further includes:
a second memory cell configured to be programmed to store data corresponding to a threshold voltage of the second memory cell, the second memory cell being configured to store second data in a case where the threshold voltage of the second memory cell is higher than a third reference voltage; wherein
the peripheral circuit is further configured to:
- receive, from the controller, a value of a second write parameter including a level of a second initial voltage that is higher than the level of the first initial voltage; and
- write, by using the received value of the second write parameter, second data to the second memory cell in a second programming operation by:
- applying a second program voltage to the second memory cell in a plurality of fourth loops, a level of the second program voltage applied to the second memory cell first in the plurality of fourth loops being the second initial voltage; and
- verifying that the second data is stored in the second memory cell by comparing the threshold voltage of the second memory cell with the third reference voltage.

16. The memory system of claim 15, wherein
the first memory cell is in an erased state when the first program voltage whose level is the first initial voltage is applied to the first memory cell; and
the second memory cell is in an erased state when the second program voltage whose level is the second initial voltage is applied to the second memory cell.

17. The memory system of claim 15, wherein
the level of the second initial voltage included in the second write parameter is equal to a level of the first program voltage applied to the first memory cell when the threshold voltage of the first memory cell becomes higher than the first reference voltage.

18. The memory system of claim 15, wherein
the peripheral circuit is configured to:
- execute the first programming operation in response to receiving a first instruction from the controller; and
- execute the second programming operation in response to receiving a second instruction from the controller.

19. The memory system of claim 18, wherein
the first instruction includes a first command sequence including a first command for the first programming operation; and
the second instruction includes a second command sequence including a second command for the second programming operation, the second command being different from the first command.

20. The memory system of claim 18, wherein
one of the first instruction and the second instruction includes a first command sequence including a prefix command; and
the other of the first instruction and the second instruction includes a second command sequence not including the prefix command.

21. The memory device of claim 5, wherein
the first data is same as the second data, and
the second reference voltage is same as the third reference voltage.

22. The memory system of claim 15, wherein
the first data is same as the second data, and
the second reference voltage is same as the third reference voltage.

* * * * *